United States Patent [19]

O'Shaughnessy et al.

[11] Patent Number: 5,594,388
[45] Date of Patent: Jan. 14, 1997

[54] SELF-CALIBRATING RC OSCILLATOR

[75] Inventors: Timothy G. O'Shaughnessy, Colorado Springs, Colo.; David G. Brown, Pocatello, Id.

[73] Assignee: American Microsystems, Inc., Pocatello, Id.

[21] Appl. No.: 479,304

[22] Filed: Jun. 7, 1995

[51] Int. Cl.⁶ .......................... H03B 5/20; H03K 3/0231; H03L 7/02
[52] U.S. Cl. .................. 331/1 R; 331/8; 331/111; 331/143; 331/177 R
[58] Field of Search ................ 331/1 R, 8, 111, 331/143, 177 R

[56] References Cited

U.S. PATENT DOCUMENTS

| | | | |
|---|---|---|---|
| 3,928,812 | 12/1975 | Bates | 331/143 |
| 4,520,327 | 5/1985 | Myers | 331/1 R |
| 4,714,901 | 12/1987 | Jain et al. | 331/176 |
| 4,998,075 | 3/1991 | Patton, III et al. | 331/2 |
| 5,017,919 | 5/1991 | Hull et al. | 341/136 |
| 5,070,311 | 12/1991 | Nicolai | 331/111 |

OTHER PUBLICATIONS

S. M. Sze, "Physica of Semiconductor Devices", ©1969, FIG. 20. John Wiley & Sons, New York.

*Primary Examiner*—Siegfried H. Grimm
*Attorney, Agent, or Firm*—Skjerven, Morrill, MacPherson, Franklin & Friel; Ken J. Koestner

[57] ABSTRACT

An RC oscillator includes an RC network for forming a time constant equal to the RC product. However, this RC time constant is not used in the manner of a typical RC network to set the frequency of oscillation. Instead, the RC oscillator disclosed herein includes a separate oscillator, such as a voltage-controlled oscillator (VCO), and uses the RC time constant to compare with the oscillator-generated period and to adjust the frequency of the overall RC oscillator circuit in accordance with the comparison. The RC oscillator is self-calibrating.

33 Claims, 35 Drawing Sheets

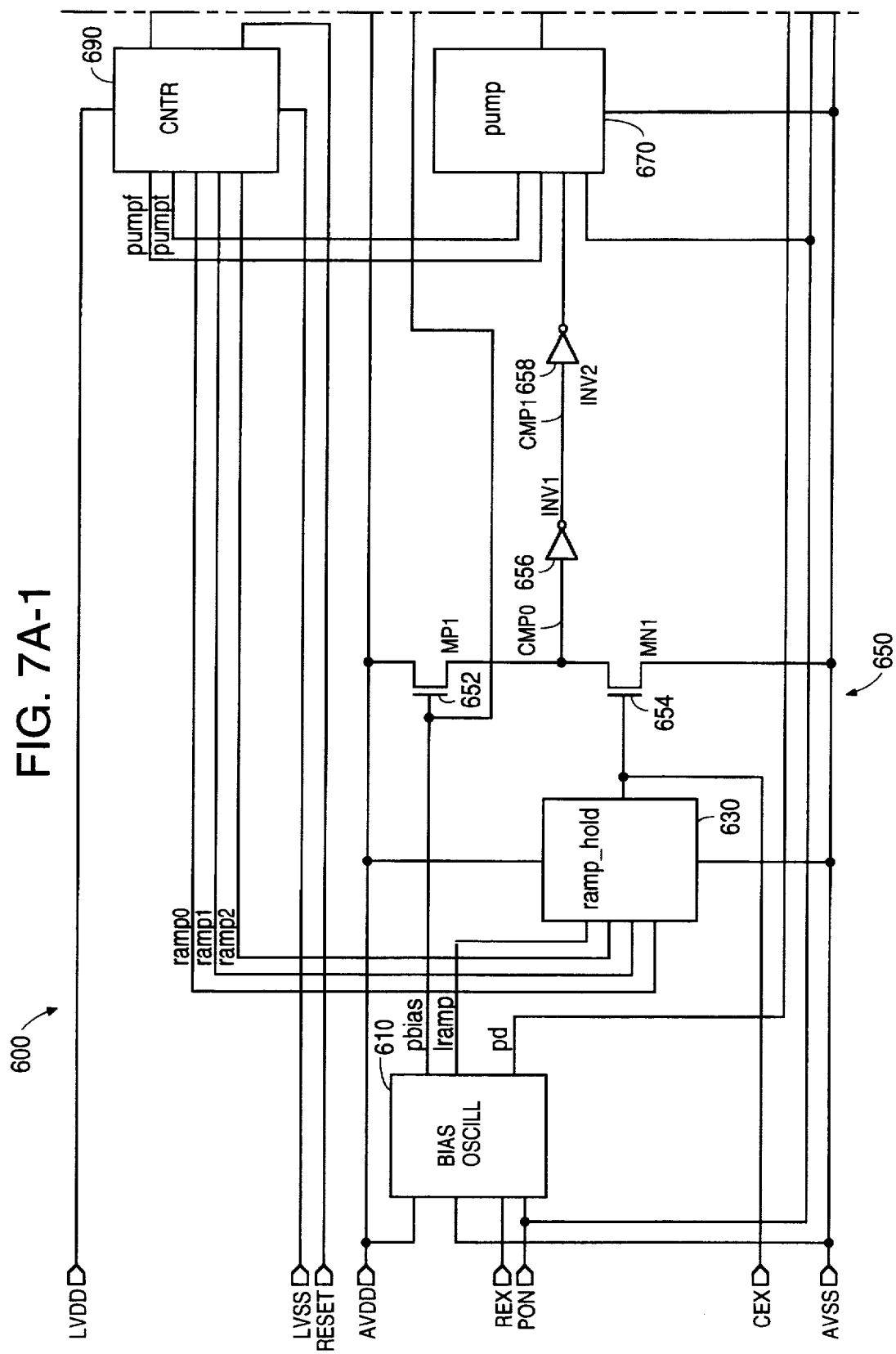

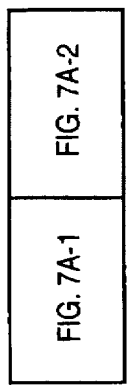
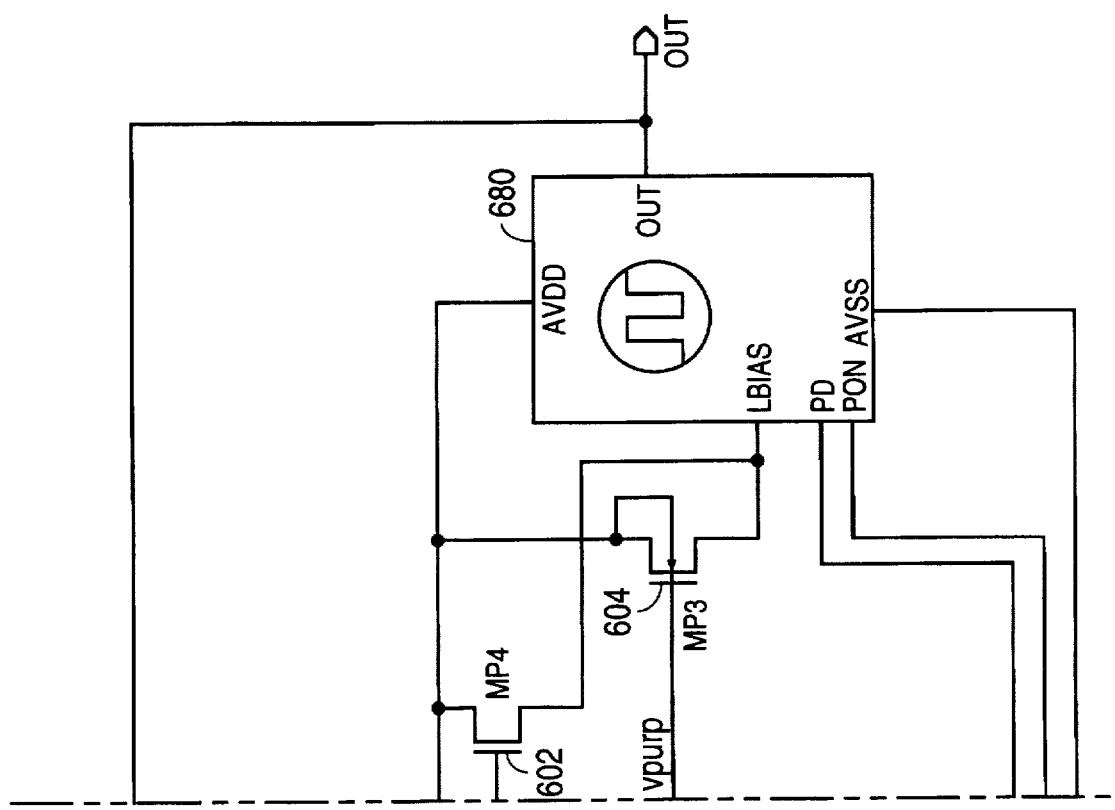

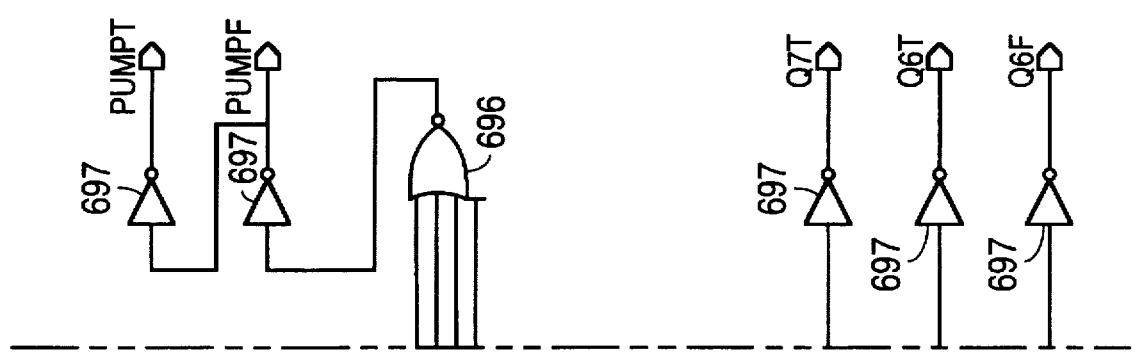

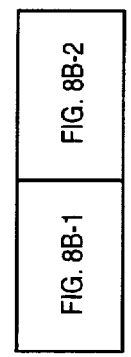
FIG. 8B-2
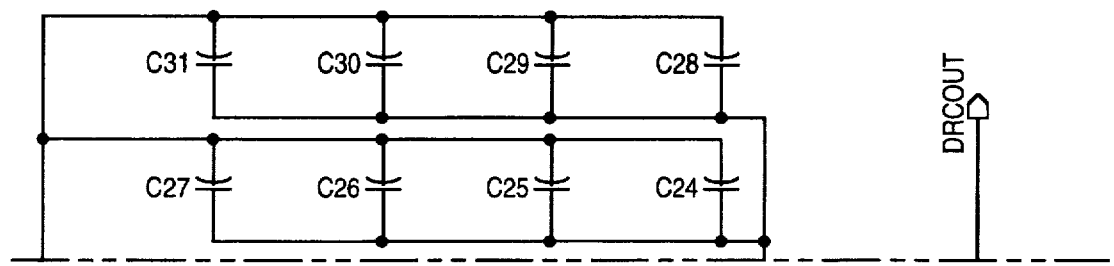

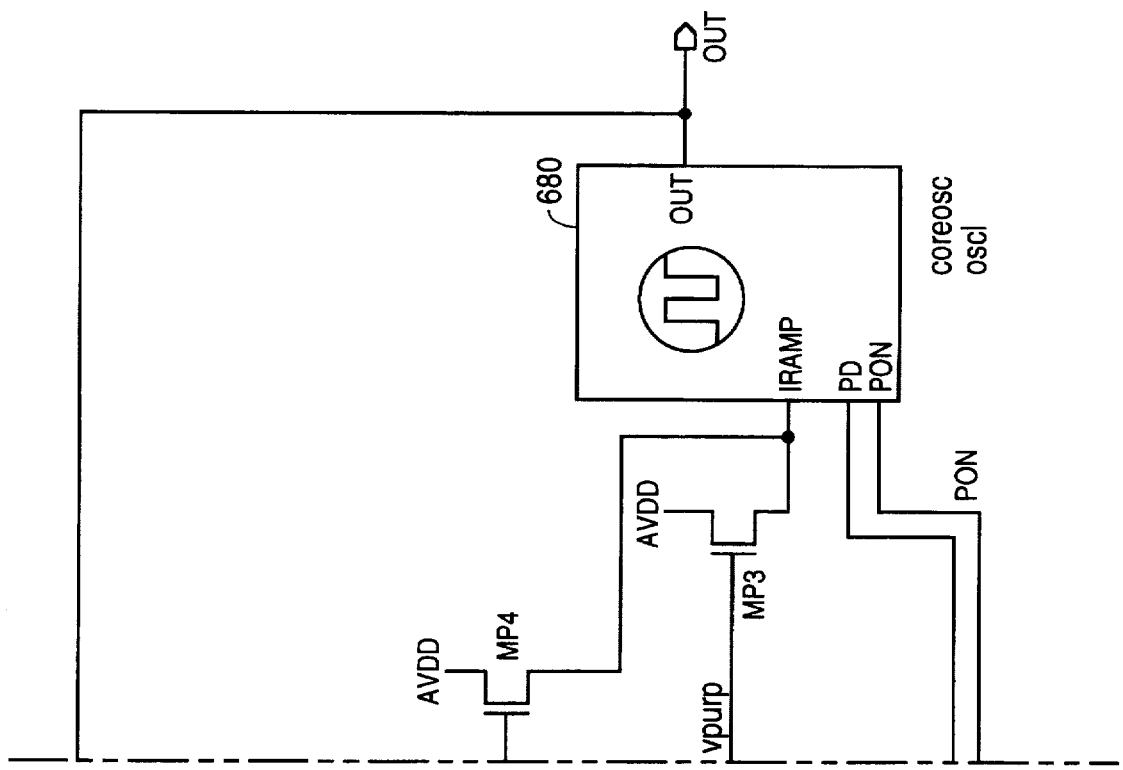

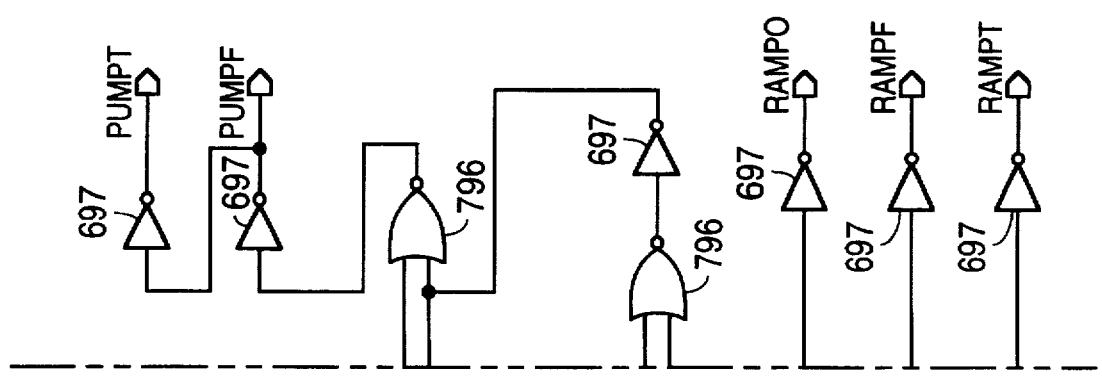

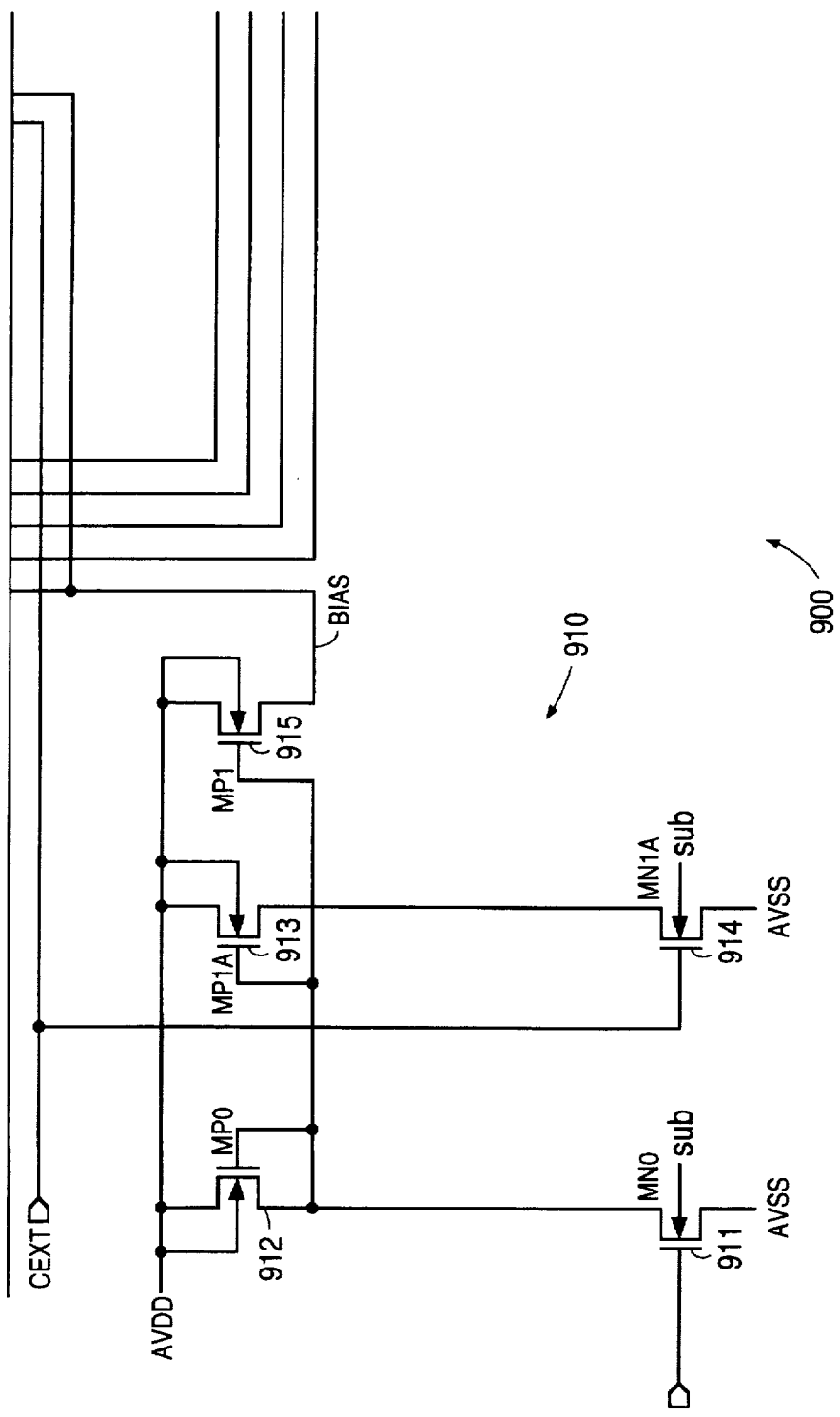

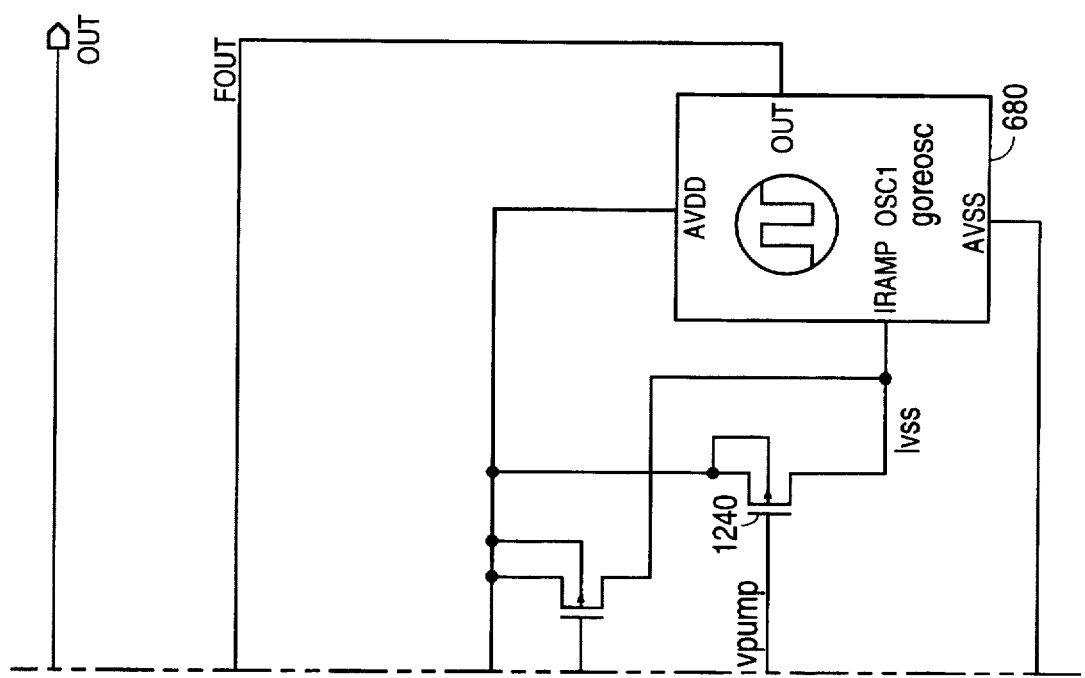

SELF-CALIBRATING RC OSCILLATOR

RELATED PATENT APPLICATIONS

The present invention is related to subject matter which is disclosed in:

United States patent application Ser. No. 08/479,303 filed on the same day as the present patent application (Timothy G. O'Shaughnessy and David Brown, A Low-Power RC oscillator Using a Low Voltage Bias Circuit, Attorney Docket Number M-3340), United States patent application Ser. No. 08/479,302 filed on the same day as the present patent application (Timothy G. O'Shaughnessy and David Brown, "A Circuit for Detecting the Absence of an External Component", Attorney Docket Number M-3341), United States patent application Ser. No. 08/479,301 filed on the same day as the present patent application (Timothy G. O'Shaughnessy and David Brown, "A Circuit for Externally Overdriving an Internal Clock", Attorney Docket Number M-3342), United States patent application Ser. No. 08/479,300 filed on the same day as the present patent application (Timothy G. O'Shaughnessy and David Brown, "A Timing Circuit with Rapid Initialization on Power-up", Attorney Docket Number M-3343), United States patent application Ser. No. 08/479,299 filed on the same day as the present patent application (Timothy G. O'Shaughnessy and David Brown, "A Digitally-Tuned Oscillator Including a Self-Calibrating RC Oscillator Circuit", Attorney Docket Number M-3344), and United States patent application Ser. No. 08/479,298 filed on the same day as the present patent application (Timothy G. O'Shaughnessy and David Brown, "Multiple Stage Tracking Filter using a Self-Calibrating RC Oscillator Circuit", Attorney Docket Number M-3345).

FIELD OF INVENTION

This invention relates to the field of oscillator circuits. More specifically, this invention describes an RC oscillator for monolithic CMOS integrated circuits having improved accuracy.

BACKGROUND OF THE INVENTION

Oscillators are circuits for converting dc power into a periodic waveform or signal. Conventional RC oscillators advantageously furnish a low-cost timing source and allow for generation of variable frequencies by changing the resistance R, or capacitance C. Furthermore, conventional RC oscillators advantageously avoid the use of inductors, which are difficult to fabricate on integrated circuits.

However, various disadvantages and limitations are associated with RC oscillators. These disadvantages and limitations greatly restrict the applications into which the RC oscillator can be utilized. Typically, conventional RC oscillators are limited to utilization as low-frequency, low-precision signal sources such as tone generators, alarms or flashing indicators. Even in applications which require only moderate frequency accuracy of one to ten percent, more costly crystal oscillators traditionally replace RC-oscillator circuits. For example, RC oscillators are typically restricted to low-frequency applications in circuits in which the operating frequency is less than 5 Mhz. For applications requiring operating frequency error to be less than 20%, the operating frequency is restricted to less than 2 MHz. Furthermore, conventional RC oscillators are often very inaccurate, having a frequency error of greater than 15%. Utilization of on-chip components further degrades oscillator accuracy. In addition, conventional RC oscillator circuits are notoriously sensitive to process and temperature variations.

The performance of a conventional RC oscillator, shown in FIG. 1, is limited by intrinsic delays within the circuit and by parasitic resistances and capacitances which degrade the value of the frequency selective elements R and C. The RC oscillator includes a first inverter INV1, a second inverter INV2, a resistor R and a capacitor C. FIG. 2 illustrates the RC oscillator circuit shown in FIG. 1 but also includes the intrinsic delays and parasitic circuit elements that degrade the performance of the oscillator. The intrinsic delays include delays through the amplifier stages of the circuit, specifically delay 1 through inverter INV1 and delay 2 through inverter INV2. These delays increase sensitivity of operating frequency variability to temperature variations because carrier mobility decreases as temperature increases. The parasitic circuit elements include the parasitic input capacitance of the integrated circuit package (Cin1, Cin2 and Cout2) and the input stage. The RC oscillator circuit shown in FIG. 2 also shows the effective series resistance of the output stage (Rout1 and Rout2). Table I provides a summary of errors which arise due to intrinsic delays and parasitic effects.

TABLE I

TYPICAL ERRORS OF CONVENTIONAL RC-OSCILLATORS
Cosc = 500 pf, Rosc = 1/2 foscCosc

| | VALUE | 0.1 MHz | 0.5 MHz | 1.0 MHz | 5.0 MHz |
|---|---|---|---|---|---|
| delay 1 | 2.5 ns | 1E-3 | 5E-3 | 1E-2 | 5E-2 |
| delay 2 | 2.5 ns | 1E-3 | 5E-3 | 1E-2 | 5E-2 |
| Rout1 × Cin2 | 100 ps | 2E-5 | 1E-4 | 2E-4 | 1E-3 |
| Rout2 × Cout2 | 100 ps | 2E-5 | 1E-4 | 2E-4 | 1E-3 |
| Cin1/Cosc | 2E-2 | 2E-2 | 2E-2 | 2E-2 | 2E-2 |
| Rout1/Rosc | — | 1E-3 | 5E-3 | 1E-2 | 5E-2 |
| Rout2/Rosc | — | 1E-2 | 5E-3 | 1E-2 | 5E-2 |
| Oscillator | | 2.4% | 4.02% | 6.04% | 22.2% |
| Total | | 3.4% | 5.02% | 7.04% | 23.2% |

NOTES: Total includes 0.5% tolerance for both Rosc and Cosc.

Generally, errors resulting from the intrinsic delays and parasitic effects increase greatly with the operating frequency of the RC oscillator circuit so that conventional RC circuits are substantially limited to applications in which the operating frequency is less than about 1 MHz. Errors in operating frequency due to delays in the circuit are nontrivial whenever operating frequencies are higher than 1 MHz.

One method for avoiding parasitic effects is to use the integrated circuit chip dielectric to replace the capacitor C because a smaller capacitance value allows more suitable resistances of the resistor R. However, typical process variations in dielectric thickness result in substantial frequency variability. Application of trim to reduce the effects of dielectric thickness variation increases the die cost.

Various techniques have typically been employed to improve performance of conventional RC oscillators. However, these techniques have often had self-defeating results. Numerous difficulties arise while attempting to obtain high precision results for RC oscillators operating at frequencies above 0.5 MHz.

For example, the external capacitor Cosc of the RC oscillator must be sufficiently large to overpower the parasitic package and board capacitance. However, for a capacitor Cosc this large, the external resistor Rosc must be sufficiently small to charge and discharge the capacitor Cosc. A resistor Rosc this small disadvantageously escalates the power supply current. In addition, while the external resistance of resistor Rosc must be sufficiently small to charge and discharge the capacitor Cosc, it must also be much larger than the effective series resistance of the output stage driving the RC network. It is difficult to resolve these conflicting constraints on the size of the external resistor Rosc.

Furthermore, the intrinsic delay of the oscillator circuit must be much smaller than the period of oscillation. Also the W/L ratio of transistors in the output driver must be large to suitably reduce the output impedance of the driver. However, a large W/L ratio increases input capacitance and consequently the delay through the stage previous to the output driver, which then increases the intrinsic delay of the oscillator circuit. In addition, increasing the W/L ratio of transistors in the output driver elevates crossover current of the output stage, producing ground bounce and other adverse effects.

The intrinsic delay of the oscillator may also be reduced by increasing the W/L ratio of transistors in the input stage of the oscillator. However, increasing the W/L ratio disadvantageously increases the parasitic capacitance of the input stage, which disturbs the design value of capacitance C.

It has been observed that precision better than 4% at operating frequencies above 1 MHz or accuracy better than 8% at operating frequencies above 2 MHz is either unattainable or impractical utilizing conventional techniques for improving RC oscillator performance.

Due to the aforementioned drawbacks, conventional approaches to an RC oscillator circuit do not provide for a high performance, cell-based CMOS RC oscillator for usage in ASIC applications. Therefore a new approach is necessary.

SUMMARY OF THE INVENTION

In accordance with the present invention, an RC oscillator includes an RC network for forming a time constant equal to the RC product. However, this RC time constant is not used in the manner of a typical RC network to set the frequency of oscillation. Instead, the RC oscillator disclosed herein includes a separate oscillator, such as a voltage-controlled oscillator (VCO), and uses the RC time constant to compare with the oscillator-generated frequency and to adjust the frequency of the overall RC oscillator circuit in accordance with the comparison. Thus, the RC oscillator is self-calibrating.

In accordance with the present invention, a self-calibrating RC oscillator topology supplies improved accuracy in frequency performance. Changes in intrinsic circuit delay resulting from temperature, supply voltage and MOS process parameter variability are compensated by comparing the frequency over multiple samples of the oscillator period to the time constant set by the RC product of the circuit. The self-calibrating RC oscillator circuit furnishes flexibility in selecting values of R and C to establish the oscillator operating frequency, thereby reducing sensitivity to parasitic effects.

In accordance with a first embodiment of the present invention, an RC oscillator includes a core oscillator, a frequency counter connected to the core oscillator and a ramp and hold circuit connected to the frequency counter by a control signal line. An RC network is connected to the ramp and hold circuit. The RC network includes a capacitor and a resistor with the resistor supplying a controlled current. The RC oscillator further includes a comparator having a first input terminal connected to the ramp and hold circuit, a second input terminal connected to a reference voltage source and an output terminal. The RC oscillator also includes an integrating charge pump having an input terminal connected to the output terminal of the comparator, a control terminal connected to the frequency counter by a control signal line and an output terminal connected to the core oscillator.

In accordance with a second embodiment of the invention, an RC oscillator includes an RC network having a network resistor and a network capacitor and a bias circuit connected to the network resistor. The bias circuit includes a current mirror for mirroring the current through the network resistor. The RC oscillator further includes a ramp and hold circuit connected to the bias circuit to receive a mirrored current and connected to the network capacitor. The ramp and hold circuit has a control signal input line. The RC oscillator also includes a comparator having a first input terminal connected to the bias circuit to receive a signal indicative of the current through the network resistor, a second input terminal connected to the ramp and hold circuit to receive a signal indicative of the voltage across the network capacitor, and an output terminal. A charge pump has an input terminal connected to the bias circuit to receive a signal indicative of the current through the network resistor, a first control terminal, a second control terminal connected to the comparator output terminal. The charge pump includes a pump capacitor. The RC oscillator further includes an oscillator having an input terminal connected to the pump capacitor and an output terminal, a frequency divider having an input terminal connected to the oscillator output terminal and a plurality of output lines and a frequency decoder having a plurality of input lines connected to the output lines of the frequency divider and having a first output control line connected to the ramp and hold circuit control signal input line and a second output control line connected to the charge pump first control terminal.

An RC oscillator as described above has several advantages. One advantage is that the RC oscillator compensates for delays in the core oscillator circuit. These delays make the RC time constant inaccurate in conventional RC oscillator circuits. Thus, the RC oscillator described herein is an exceptionally accurate oscillator which is self-calibrating and constantly calibrating so that only a minor, essentially-transparent "dither" variability influences the oscillator frequency.

A further advantage is that the frequency operation of the oscillator is extended to the frequency limits of the voltage-controlled oscillator. For CMOS integrated circuits, the frequency limit is extended to 100 MHz or more. The oscillator operates over a wide range of voltages including 3 volt operation. Additionally, the circuit advantageously features a low operating current and a low temperature sensitivity. A further advantage is that the frequency of the oscillator is set by the values of the resistor and capacitor within the circuit and is substantially insensitive to parasitic resistances and capacitances. Thus, the described RC oscillator is tunable by simply changing the resistor or capacitor within the circuit. In conventional RC oscillator circuits, parasitic resistances and capacitances greatly affect the frequency behavior of oscillation.

An additional advantage is that the described RC oscillator circuit is very accurate in comparison to conventional RC oscillator circuits with achievable accuracies ranging from 1% to 4% of the designed frequency. Frequency accuracy is essentially set by the tolerances of the resistive and capacitive elements of the circuit. A further advantage is that the described RC oscillator self-compensates for variation in temperature, power supply voltage and MOS process parameters. Flexibility in choosing resistor and capacitor values in the RC oscillator circuit of the present invention, in addition to flexibility in selection of the process technology permit an RC oscillator Circuit to be optimized for precision or high frequency operation.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIGS. 7(a) through 7(f) illustrate a schematic circuit diagram of an additional embodiment of a self-calibrating RC oscillator circuit which is optimized for low power operation.

FIGS. 8(a) through 8(g)-2 show a schematic circuit diagram of a digitally-tuned oscillator circuit.

DETAILED DESCRIPTION

Figure 1:
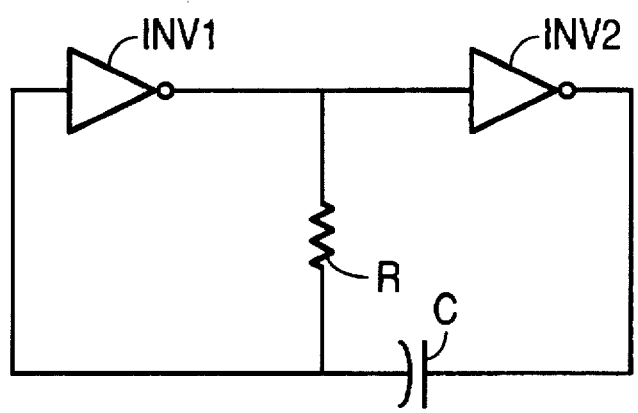
FIG. 1, labelled prior art, illustrates a conventional CMOS RC oscillator.
Figure 2:
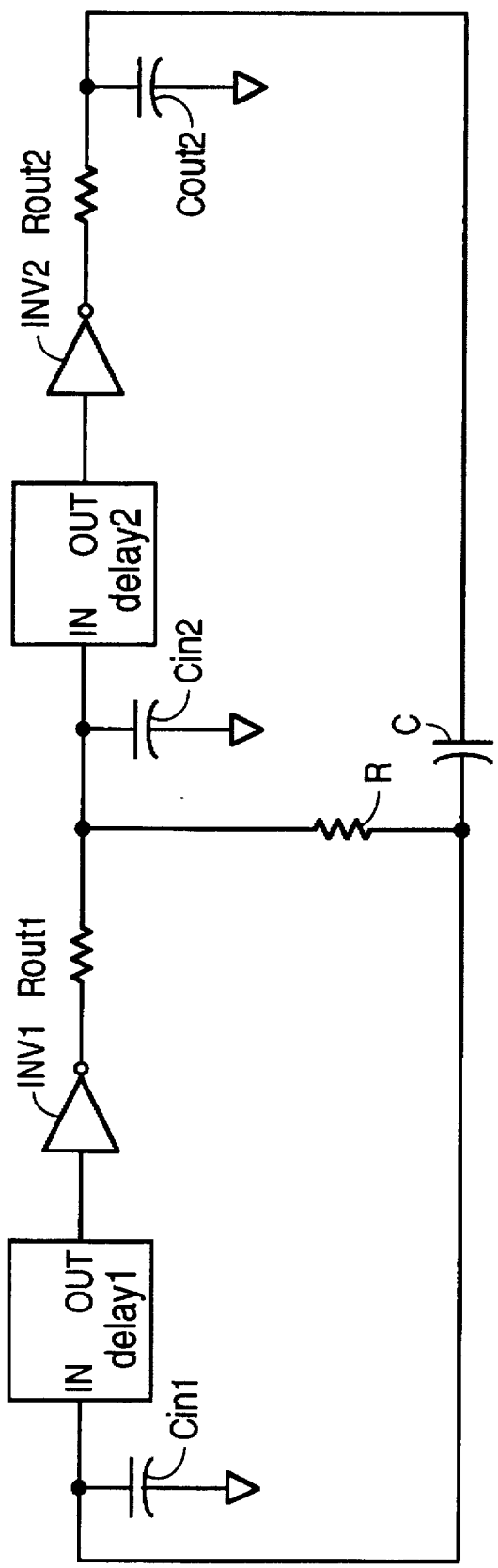
FIG. 2 depicts an equivalent circuit of the conventional CMOS RC oscillator shown in FIG. 1.
Figure 3:
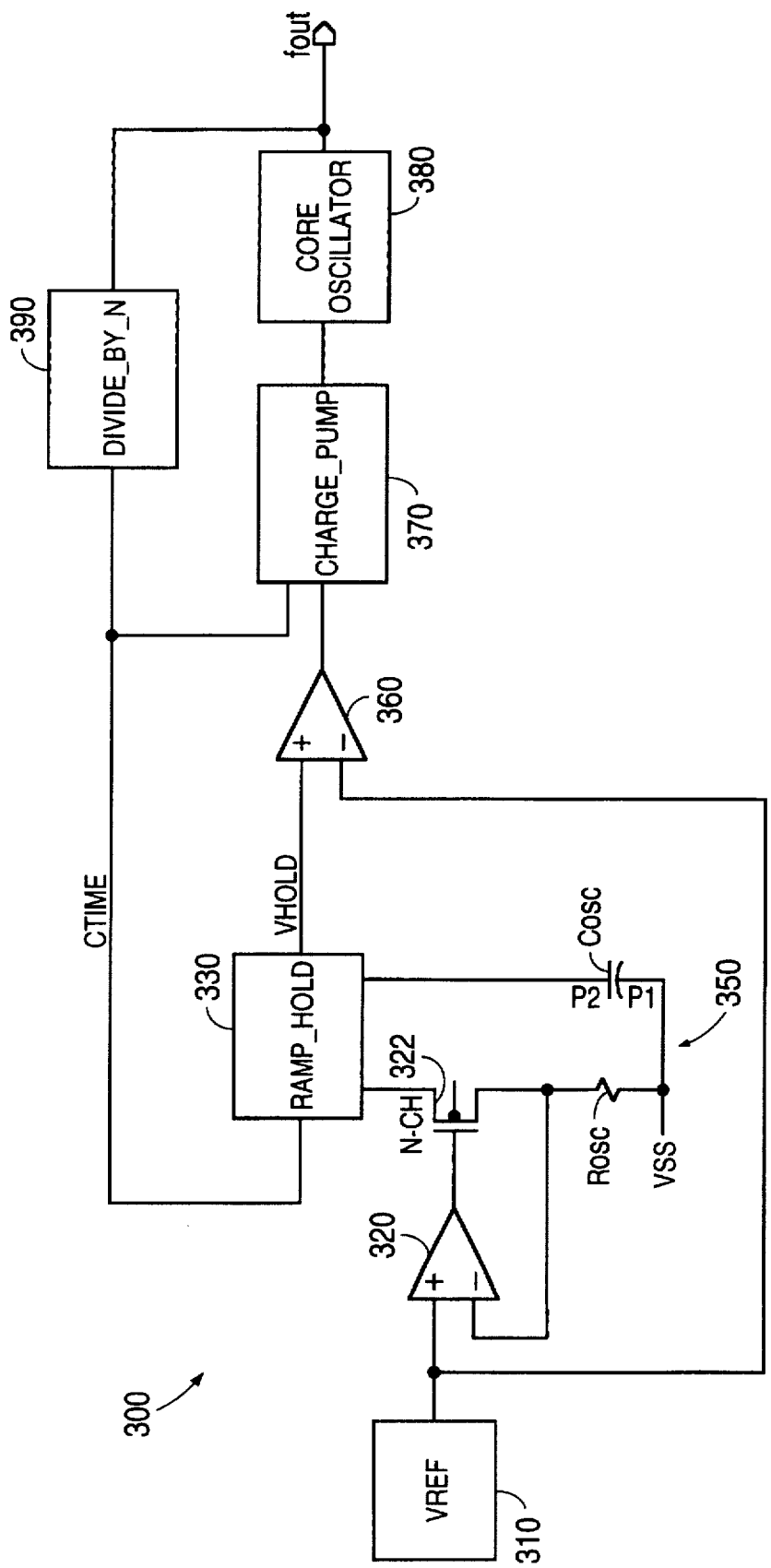
FIG. 3 illustrates a functional block diagram of an embodiment of a self-calibrating RC oscillator circuit.

Referring to FIG. 3, a functional block diagram of an embodiment of a self-calibrating RC oscillator circuit 300 includes a voltage reference block 310, an operational amplifier 320, a ramp and hold circuit 330, an RC network 350, a comparator 360, a charge pump circuit 370, a core oscillator 380 and a divide-by-N binary counter 390. The RC network 350 includes a resistor Rosc and a capacitor Cosc. The RC oscillator circuit 300 has no phase comparator and, thus, fundamentally differs from a phase-locked loop (PLL). Furthermore, the RC oscillator circuit 300 uses no input frequency reference signal and, therefore, is not a frequency-locked loop (FLL).

The RC oscillator circuit 300 is constructed on an integrated circuit chip. In some embodiments, the RC oscillator circuit 300 includes multiple lines for controlling the oscillator to precisely trim the current to a desired accuracy. The voltage reference block 310 applies a voltage reference VREF to a noninverting input terminal of the operational amplifier 320. An output terminal of the operational amplifier 320 is connected to the gate of an N-channel MOS transistor 322, which has a source terminal connected through the resistor Rosc of the RC network 350 to a VSS (ground) reference. The source terminal of the N-channel MOS transistor 322 is connected to an inverted input terminal of the operational amplifier 320. Connected in this manner, operational amplifier 320 drives the N-channel MOS transistor 322 which, when connected in series with the resistor Rosc, forms a voltage-to-current converter having a current applied to the ramp and hold circuit 330.

The ramp and hold circuit 330 is connected to a control line Ctime from divide-by-N binary counter 390 and generates an output analog signal Vhold which is applied to the noninverting input terminal of analog comparator 360. Furthermore, ramp and hold circuit 330 has one terminal connected to the voltage-to-current converter formed by N-channel CMOS transistor 322 and resistor Rosc. The ramp and hold circuit 330 has a second terminal connected to capacitor Cosc for charging capacitor Cosc. The ramp and hold circuit 330 operates essentially as a current mirror which mirrors a current equal to VREF/Rosc to the capacitor Cosc, causing capacitor Cosc to charge in a substantially linear manner with time in accordance with the equation $dV/dt=I/C$. Thus, for a particular amount of charging time, capacitor Cosc is charged to a voltage having a particular value. The charging time is controlled by a time duration signal on control line Ctime and applied to the ramp and hold circuit 330 by the divide-by-N binary counter 390. The divide-by-N binary counter 390 receives a timing signal from the core oscillator 380 and derives the time duration signal on control line Ctime by counting clock pulses of the timing signal and dividing down this count by a preselected denominator. When a selected time duration has transpired, Ctime signal stops the charging of the capacitor Cosc. Generally, if the frequency of the core oscillator 380 decreases, capacitor Cosc charges for a longer time duration to higher voltages. If the core oscillator 380 frequency increases, capacitor Cosc charges for a shorter time to a lower voltage. The ramp and hold circuit 330 applies the voltage on capacitor Cosc to the analog comparator 360. Analog comparator 360 compares the Vhold voltage to the reference voltage VREF, which is received from the voltage reference block 310 at the inverting terminal of the analog comparator 360.

The analog comparator 360 generates a high or low value which is applied to the charge pump circuit 370. The signal from the analog comparator 360 ultimately depends on the frequency of operation of core oscillator 380 and is used to determine whether to pump up or pump down the charge pump circuit 370. The analog comparator 360 and charge pump circuit 370 act in combination to adjust the core oscillator 380 in a self-correcting manner using negative feedback. A voltage signal generated by the charge pump circuit 370 drives the core oscillator 380.

The core oscillator 380 generates the output signal of the RC oscillator 300 on frequency output line Fout and drives the divide-by-N binary counter 390. In the illustrative embodiment, the core oscillator 380 is a voltage-controlled oscillator (VCO). In other embodiments, a current-controlled oscillator (CCO) is utilized. A suitable CCO is better disclosed in U.S. patent application Ser. No. 08/379,049, entitled "A FREQUENCY CONVERTER UTILIZING A FEEDBACK CONTROL LOOP", O'Shaughnessy, T. G. et at., filed Jan. 27, 1995 (Attorney docket Number M-3174), which is herein incorporated by reference in its entirety. With respect to one aspect, the VCO embodiment is preferred because the output signal of the charge pump 370 is a voltage so that a CCO implementation would require an additional voltage to current converter circuit.

Thus, RC oscillator circuit 300 functions by comparing two voltages—a reference voltage which is supplied as an input signal and a frequency-derived voltage signal indicative of the operating frequency of the core oscillator 380. The core oscillator 380 produces a timing signal of pulses which oscillates at a determined frequency. The timing signal of pulses is frequency-divided by the divide-by-N binary counter 390. The frequency-divided timing signal from the binary counter 390 drives the ramp and hold circuit 330 and the integrating charge pump 370. The ramp and hold circuit 330 generates a current signal which is proportional in amplitude to the reference voltage. The current signal is mirrored to the capacitor Cosc.

Following initialization, the capacitor Cosc charges until the start of a "hold" interval which is controlled by the time duration signal on control line Ctime. If the frequency of the timing signal generated by the core oscillator 380 is low, the capacitor Cosc charges to a "hold" voltage Vhold that exceeds the reference voltage Vref. The output signal of analog comparator 360 then activates the charge pump 370 to increase the input voltage to the core oscillator 380. The core oscillator 380 then increases the frequency of the timing signal of pulses. A high frequency of the VCO-generated timing signal produces a low "hold" voltage. The comparator 360 activates the charge pump 370 to decrease the input voltage to the core oscillator 380.

The RC oscillator circuit 300 is ratiometric so that: (1) the current Iramp charging the capacitor Cosc, (2) the ramp rate dV/dt, (3) the resulting "hold" voltage Vhold, and (4) the oscillator frequency Fosc are derived in accordance with the following equations:

$$Iramp = m \times (Vref/Rosc), \quad (1)$$

$$dV/dt = (m \times Vref)/(Rosc * Cosc), \quad (2)$$

$$Vhold = (m \times Vref \times Tramp)/(Rosc * Cosc), \quad (3)$$

$$Fosc = (M \times N)/(Rosc * Cosc), \quad (4)$$

where Iramp is the current charging the capacitor Cosc, m is the current mirror ratio, Rosc and Cosc are, respectively, the resistance and capacitance which are predefined for usage in the RC oscillator circuit 300 for setting the operating frequency. Furthermore, Vref is the internal reference voltage, Vhold and Tramp are, respectively, the hold voltage and time of the charging interval of the ramp and hold circuit 330, N is the divide-by ratio of the binary counter 390 and Fosc is the output frequency of the core oscillator 380.

The voltage reference VREF generated by the voltage reference block 310 is used for two functions. First, VREF is used to produce the current for charging the capacitor Cosc. Second, VREF is applied to the inverting input terminal of the analog comparator 360 for comparing to the Vhold signal in the RC oscillator 300 feedback loop. Notice in equation (3) above that Vhold is obtained from multiplying VREF with a parameter. Thus in the comparison of Vhold to VREF by analog comparator 360, VREF cancels so that the circuit is theoretically independent of the value of the reference voltage for purposes of determining the frequency of the RC oscillator 300. This theoretical lack of constraints on the value of VREF allows some circuit simplification. However, in practice, the analog comparator 360 has some offset voltage which contributes an additive error voltage to the input voltage level VREF. Thus, VREF is set to a sufficiently large amplitude to overwhelm the offset error.

The frequency of the core oscillator 380 establishes a "hold" voltage at the output terminal of the ramp and hold circuit 330. The hold voltage and a reference voltage from the voltage reference block 310 are applied to the input of the analog comparator 360. If the hold voltage is less than the reference voltage, the frequency is high. The comparator output then drives the charge pump 370 to produce a lower voltage for application to the input terminal of the core oscillator 380, which reduces the frequency of the core oscillator 380. If the frequency of the core oscillator 380 is low, the hold frequency increases, the comparator 360 drives the charge pump 370 to produce a larger voltage at the input terminal of the core oscillator 380, which increases the oscillator frequency.

RC oscillator circuit 300 samples its operating clock period, compares the sampled clock period to the sample period of RC network 350, and generates a negative feedback signal that corrects for variations in delay which result from changes in temperature, power supply voltage and variable process parameters.

RC oscillator circuit 300 includes several features that facilitate high performance. For example, the analog signal processing within the RC network 350, the analog comparator 360 and the charge pump circuit 370 operate under control of timing signals applied at a divided frequency of Fosc/N. This lower-frequency operation allows adequate settling time for transient signals within these analog circuits and, therefore, permits a very accurate comparison between the Vhold and Vref voltages.

In addition, scaling of the frequency by the binary counter 390 makes the time constant of the capacitor Cosc relatively larger with respect to the timing interval of the RC oscillator circuit 300. As a result, the capacitor Cosc becomes sufficiently large to be insensitive to charge injection and parasitic capacitances.

Various embodiments of the RC oscillator circuit 300 include different implementations of the RC network 350. For example, some embodiments of the RC oscillator circuit 300 are fully monolithic, having no external elements. In a completely monolithic embodiment, no pins are furnished for connection to external elements and the RC oscillator circuit 300 uses a polysilicon resistor array (not shown) that is trimmed to set the operating frequency. In a one-pin embodiment of the RC oscillator circuit 300, the capacitor Cosc is furnished using the chip dielectric of the integrated circuit. The one-pin RC oscillator 300 uses an external resistor Rosc and furnishes an option to trim out process variations of capacitance. In a two-pin embodiment of the RC oscillator 300, both the resistance of resistor Rosc and the capacitance of capacitor Cosc are furnished by external frequency-setting elements. The RC oscillator circuit 300 automatically corrects for changes in circuit delay resulting from variability in temperature, power supply voltage and MOS process parameters.

Figure 4:
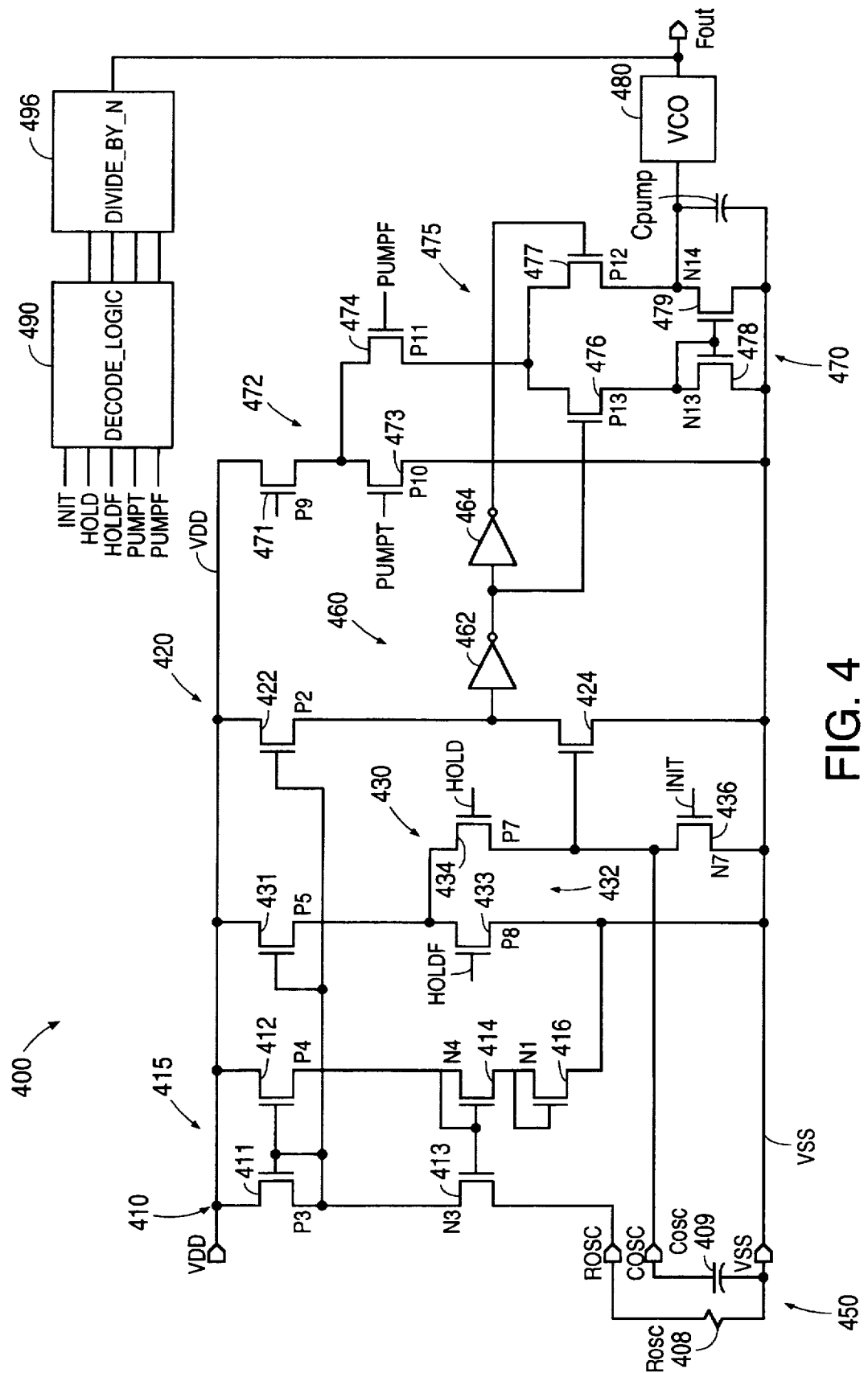
FIG. 4 depicts a transistor-level schematic diagram of an embodiment of the self-calibrating RC oscillator circuit.

Referring to FIG. 4, a transistor-level schematic diagram of an embodiment of the self-calibrating RC oscillator circuit 400 shows a bias circuit 410, an inverter 420, a ramp and hold circuit 430, an RC network 450, an analog comparator 460, a charge pump circuit 470, a voltage-controlled oscillator (VCO) 480, a decode logic circuit 490 and a divide-by-N circuit 496.

The bias circuit 410 generates a reference current conducting through resistor Rosc 408 that is equal to VREF/ Rosc and is therefore functionally similar to the voltage reference block 310 and operational amplifier 320 shown in FIG. 3. Single input analog comparator 460 includes input inverter 420 and CMOS inverters 462 and 464. Input inverter 420 includes a P-channel MOS transistor (P2) 422 and an N-channel MOS transistor (N2) 424. The single input terminal of inverter 420 is the gate of N-channel MOS transistor (N2) 424. The output terminal of inverter 420 is the drain of N-channel MOS transistor (N2) 424. The switching threshold of inverter 420 is a function of the current conducted through P-channel MOS transistor (P2) 422 so that an increase in current increases the switching threshold voltage. However, the switching voltage is widely variable, differing by up to several hundreds of millivolts, under varying process and temperature conditions although a particular switching voltage is very consistent within the same integrated circuit.

The inverter 420 is connected to the bias circuit 410 to duplicate the reference current through resistor Rosc 408. Bias circuit 410 includes a first current mirror P-channel MOS transistor (P3) 411, a second current mirror P-channel MOS transistor (P4) 412, a N-channel MOS transistor (N3) 413, a matched N-channel MOS transistor (N4) 414 and an N-channel MOS transistor (N1) 416. First current mirror P-channel MOS transistor (P3) 411 and second current mirror P-channel MOS transistor (P4) 412 form a current mirror 415 so that the current drawn off the drain of first current mirror P-channel MOS transistor (P3) 411 is mirrored to second current mirror P-channel MOS transistor (P4) 412. The drain terminals of first current mirror P-channel MOS transistor (P3) 411 and second current mirror P-channel MOS transistor (P4) 412 are respectively connected to the drain terminals of N-channel MOS transistor (N3) 413 and matched N-channel MOS transistor (N4) 414. Furthermore, N-channel MOS transistor (N3) 413 and matched N-channel MOS transistor (N4) 414 are matched and receive the same current from the current mirror 415 so that their gate to source voltages are virtually identical.

N-channel MOS transistor (N1) 416 has a drain terminal and a gate terminal connected to the source terminal of matched N-channel MOS transistor (N4) 414 and a source terminal connected to the ground reference source VSS. Connected in this manner, N-channel MOS transistor (N1) 416 generates a gate to source voltage $V_{GSN1}$ which is equal to the voltage across the resistor Rosc 408 in accordance with the equation:

$$V_{Rosc}=V_{GSN1}$$

so that the current $i_{Rosc}$ conducted through the resistor Rosc 408 is determined according to the equation:

$$i_{Rosc}=V_{GSN1}/Rosc.$$

The current $i_{Rosc}$ charges the capacitor Cosc 409 through the operation of the ramp and hold circuit 430.

The bias circuit 410 described with respect to FIG. 4 includes five transistors 411, 412, 414, 416 and 413 and performs functions which are analogous to the functions of voltage reference generator 310, operational amplifier 320 and MOS transistor 322 shown in FIG. 3. The RC oscillator 400 is advantageously a simplified circuit which does not utilize an operational amplifier or a differential comparator.

The ramp and hold circuit 430 includes a ramp and hold input P-channel MOS transistor (P5) 431, a ramp and hold differential switch 432, and a ramp and hold N-channel transistor (N7) 436. The ramp and hold differential switch 432 includes a first ramp and hold differential switch P-channel MOS transistor (P6) 433 and a second ramp and hold differential switch P-channel MOS transistor (P7) 434. Ramp and hold input P-channel MOS transistor (P5) 431 has a source terminal connected to the power supply source VDD, a drain terminal connected to the ramp and hold differential switch 432 and a gate terminal connected to the gate terminals of first current mirror P-channel MOS transistor (P3) 411 and second current mirror P-channel MOS transistor (P4) 412. First ramp and hold differential switch P-channel MOS transistor (P6) 433 has a source terminal connected to the drain terminal of ramp and hold input P-channel MOS transistor (P5) 431, a drain terminal connected to the ground reference source VSS and a gate terminal connected to a HOLDF (hold false) control line from the decode logic 490. Second ramp and hold differential amplifier P-channel MOS transistor (P7) 434 has a source terminal connected to the drain terminal of ramp and hold input P-channel MOS transistor (P5) 431 and a gate terminal connected to a HOLD control line from the decode logic 490. Ramp and hold N-channel transistor (N7) 436 has a source terminal connected to the ground reference source VSS, a drain terminal connected to the drain terminal of second ramp and hold differential amplifier P-channel MOS transistor (P7) 434 and to capacitor Cosc 409 and a gate terminal connected to an INIT line from the decode logic 490. Due to the extensive transistor matching and current mirroring in the bias circuit 410, the current conducting through P-channel MOS transistors (P3) 411 and (P4) 412 and N-channel MOS transistors (N3) 413, (N4) 414 and (N1) 416 are essentially the same and equal to $i_{Rosc}$. Ramp and hold input N-channel MOS transistor (P5) 431 also forms a current mirror with first current mirror P-channel MOS transistor (P3) 411 so that nearly the same current $i_{Rosc}$ passes through the drain of ramp and hold input N-channel MOS transistor (P5) 431, through second ramp and hold differential amplifier P-channel MOS transistor (P7) 434, thereby charging the capacitor Cosc 409. The current $i_{Rosc}$ generated by the bias circuit 410 produces a voltage across the resistor Rosc 408 having a value that can be arbitrarily set in a wide range of voltages and for this arbitrary voltage a corresponding arbitrary proportional current charges the capacitor Cosc 409. In addition, N-channel MOS transistor (N2) 424 is matched to N-channel MOS transistor (N1) 416 so that the gate to source voltage $V_{GSN1}$ is very precisely equal to the switching voltage of the CMOS input inverter 420 of P-channel MOS transistor (P2) 422 and N-channel MOS transistor (N2) 424.

The output signal of the CMOS inverter 420 is passed from the drain terminals of P-channel MOS transistor (P2) 422 and N-channel MOS transistor (N2) 424 to the input terminal of analog comparator 460, which includes inverters 462 and 464.

Figure 5:
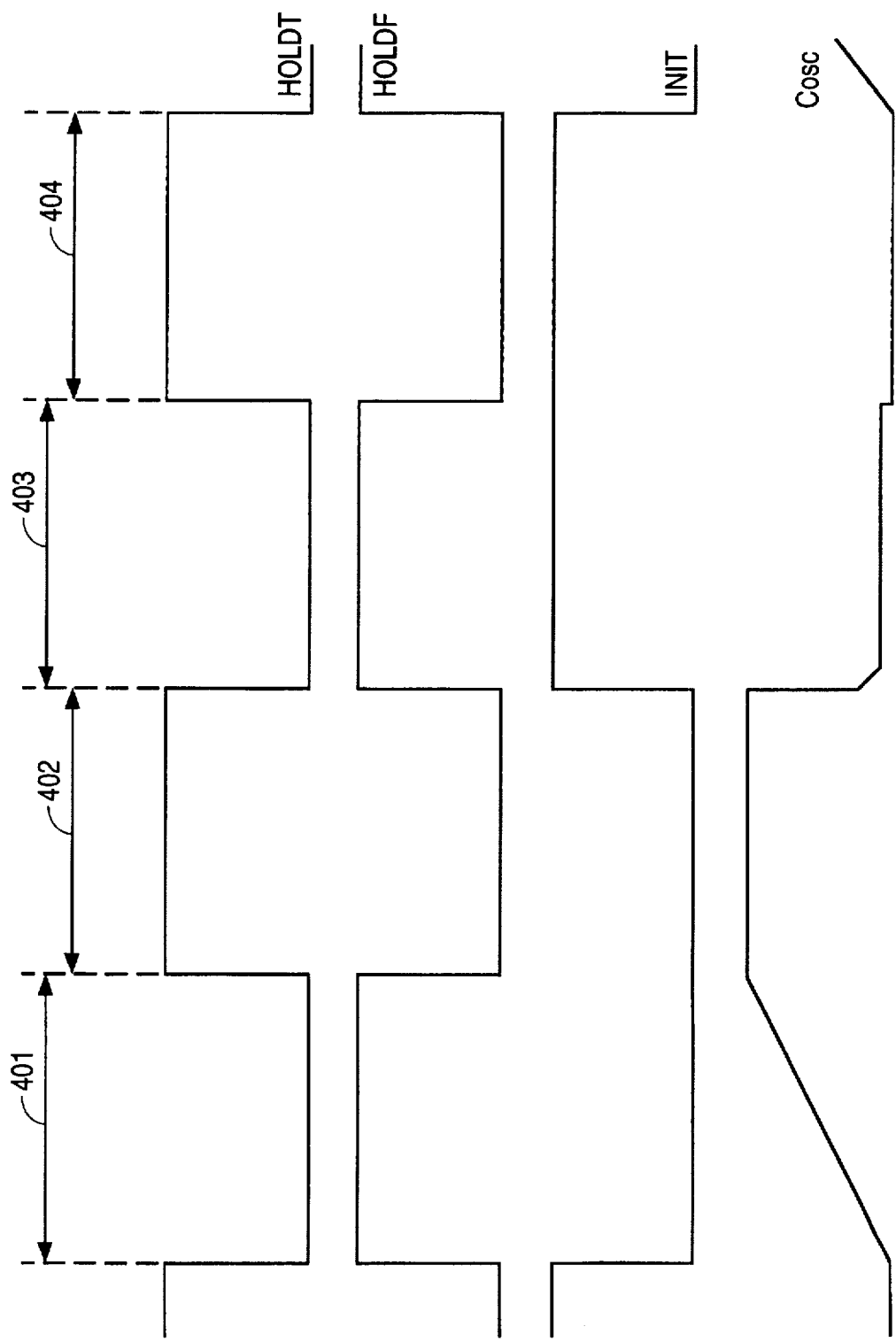
FIG. 5 is a timing diagram which illustrates the operation of the RC oscillator shown in FIG. 4.

Operation of the RC oscillator 400 is described with reference to the timing diagram shown in FIG. 5 in conjunction with FIG. 4. Decode logic 490 controls a four phase timing cycle 405 including phases T1 401, T2 402, T3 403 and T4 404. During a charge ramping interval of phase T1 401, the capacitor Cosc 409 is charged as the decode logic 490 sets the hold signal on line HOLD to a low logic level and sets the hold false signal on line HOLDF to a high logic level, respectively making second ramp and hold differential switch P-channel MOS transistor (P7) 434 conductive and first ramp and hold differential switch P-channel MOS transistor (P6) 433 nonconductive. Accordingly, the current $i_{Rosc}$ from ramp and hold input N-channel MOS transistor (P5) 431 is steered to capacitor Cosc 409 and the charge across the capacitor Cosc 409 steadily increases or "ramps up".

During a voltage hold phase T2 402, the charge on capacitor Cosc 409 is held constant as the decode logic 490 sets the hold signal on line HOLD to a high logic level and sets the hold false signal on line HOLDF to a low logic level, respectively making second ramp and hold differential switch P-channel MOS transistor (P7) 434 nonconductive and first ramp and hold differential switch P-channel MOS transistor (P6) 433 conductive. The current $i_{Rosc}$ from ramp and hold input N-channel MOS transistor (P5) 431 remains the same but is steered to ground reference source VSS. Also during interval T2 402, the comparison of the voltage on capacitor Cosc 409 is made. While the charge on capacitor Cosc 409 is held for the entire interval T2 402, the comparison of the voltage on capacitor Cosc 409 may last the duration of interval T2 402 or may last only a fraction of interval T2 402. Some advantages arise if the compare operation endures for only a fraction of the interval. These advantages are discussed hereinafter in a discussion of the charge pump circuit 470. Thus, the overall result of the operations of bias circuit 410, input inverter 420 and ramp and hold circuit 430 is that if the capacitor Cosc 409 is charged to a voltage greater than the gate to source voltage $V_{GSN1}$ of N-channel MOS transistor (N1) 416 then the output voltage of N-channel MOS transistor (N2) 424 signifies a logic zero. Otherwise, the gate voltage of N-channel MOS transistor (N2) 424 is insufficient to sink the current from P-channel MOS transistor (P2) 422 so that N-channel MOS transistor (N2) 424 generates a logic one signal. CMOS inverters 462 and 464 have sufficient voltage gain, that rail-to-rail CMOS logic levels are produced to the respective input terminals of charge pump 475.

Thus, time intervals T1 401 and T2 402 respectively time the ramping and holding operations of the ramp and hold circuit 430. These operations are similar to the sample and hold operations of a sample and hold circuit but differ in that no external voltage is sampled, but rather an internal charge on the capacitor Cosc 409 is measured.

During time interval T3 403, capacitor Cosc 409 is discharged. Ramp and hold N-channel transistor (N7) 436 is activated under control of decode logic 490 which sets an initialized signal on line INIT to a logic one from a previous value of logic zero and thereby renders ramp and hold N-channel transistor (N7) 436 conductive to discharge capacitor Cosc 409. The initialized signal on the INIT line is high during time intervals T3 and T4 and low during intervals T1 and T2. At the rising edge of the signal on the INIT line, decode logic 490 produces a falling edge on the HOLD line so that the current from ramp and hold input N-channel MOS transistor (P5) 431 is conducted through both second ramp and hold differential switch P-channel MOS transistor (P7) 434 and ramp and hold N-channel transistor (N7) 436. As ramp and hold N-channel transistor (N7) 436 becomes conductive and operates in the ohmic region, capacitor Cosc 409 is discharged to a small offset voltage, the voltage level of the "on voltage" of ramp and hold N-channel transistor (N7) 436 (for example, approximately 50 mV). This discharging of capacitor Cosc 409 may be considered a "predischarge" operation to a much lower voltage than the "hold" voltage.

During time interval T4 404, any residual charge is discharged from capacitor Cosc 409. Decode logic 490 sets the hold signal on HOLD line high and the hold false signal on HOLDF line low. The initialized signal on INIT line remains high so that ramp and hold N-channel transistor (N7) 436 remains conductive. No additional current from ramp and hold input P-channel MOS transistor (PS) 431, other than a possible small leakage current, is conducted to ramp and hold N-channel transistor (N7) 436 because the current is steered down the drain of first ramp and hold differential switch P-channel MOS transistor (P6) 433. Thus, ramp and hold N-channel transistor (N7) 436 is operating in the ohmic region and conducting only a leakage current from second ramp and hold differential amplifier P-channel MOS transistor (P7) 434. Only a very small residual voltage of approximately 50 μV, essentially zero, remains on the capacitor Cosc 409. At the end of interval T4 404, capacitor Cosc 409 is very completely discharged to a precise initial condition of zero volts and again is ready to repeat the charging interval 401.

Charge pump circuit 470 includes a charge pump current source P-channel MOS transistor (P9) 471, a charge pump control differential switch 472, a charge pump signal differential amplifier 475, and a charge pump capacitor Cpump. Charge pump current source P-channel MOS transistor (P9) 471 has a source terminal connected to power supply source VDD and a drain terminal connected to charge pump control differential switch 472. Charge pump current source P-channel MOS transistor (P9) 471 has a W/L ratio which is reduced from the ratio of first current mirror P-channel MOS transistor (P3) 411 so that the charge pump sourced current $i_{pump}$ is made much smaller than current $i_{Rosc}$. Charge pump control differential switch 472 includes a pump true P-channel MOS transistor (P10) 473 and a pump false P-channel MOS transistor (P11) 474. Pump true P-channel MOS transistor (P10) 473 has a source terminal connected to the drain terminal of charge pump current source P-channel MOS transistor (P9) 471, a drain terminal connected to ground reference source VSS and a gate control terminal connected to decode logic 490 via a PUMPT line. Pump false P-channel MOS transistor (P11) 474 has a source terminal connected to the drain terminal of charge pump current source P-channel MOS transistor (P9) 471, a drain terminal connected to charge pump signal differential amplifier 475 and a gate control terminal connected to decode logic 490 via a PUMPF line. Charge pump current source P-channel MOS transistor (P9) 471 and charge pump control differential switch 472 source current to the charge pump differential amplifier 475. Charge pump differential amplifier 475 includes a charge pump first P-channel MOS transistor (P13) 476, a charge pump second P-channel MOS transistor (P12) 477, a charge pump first N-channel MOS transistor (N13) 478 and a charge pump second N-channel MOS transistor (N14) 479. Charge pump first P-channel MOS transistor (P13) 476 has a source terminal connected to the drain terminal of pump false P-channel MOS transistor (P11) 474, a drain terminal, and a control gate terminal connected to the output terminal of inverter 462 of analog comparator 460. Charge pump P-channel MOS transistor (P12) 477 has a source terminal connected to the drain terminal of pump false P-channel MOS transistor (P11) 474, a drain terminal connected to the charge pump capacitor Cpump of charge pump circuit 470 and to the control input of VCO 480, and a control gate terminal connected to the output terminal of inverter 464 of analog comparator 460.

Charge pump N-channel MOS transistor (N13) 478 has a source terminal connected to the ground reference VSS and a drain and gate terminal connected to the drain terminal of charge pump P-channel MOS transistor (P13) 476. Charge pump N-channel MOS transistor (N14) 479 has a source terminal connected to the ground reference VSS, a gate terminal connected to the gate terminal of charge pump N-channel MOS transistor (N13) 478 and a drain terminal connected to the drain terminal of charge pump P-channel MOS transistor (P12) 477.

Decode logic 490 controls the charge pump circuit 470 to acquire the logic signal at the output of analog comparator 460 by controlling a pump true signal on a PUMPT line and a pump false signal on a PUMPF line which is complementary to the PUMPT line. At the time within interval T2 402 when the comparison of capacitor Cosc 409 is sufficiently complete, then decode logic 490 sets the pump true signal high and the pump false signal low so that pump true P-channel MOS transistor (P10) 473 is nonconductive and pump false P-channel MOS transistor (P11) 474 conducts the current $i_{pump}$ from the drain terminal of charge pump current source P-channel MOS transistor (P9) 471 through the source and drain of pump false P-channel MOS transistor (P11) 474 to begin charging the current sources of charge pump P-channel MOS transistors (P13) 476 and (P12) 477. The state of the analog comparator 460 controls the current flow in charge pump signal differential amplifier 475.

When differential amplifier second P-channel MOS transistor (P12) 477 has a low signal on the gate terminal and is therefore conductive and differential amplifier first P-channel MOS transistor (P13) 476 has a high signal on the gate terminal and is nonconductive, the drain current of pump false P-channel MOS transistor (P11) 474 is transmitted to linearly charge the pump capacitor Cpump. The voltage on the capacitor Cpump changes linearly because the capacitor Cpump is charged with a fixed current. When charge pump second P-channel MOS transistor (P12) 477 has a high signal on the gate terminal and is nonconductive and charge pump first P-channel MOS transistor (P13) 476 has a low signal on the gate terminal and is conductive, the drain current of pump false P-channel MOS transistor (P11) 474 is conducted to the ground reference VSS. At the end of the T2 402 interval the charge on the charge pump capacitor Cpump is held as decode logic 490 sets the pump true signal low and the pump false signal high so that pump true P-channel MOS transistor (P10) 473 is conductive and passes the drain current of pump false P-channel MOS transistor (P11) 474 to ground reference VSS.

Otherwise differential amplifier second P-channel MOS transistor (P12) 477 has a high signal on the gate terminal and is nonconductive and charge pump first P-channel MOS transistor (P13) 476 has a low signal on the gate terminal and is conductive, the drain current of pump false P-channel MOS transistor (P11) 474 is steered to N13. N13 forms a current mirror with N14 so that N14 duplicates the current of N13, which allows the charge pump circuit 470 to discharge a unit of charge from the capacitor Cpump, linearly decreasing the charge on capacitor Cpump because the current is fixed. Accordingly, the charge pump circuit 470 either charges or discharges the charge pump capacitor Cpump with the charge and discharge amounts being substantially equivalent. Thus the voltage across the pump capacitor Cpump may have the form of a stairstep function either charging or discharging the pump capacitor Cpump depending on whether the VCO 480 is high in frequency or low in frequency. Eventually the frequency of the VCO 480 reaches a steady-state, balanced condition in which the voltage across the capacitor Cosc 409 substantially matches the threshold voltage $V_{GSN1}$ so that the voltage across the pump capacitor Cpump toggles between charging and discharging for each successive T2 402 timing interval to the next. Each adjustment causes the oscillating frequency to deviate slightly from the ideal oscillating frequency determined by the RC network 450, slightly overcompensating for the previous adjustment in the opposite direction. The charge pump circuit 470 continues to alternately charge and discharge the pump capacitor Cpump until a change in operating conditions such as initialization, a quantum charge, a parasitic leakage or the like occurs which causes readjustment of the charge pump. In this manner, the charge pump circuit 470 generates an error voltage that causes the feedback loop of the RC oscillator circuit 400 to self-correct so that the average frequency is precisely the correct frequency of oscillation. This condition is called a "dither" and the average oscillating frequency is extremely accurate.

In accordance with the function of charge pump circuit 470, RC oscillator 400 is frequency-modulated with the amount of frequency modulation determined by the size of the pump capacitor Cpump and the amount of current $i_{pump}$ conducting through the drain of charge pump current source P-channel MOS transistor (P9) 471. More frequency modulation results for a larger current $i_{pump}$ and for a smaller pump capacitor Cpump. Likewise, less frequency modulation occurs for a smaller value of pump current $i_{pump}$ and also for a larger pump capacitor Cpump.

The decode logic circuit 490 and divide-by-N circuit 496 in RC oscillator 400 implement a divide-by-N operation in which N is an integer multiple of four, and N has a minimum value of four. N is at least four to count the four-phase timing cycle 405 shown in FIG. 5. The four-phase timing cycle includes two phases ("on" and "off" phases) of the initialized signal on the INIT line for each cycle, and four phases (two cycles) of the hold true and hold false signals on the HOLD and HOLDF lines. N is increased to a number greater than four to improve performance of RC oscillator 400 since it is advantageous to control the pump true and false signals on the PUMPT and PUMPF lines for a shorter interval of time than the hold true and hold false signals. The pump true and false signals operate at the same frequency as the initialized signal on the INIT line but at a lower duty cycle. Thus, increasing the N count of the divide-by-N circuit 496 higher than four avoids nonideal loop dynamics that occurs when steering current to the pump capacitor Cpump and the frequency changes. Increasing the N count allows the comparator more time to settle before sampling and permits the sampling interval to be shortened, avoiding the nonideal correction of the loop that results from adjusting the oscillator frequency over a large fraction of the evaluation interval.

Figure 6:
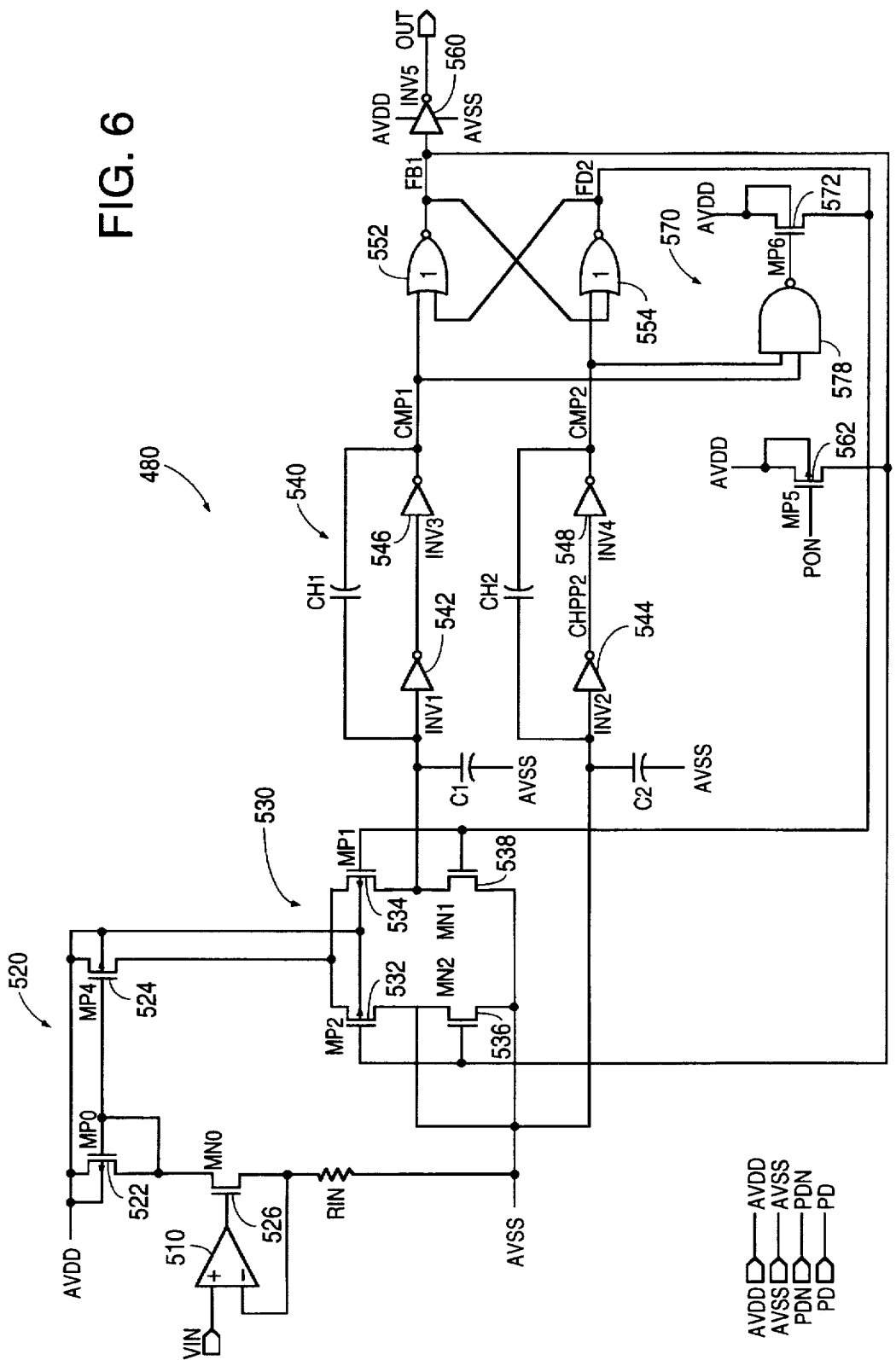
FIG. 6 illustrates a schematic circuit diagram of a voltage-controlled oscillator (VCO) in the RC oscillator circuit shown in FIG. 4.

Referring to FIG. 6, the VCO 480 includes an operational amplifier 510, a current mirror 520, a quadripole network 530, capacitors C1 and C2, inverter network 540, and NOR gates 552 and 554. The inverter network 540 includes inverters 542, 544, 546 and 548.

An input voltage VIN, the voltage across the pump capacitor Cpump of the charge pump circuit 470, is applied to the noninverting input terminal of operational amplifier 510, which is configured in a negative feedback loop having the inverting input terminal of the operational amplifier 510 connected to a resistor RIN. As the voltage VIN is continuously applied, the operational amplifier 510 eventually reaches a steady state condition in which the signals applied to the noninverting and inverting input terminals of operational amplifier 510 are equal. In this steady state condition, the current of resistor RIN is substantially equal to the input voltage divided by the resistance of resistor RIN. This current is conducted through a MOS N-channel transistor (MN0) 526 to the current mirror 520. The current mirror 520 includes P-channel transistors (MP0) 522 and (MP4) 524.

Current from the current mirror 520 feeds the quadripole network 530 which includes P-channel transistors (MP1) 534 and (MP2) 532 and N-channel transistors (MN1) 538 and (MN2) 536. The quadripole network 530 is controlled by NOR gates 552 and 554, which have mutually complementary output states, one gate having a logic 1 value and the other having a logic 0 value, to establish that only one transistor of N-channel transistors (MP1) 534 and (MP2) 532 is conductive at one time. For example, when a logic 0 is applied to the gate of transistor (MP1) 534, the transistor is conductive so that current conducting through P-channel transistor (MP4) 524 charges capacitor C1. The logic 0 also appears at the gate of N-channel transistor (MN1) 538, making the transistor nonconductive. When a logic 0 is applied to the gates of transistors 534 and 538, a logic 1 is simultaneously applied to the gates of transistors 532 and 536 since the output signals of NOR gates 552 and 554 are mutually complementary. Therefore, capacitor C2 is discharging when capacitor C1 is charging. Capacitor C1 charges linearly towards the threshold voltage of inverter 542. When the switching threshold of inverter 542 is exceeded, the logic signal of inverter 546 goes high, charging capacitor CH1 and reinforcing the signal to inverter 542. Positive feedback through capacitor CH1 ensures that the output voltage of inverter 546 goes essentially to the rail of the positive power supply terminal VDD. A suitable voltage transition of inverter 546, assures that the logic signal to NOR gate 552 has a range capable of crossing the threshold of NOR gate 552. As a logic 1 signal is applied to NOR gate 552, the output logic signal of NOR gate 552 goes low.

As capacitor C1 is charged, capacitor C2 is discharged. Thus, as the charge ramp is applied to the input terminal of inverter 542, the input terminal of inverter 544 is held at a logic 0 level and is not ramping. Therefore, the output logic state of inverter 548 is held at a logic 0 level. Once the output logic level of inverter 546 starts to go high due to the charging of capacitor C1, a logic 1 level is applied to the input terminal of NOR gate 552, causing the output terminal of the NOR gate 552 to transition to a logic 0 level. The output terminal of NOR gate 552 is connected to the input terminal of NOR gate 554 so that two logic 0 levels are applied to the input terminal of NOR gate 554, setting the output terminal of NOR gate 554 to a logic 1. This reinforces the original logic 1 level from the output terminal of inverter 546. The change of state in the output logic level of NOR gate 552 to a logic 0 and change of state in the output logic level of NOR gate 554 to a logic 1 is fed back to input terminals of the quadripole network 530 via feedback lines FB1 and FB2. Feedback line FB1 controls the gate of P-channel transistor (MP2) 532 with a logic 0 level so that transistor (MP2) 532 becomes conductive. Thus capacitor C2 is then charged with the linear ramp signal. As capacitor C2 is charged, the output condition of NOR gate 554 is a logic 1, which is applied to the gates of N-channel transistor (MN1) 538 and P-channel transistor (MP1) 534. Accordingly, P-channel transistor (MP1) 534 is turned off and N-channel transistor (MN1) 538 is turned on, discharging capacitor C1. As the voltage across capacitor C1 decreases, the threshold of inverter 542 is crossed. Inventor 546 transitions to a logic 0, reinforcing the discharge of capacitor C1. NOR gates 552 and 554 are cross coupled and, thus, the logic state is held until the output of inverter 548 transitions to a logic 1.

The same process occurs with respect to capacitor C2. When the charge on capacitor C2 crosses the threshold of inverter 544, a logic 1 value is applied to the NOR gate 554 in a repeating oscillatory process. Thus the VCO 480 forms an astable multivibrator in which the current to feed the two capacitors C1 and C2 alternately ramps in a linear manner to the threshold voltage of inverters 542 and 544 respectively.

The period of oscillation of VCO 480 is the time for the current passing through transistor (MP4) 524 to charge the capacitors C1 and C2 to the threshold voltage of inverters 542 and 544 respectively. A very precise timing cycle having nearly a 50% duty cycle is achieved by matching of capacitors C1 and C2 since the same charging current is applied to both capacitors. The frequency of oscillation is set by selection of the resistance RIN and selection of the current mirror ratio of current mirror 520.

The VCO 480 circuit also includes a fault detector 570 which includes NAND gate 578 and P-channel transistor (MP5) 572. In the absence of a fault detector, a fault might occur in case of a logic 1 condition of inverters 546 and 548 which causes application of logic 1 conditions to both input terminals of NOR gates 552 and 554. Thus NOR gates 552 and 554 simultaneously have a logic 0 condition so that both capacitors C1 and C2 charge to a voltage greater than the threshold voltages of inverters 542 and 544. Oscillation of the VCO 480 would therefore stop.

Fault detector 570 prevents such a fault condition by detecting a simultaneous logic 1 input logic level to the NOR gates 552 and 554. The input signals to NOR gates 552 and 554 are applied to the input terminals of NAND gate 578 so that P-channel transistor 572 becomes conductive in case of simultaneous logic 1 levels. When P-channel transistor 572 becomes conductive, it produces a signal on the line to the gates of P-channel transistor (MP1) 534 and N-channel transistor (MN1) 538 causing capacitor C1 to discharge to restore an oscillatory operating condition.

The voltage-controlled oscillator (VCO) 480 has two input terminals, one output terminal and two power supply terminals. The input terminals include a VCO voltage input terminal VIN and a power down input terminal PD. The output terminal is a VCO frequency output terminal VCOOUT to the frequency output line Fout shown in FIG. 4 which produces an output frequency signal having a range from approximately 4 kHz to 4 MHz. The power supply terminals include an analog positive supply terminal VDD and an analog negative power supply terminal VSS. VCO 480 produces an output frequency that is substantially monotonic relative to the input voltage at voltage input terminal VIN. VCO 480 produces an output frequency signal Iout that drives an input frequency signal to the divide-by-N circuit 496. A binary counter of the divide-by-N circuit 496, in turn, drives an input signal to the decode logic 490. The binary counter (divide by N) 496 and decode logic 490 generate digital control timing signals INIT, HOLD, HOLDF, PUMPT, and PUMPF. Detailed descriptions of the counter and decode logic are disclosed hereinafter.

Referring now to FIGS. 7(a) through 7(f), there is shown a schematic block diagram of RC oscillator circuit 600 which improves low power performance. Low power RC oscillator 600, shown in FIG. 7(a) includes a bias circuit 610, a ramp and hold circuit 630, a comparator 650, a charge pump 670, an oscillator 680 and a frequency counter 690. In contrast to the embodiments shown in FIGS. 3 and 4, the ramp and hold circuit 630 uses a bias circuit 610 rather than an operational amplifier to establish the current flowing through a resistor. The "hold" voltage, which is generated by the ramp and hold circuit 630, is applied to the input terminal of a CMOS inverter. The switching threshold of the CMOS inverter is a gate-to-source voltage Vgs of a transistor. If the frequency is low, the hold voltage exceeds Vgs, the comparator 650 drives the charge pump 670 to produce a larger voltage at the input terminal of the oscillator 680 which increases the oscillator frequency. If the frequency is high, the hold voltage decreases to a level below Vgs, the comparator 650 drives the charge pump 670 to produce a smaller voltage at the input terminal of the oscillator 680 which decreases the oscillator frequency.

Figure 7B:
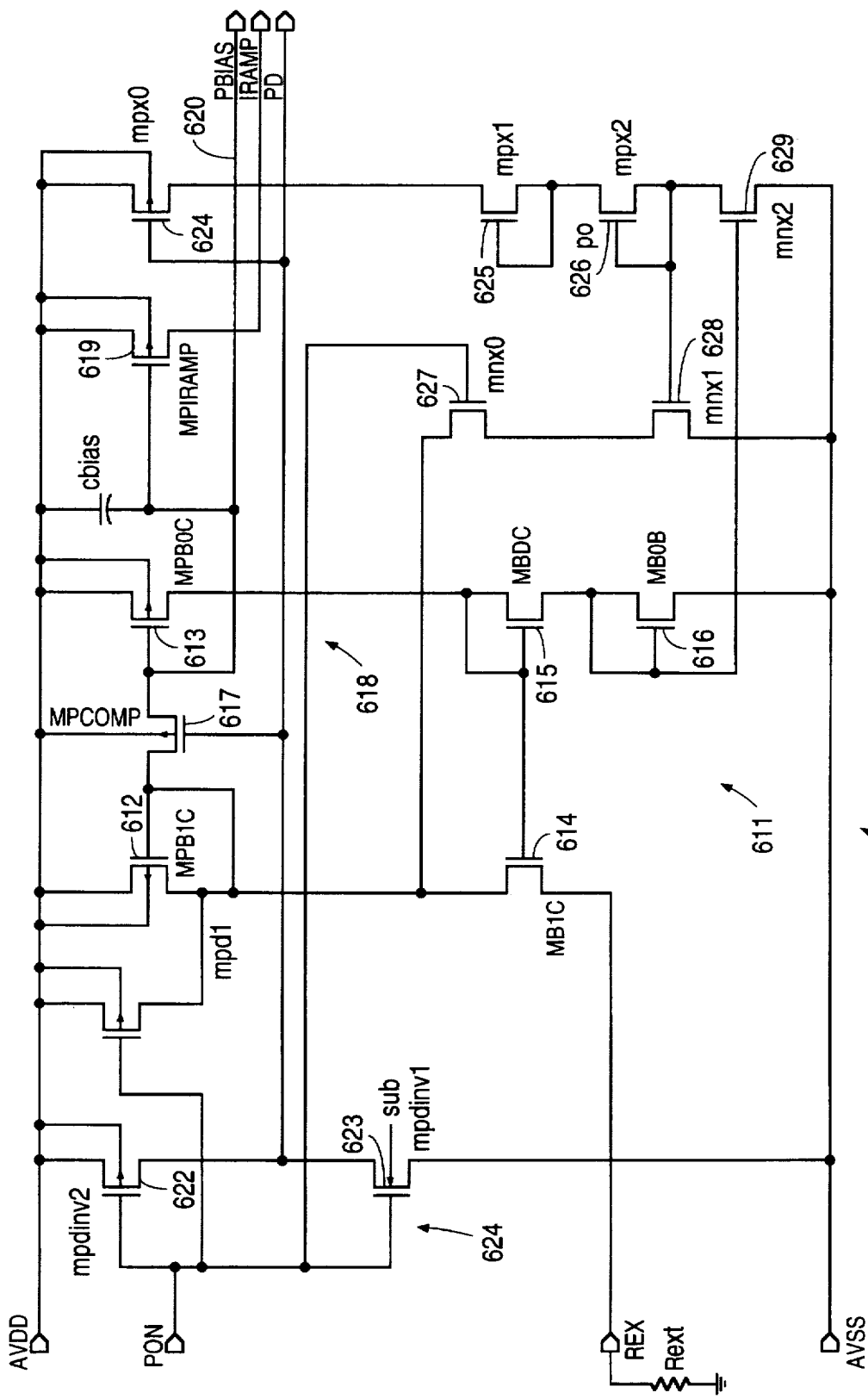

Referring to FIG. 7(b), the bias circuit 610 functions in a manner which is similar to that of bias circuit 410, shown in FIG. 4. In particular, bias circuit 610 has a bias structure 611 including P-channel MOS transistors (MPB1C) 612 and (MPB0C) 613 and N-channel MOS transistors (MB1C) 614, (MB0C) 615 and (MB0B) 616. Bias structure 611 generates a voltage across external resistor Rext, which is substantially equal to the gate-to-source voltage $V_{GS}$ of the N-channel MOS transistor (MB0B) 616, as the N-channel MOS transistors (MB0B) 616 and (MB0C) 615 raise the voltage two gate-to-source voltages from a ground reference source VSS and the N-channel MOS transistor (MB1C) 614 drops the voltage one voltage $V_{GS}$. A current mirror is formed by diode-connected P-channel MOS transistor (MPB1C) 612 and P-channel MOS transistor (MPB0C) 613. The drain current of MOS transistor 614 becomes Vgs/Rext. This drain current is mirrored by P-channel MOS transistors (MPBIC) 612 and (MPB0C) 613, which, in turn, furnishes drain current to N-channel MOS transistors (MB0C) 615 and (MB0B) 616. MOS transistors (mpx1) 625, (mpx2) 626, (mnx0) 627, (mnx1) 628, and (mnx2) 629 supply a start-up current to the chain of P-channel MOS transistor (MPBIC) 612. The start-up current generated at the drain of MOS transistor (mnx1) 628 is turned off when the bias voltage VGS exceeds the threshold of MOS transistor (mnx2) 629.

In addition to the transistors of bias structure 611 which furnish a functionality which is similar to that of bias circuit 410, the bias circuit 610 also includes a common P-bias line P-channel MOS transistor (MPCOMP) 617, forming a source-drain path between the gate of P-channel MOS transistor (MPB1C) 612 and a P-bias line 620, and a bias capacitor CBIAS. The gate of the P-bias line P-channel transistor (MPCOMP) 617 is shown connected to a common drain connection of inverter P-channel MOS transistor 622 and inverter N-channel MOS transistor 623 of an inverter 621. The inverter 621 furnishes a static potential that causes activation of P-bias line P-channel transistor (MPCOMP) 617. In other embodiments, the gate of P-bias line P-channel transistor (MPCOMP) 617 is connected to other static potential sources such as the power supply source VDD or the ground reference VSS. The P-bias line P-channel transistor (MPCOMP) 617 is configured as half a transmission gate which isolates the diode-connected P-channel MOS transistor (MPB1C) 612 from other MOS transistors connected to the P-bias line 620, including a P-channel MOS transistor (MP1) 652 of comparator 650 and a P-channel MOS transistor (MP4) 602 shown in FIG. 7(a). The P-bias line P-channel MOS transistor (MPCOMP) 617 acts as a large-valued resistor, having a resistance which increases as the transistor length dimension (L) is increased and width dimension (W) is decreased. Thus, P-bias line P-channel MOS transistor (MPCOMP) 617 serves as a resistor between the gate and drain connection of P-channel MOS transistor (MPB1C) 612 and the common gate connection of P-channel MOS transistor (MPB0C) 613 and a ramp N-channel MOS transistor (MP1RAMP) 619. The bias capacitor CBIAS is connected between the P-bias line 620 and the power supply source VDD. The common P-bias line P-channel MOS transistor (MPCOMP) 617 and bias capacitor CBIAS form a low-pass RC filter 618 which performs three functions.

First, the low-pass RC filter 618 increases the stability of the bias structure 611 to counteract any parasitic capacitance that occurs across the external resistor Rext. The external resistor Rext may have an excessive amount of parasitic capacitance which forms a relaxation oscillator at some critical value of capacitance and tends to reduce the stability of the bias structure 611. Low-pass RC filter 618 suppresses oscillation of the bias structure 611.

Second, although a unity DC gain is an advantage of the bias circuit 610, stability is further improved by reducing AC gain below unity. Therefore, the P-bias line 620 is a common gate connection among MOS transistors in the forward path of the bias circuit 610 and has the same DC potential as the gate of the diode-connected P-channel MOS transistor (MPB1C) 612 but is attenuated with respect to AC characteristics due to the resistance of common P-bias line P-channel MOS transistor (MPCOMP) 617 and the capacitance of bias capacitor CBIAS. Thus, the AC gain of the bias circuit 610 is attenuated to improve stability as larger values of capacitance are placed across the external resistor Rext.

Third, the bias capacitor CBIAS furnishes a relatively large capacitance which serves as a noise reduction capacitor for stray noise that couples onto the P-bias line 620, overpowering any parasitic or packaging coupling capacitance with the larger bias capacitor CBIAS.

Referring again to FIG. 7(a), comparator 650 includes the P-channel MOS transistor (MP1) 652, an N-channel MOS transistor (MN1) 654, a first inverter 656 and a second inverter 658. P-channel MOS transistor (MP1) 652 has a source connected to the power supply source VDD, a drain connected to a drain node cmp0 and a gate controlled by the P-bias line 620. N-channel MOS transistor (MN1) 654 has a source connected to the ground reference VSS, a drain connected to the drain node cmp0 and a gate controlled by the ramp and hold circuit 630. A signal on the drain node cmp0 is applied to the input terminal of the first inverter 656 and passes through second inverter 658. The two inverters 656 and 658 supply more gain to comparator 650. P-channel MOS transistor (MP1) 652 and P-channel transistors (MPB1C) 612 and (MPB0C) 613 of bias circuit 610 are all matched, having current mirror ratios of 1:1.

Figure 7C:
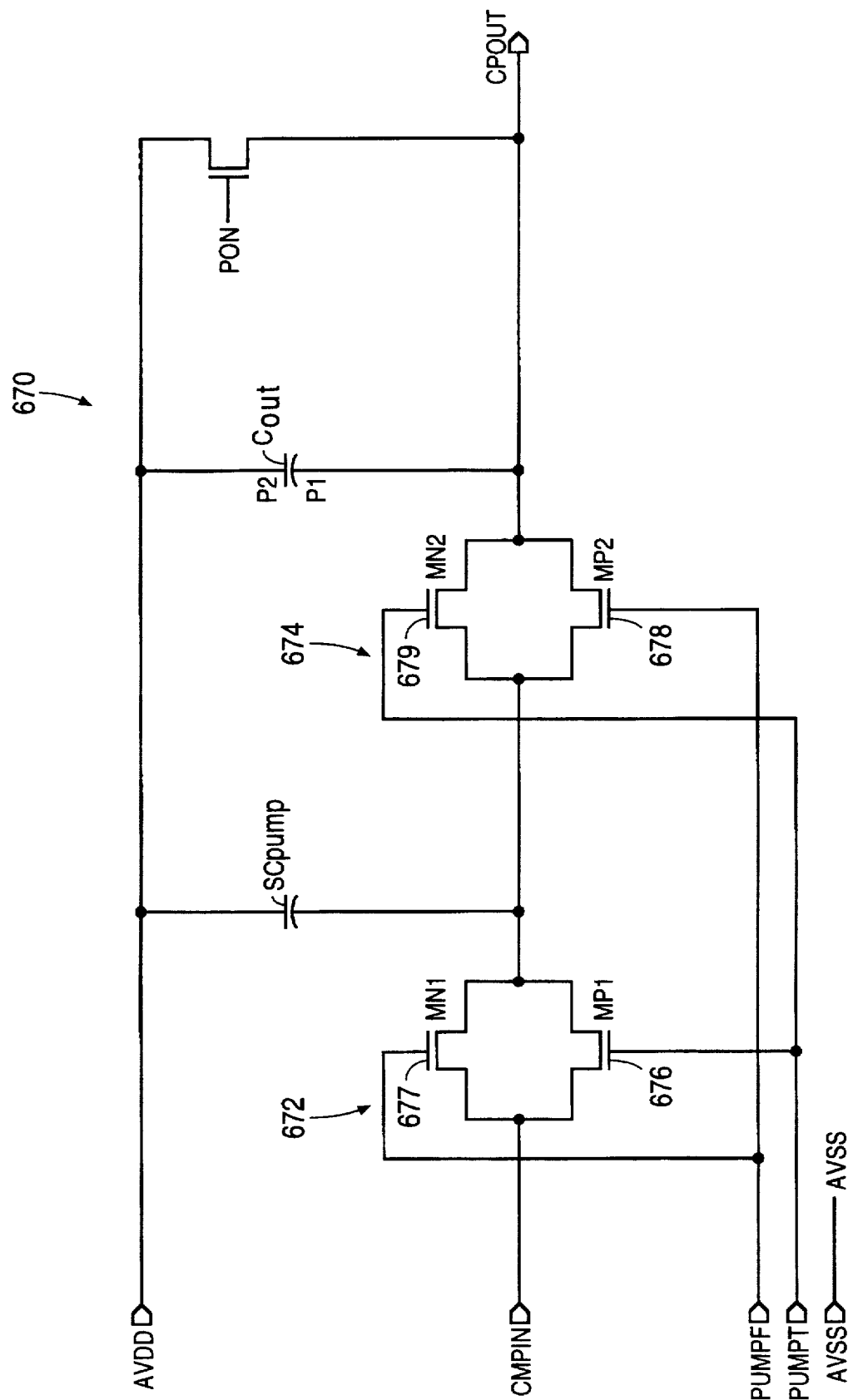

Referring now to FIG. 7(c), RC oscillator 600 utilizes a switched capacitor charge pump 670 which includes two transfer gates 672 and 674 and two capacitors—a charge pump capacitor Cpump and a output capacitor $C_{out}$. First transfer gate 672 includes P-channel MOS transistor 676 and an N-channel MOS transistor 677. P-channel MOS transistor 676 has a source connected to an input signal from comparator 650, a drain connected to the second transfer gate 674 and a gate controlled by a pump true PUMPT signal. N-channel MOS transistor 677 has a source to drain pathway connected across P-channel transistor 676 and a gate controlled by a pump false PUMPF signal. The charge pump capacitor Cpump is connected on one side between the first and second transfer gates 672 and 674 and connected on the other side to the power supply source VDD. Second transfer gate 674 includes P-channel MOS transistor 678 and an N-channel MOS transistor 679. P-channel MOS transistor 678 has a source connected to the first transfer gate 672, a drain supplying the charge pump output signal CPOUT and a gate controlled by a pump false PUMPF signal. N-channel MOS transistor 679 has a source to drain pathway connected across P-channel transistor 678 and a gate controlled by a pump true PUMPT signal. The output capacitor $C_{out}$ is connected on one side to the charge pump output line CPOUT and connected on the other side to the power supply source VDD. In an alternative embodiment, capacitors Cpump and $C_{out}$ are connected to the ground reference VSS rather than to the power supply reference Vdd.

The first transfer gate 672 charges the charge pump capacitor Cpump to either VDD or VSS under control of the control signal output from the second inverter 658 of comparator 650. Charge pump capacitor Cpump is charged substantially to the rail of either VDD or VSS due to the high gain supplied by inverters 656 and 658. Switched capacitor charge pump 670 receives the output voltage of comparator 650 and precharges the pump capacitor Cpump close to VDD or VSS voltage during a first pump signal phase when PUMPF signal is high and PUMPT signal is low. Charge pump 670 receives the PUMPF and PUMPT signals from a frequency counter 690. In a second pump signal phase, PUMPF is low and PUMPT is high and the logic 1 or logic 0 output voltage of comparator 650 is disconnected from charge pump capacitor Cpump while the second transfer gate 674 is reconnected and the charge from charge pump capacitor Cpump is dumped to output capacitor $C_{out}$ to set the charge pump voltage to either a high level VDD or a low level VSS. Output capacitor $C_{out}$ is a larger capacitor than charge pump capacitor Cpump. Output capacitor $C_{out}$ is charged to a voltage which is applied to drive oscillator 680. Thus a small quantum step of voltage, the step size being determined by the size ratio of capacitor Cpump to capacitor $C_{out}$. For example, in one embodiment the Cpump capacitor has a capacitance of 1% of the charge pump output capacitance Cout. It is advantageous that the quantum step size is determined by the ratio of capacitances. In the charge pump circuit 470 shown in FIG. 4 the quantum step is set by the drain current of charge pump current source P-channel MOS transistor (P9) 471, which depends on the dimensions of charge pump transistor (P9) 471, a parameter which is more difficult to control than capacitor sizing.

This transfer gate implementation permits the RC oscillator 600 to operate at a very low power supply voltage because the transfer gates 672 and 674 use less voltage to switch charge than does the differential switch in charge pump 470 to make pump true and pump false P-channel MOS transistors 676 and 678 turn on and off.

Transistors 676, 677, 678 and 679 are small transistors because they are used for merely transferring charge from capacitor Cpump to capacitor $C_{out}$ and not for supplying gain. Typically, the first pump signal phase exists much longer than the second pump signal phase (for example, 31 to 1) so that most of the cycle is used for precharging the charge pump capacitor Cpump.

The switched capacitor charge pump 670 thus is a capacitive voltage divider from the power supply source VDD to the ground reference VSS. Switched capacitor charge pump 670 is preferential for high temperature operation because leakage arises only with respect to two transistors—the transistors that form the second transfer gate 674. Also, small transistors are utilized and thus junction leakage at high temperatures is correspondingly less. In a charge pump embodiment such as charge pump circuit 470 shown in FIG. 4, which does not utilize transfer gates, transistors are necessarily larger and leakage of the transistors causes drift to occur on the pump voltage stored on the charge pump capacitor Cpump. This voltage drift produces frequency changes during the ramp interval, introducing error in the self-calibration process.

Figures 1, 7D:
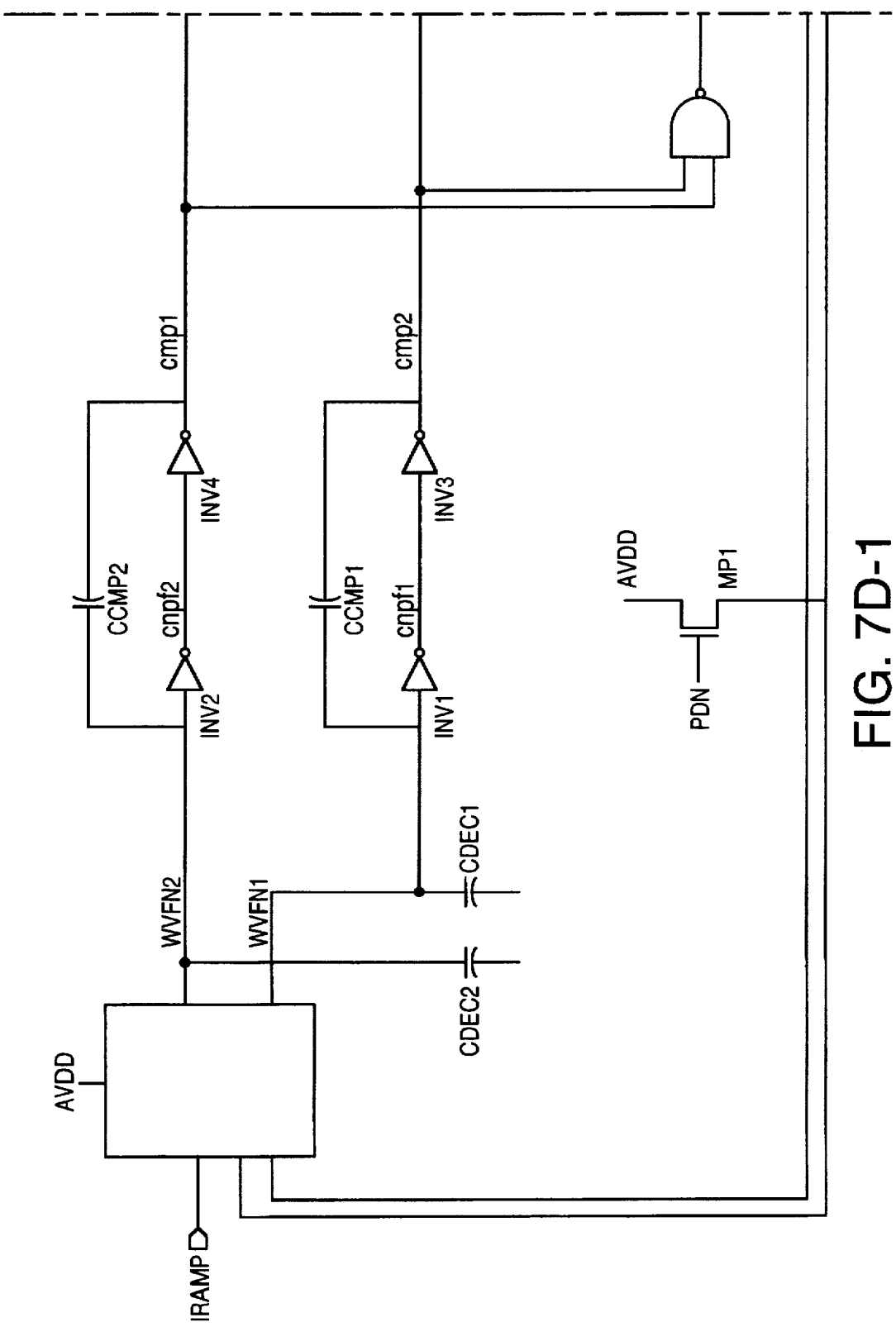
Figures 2, 7D:
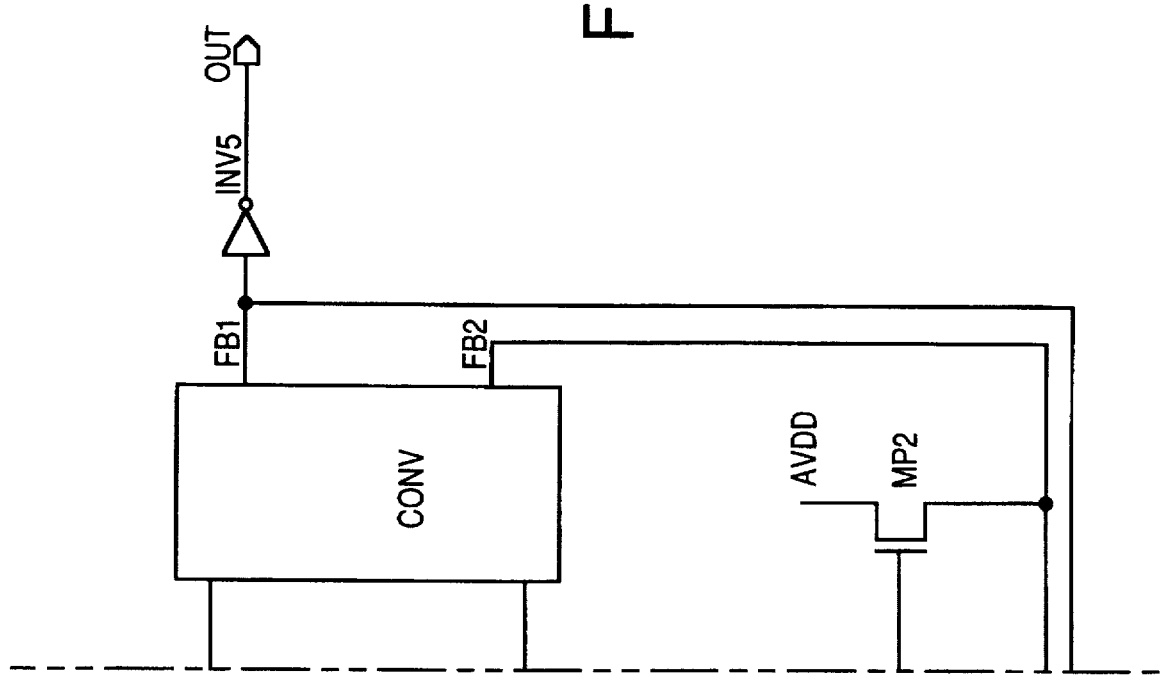

Referring again to FIG. 7(a), the signal on the charge pump output line CPOUT is applied to the gate of P-channel MOS transistor (MP3) 604 to control the current passing through the source to drain pathway from power supply source VDD to a ramp input signal IRAMP of oscillator 680. Referring to FIG. 7(d), a schematic circuit diagram of an oscillator 680 is shown. Oscillator 680 is similar to the VCO 480 shown in FIG. 6 except that the oscillator 680 is generally simplified by removing a voltage-to-current converter and a current mirror, neither of which is utilized since the oscillator 680 receives a current directly from P-channel MOS transistor (MP3) 604. In accordance with the operation of the switched capacitor charge pump circuit 670 described hereinbefore relating to FIG. 7(c), the current passed to oscillator 680 through P-channel MOS transistor (MP3) 604 is adjusted by the switched capacitor charge pump circuit 670 to produce the amount of current for driving the oscillator 680 to oscillate at a selected frequency. Elimination of the voltage-to-current converter and current mirror results in a nonlinear but monotonic transfer characteristic between the charge pump 670 and the frequency of the oscillator 680. However, this nonlinear characteristic does not impair performance if the capacitor ratio of $C_{pump}$ to $C_{out}$ is sufficiently small.

The ramp input signal IRAMP of oscillator 680 is also supplied by a current passing through the source to drain pathway of P-channel MOS transistor (MP4) 602 from power supply source VDD under control of the P-bias line 620 from the bias circuit 610. P-channel MOS transistor (MP4) 602 supplies a relatively small amount of current to activate the oscillator 680 when power is first applied to the RC oscillator 600. Transistor 602 is necessary to guarantee a minimum frequency, because if the voltage on CPOUT is close to VDD, the frequency of oscillator 680 is zero. Then the overall circuit remains in lockup.

Figure 7E:
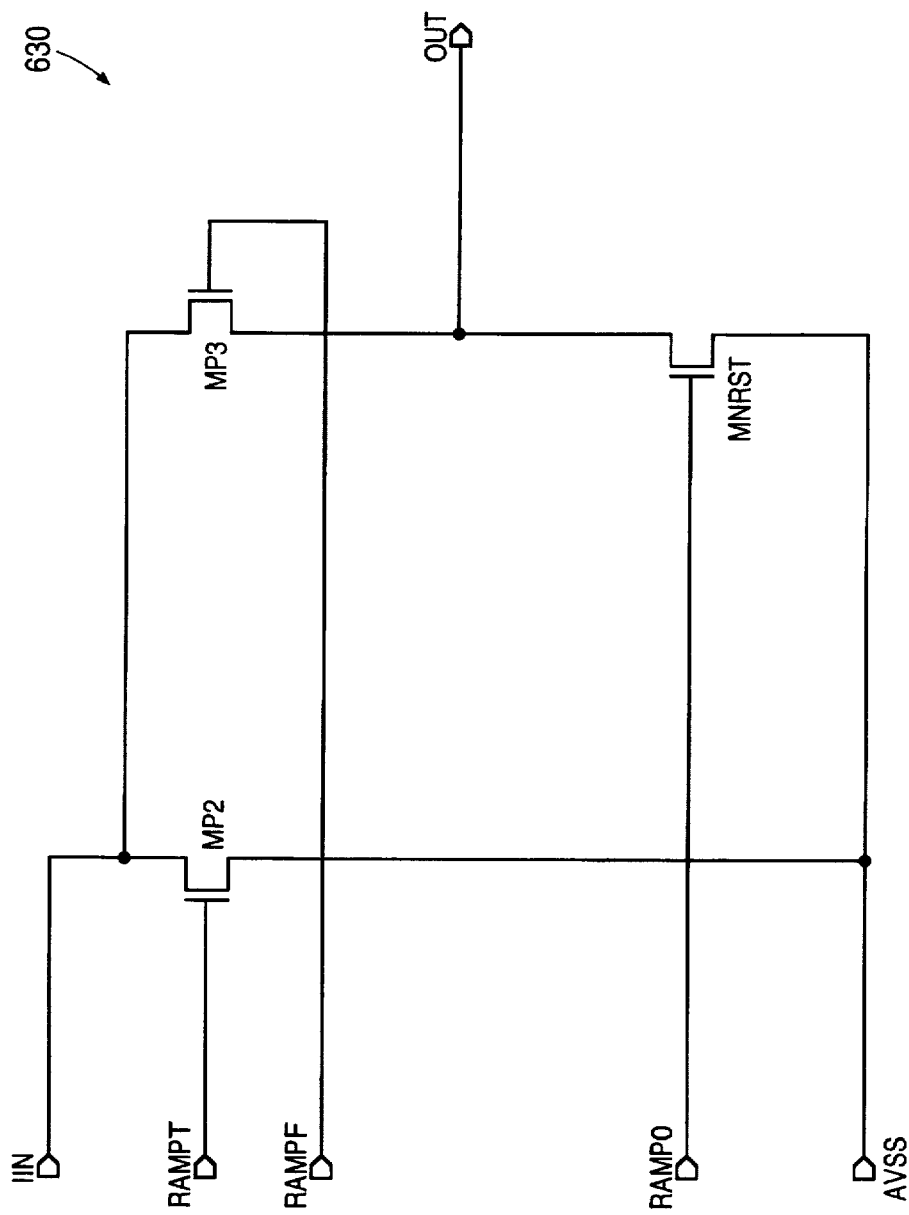

Referring to FIG. 7(e), there is shown a current-steering ramp and hold circuit 630 which is substantially equivalent in structure and function to the ramp and hold circuit shown in FIG. 4. The ramp and hold circuit 630 advantageously extends over only a small area.

Figures 1, 7F:
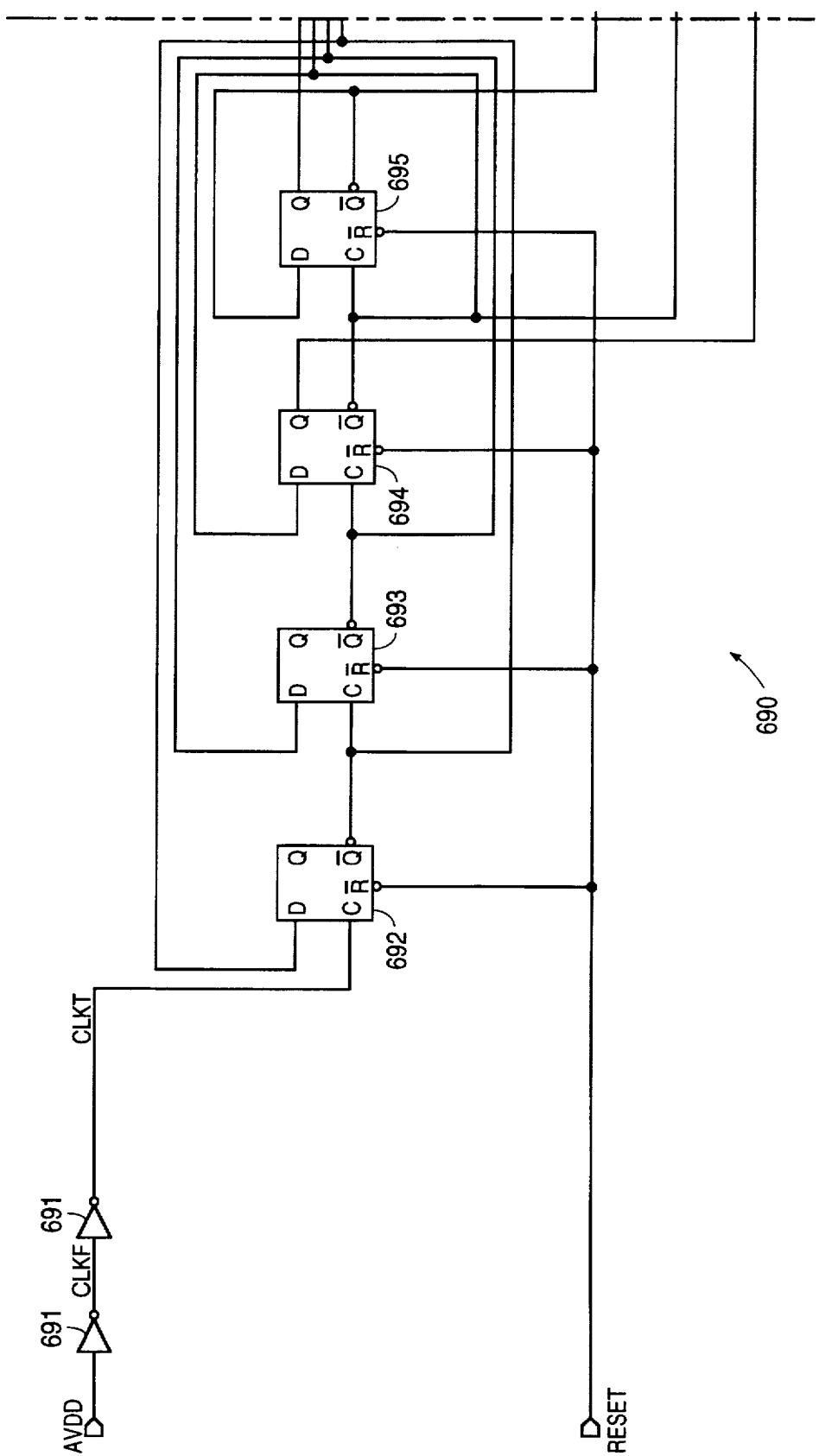

In FIG. 7(f), frequency counter 690 is a 16-count nonsynchronous (ripple) counter which includes two input inverters 691, four D-type flip-flops 692, 693, 694 and 695, a four-input NOR gate 696, and five output inverters 697.

An input clock signal on clock signal line CLKIN is applied from the oscillator 680 sequentially through the two input inverters 691 to double buffer the clock signal, thereby squaring the edges of the signal. The squared clock signal is applied to a C-input terminal of a first D flip-flop 692. First D flip-flop 692 also has a $\overline{Q}$-output terminal and a D-input terminal which is connected to the $\overline{Q}$-output terminal in a typical toggle flip-flop configuration so that on every positive edge of the squared clock signal, the first D flip-flop 692 changes state. Each succeeding D flip-flop 693, 694 and then 695 is similarly interconnected so that the C-input terminal is connected to the $\overline{Q}$-output terminal of the immediately preceding D flip-flop and the D input-terminal and $\overline{Q}$-output terminal of each D flip-flop are interconnected. Configured in this manner, the frequency counter 690 generates a first stage clock signal at a frequency of half the input clock signal frequency, a second stage clock signal at a frequency of one-quarter the input clock signal frequency, a third stage clock signal at a frequency of one-eighth the input clock signal frequency and a fourth stage clock signal at a frequency of one-sixteenth the input clock signal frequency. The complementary Q and $\overline{Q}$ output terminals of the third D flip-flop 694 are connected to output inverters 697 to respectively generate a ramp false signal on RAMPF line and a ramp true signal on RAMP line. The $\overline{Q}$ output terminal of the fourth D flip-flop 695 is connected to an output inverter 697 to generate a capacitor discharge signal on RAMP0 line. NOR gate 696 receives an output signal from each of the D flip-flops 692, 693, 694 and 695. In the embodiment illustrated in FIG. 7(f), the $\overline{Q}$-output terminals of D flip-flops 692, 693 and 694 and the Q-output terminal of D flip-flop 695 are applied to the four-input NOR gate 696. The connection of D flip-flop output terminals is generally arbitrary so that any selected state of the four D flip-flops may be used to activate the pump true signal on PUMPT line and the pump signal on PUMPF line. The output line of the four-input NOR gate 696 is applied to a first output inverter 697 to generate the pump false signal on PUMPF line. The pump false signal on the PUMPF line is applied to a second output inverter 697 to generate the pump true signal on PUMPT line. The number of D flip-flops in the counter determines the duty cycle of the pump true and pump false signals so that an increased number of D flip-flops furnishes a shorter pump interval. A short pump signal duty cycle allows better resolution of parameter measuring and reading times so that the pump capacitor is not charging while it is read. Low resolution of measuring and reading cause a risk of oscillator instability due to operation in a continuous time feedback loop.

In general, the number of D flip-flops utilized in a frequency counter is determined according to timing constraints of particular circuit element embodiments of an RC oscillator. Various RC oscillator embodiments include different combinations of digital and analog elements. Typically, analog operations are performed at low frequency to improve accuracy and digital operations are performed at a high frequency to extend operation of the loop to high frequencies. Additional D flip-flops are used to increase precision of timing interval resolution. Although, the frequency counter 690 is depicted as a non-synchronous (ripple) counter other suitable frequency counter embodiments employ a synchronous counter.

Referring to FIGS. 8(a) through 8(g), there is shown a schematic block diagram of a digitally-tuned oscillator circuit 702, which includes an RC oscillator circuit 700 and a capacitor digital to analog converter (DAC) 704.

Figure 8A:
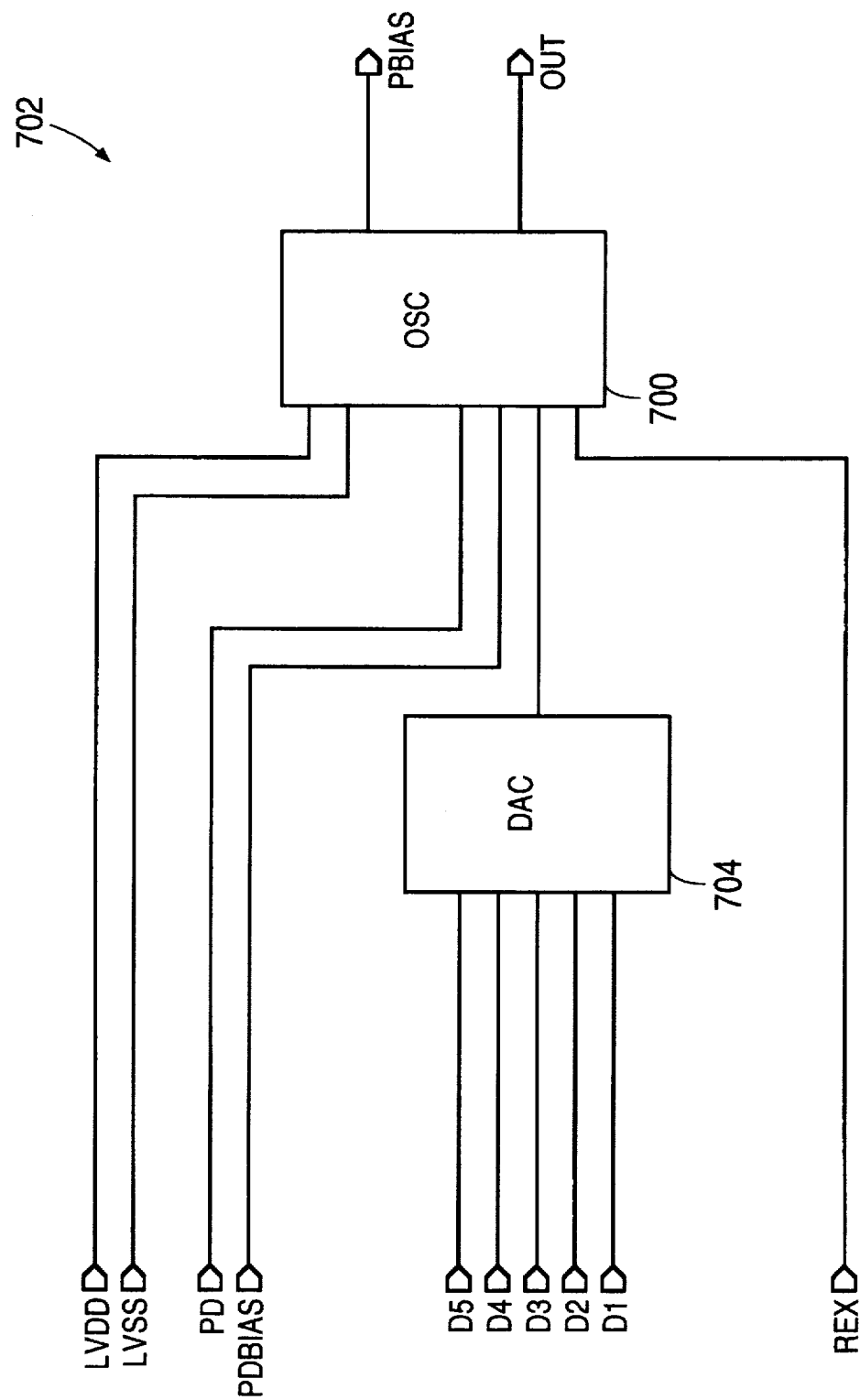
Figures 1, 8B:
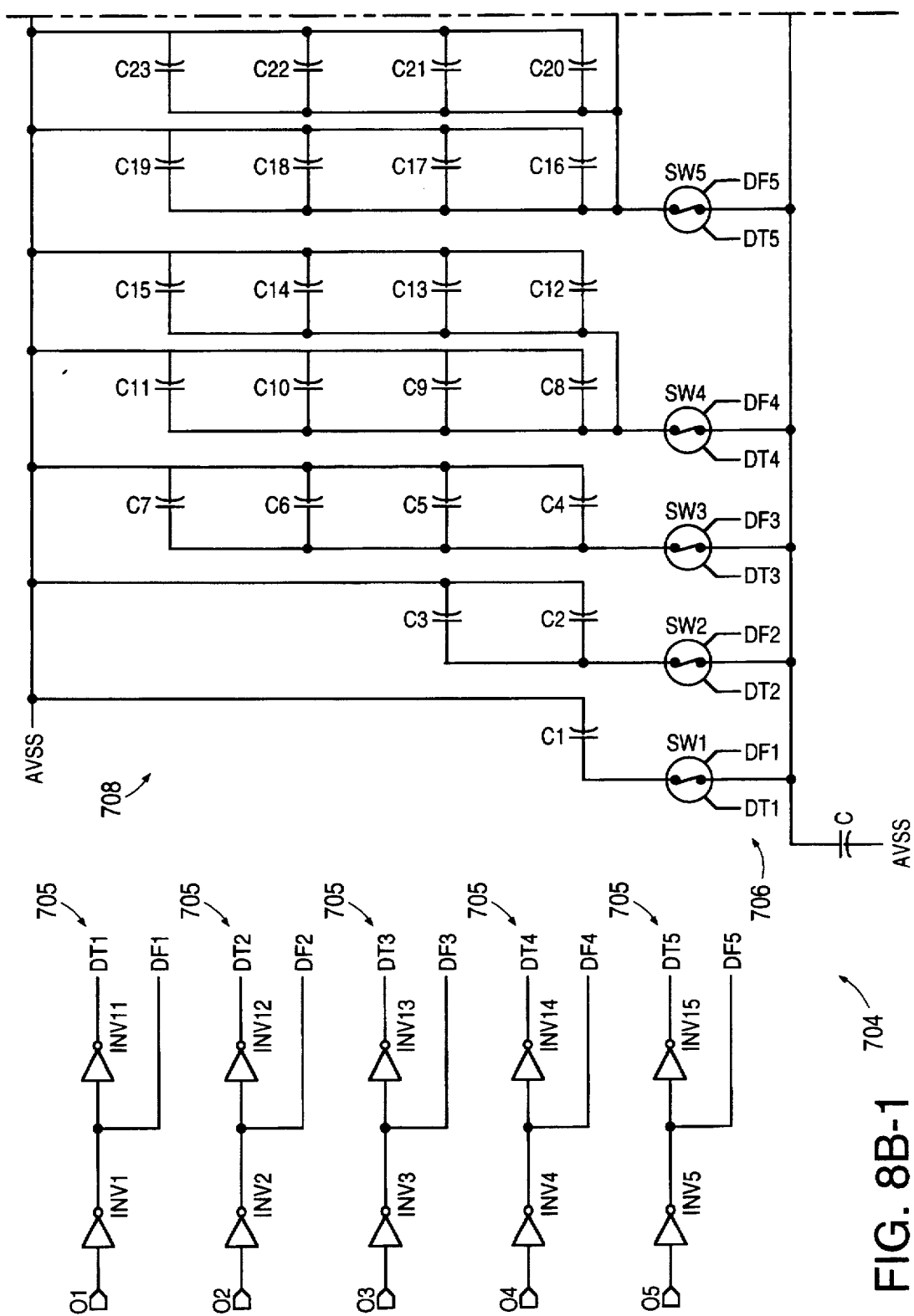

The capacitor DAC 704 shown in FIG. 8(b) includes five digital data input lines D1–D5, five pairs of serially-connected inverters 705, five switches 706 receiving signals from the inverter pairs and a binary array of capacitors 708. Each digital data input line is connected to a pair of serially-connected inverters so that each of the digital data input lines D1–D5 is double buffered. Complementary signals for each digital data input line are furnished at a "true" signal output terminal connected following the second inverter of the pair of inverters and at a "false" signal output terminal connected following the first inverter of the pair. A first pair of serially-connected inverters 705 applies complementary binary control signals to a first switch which connects a first capacitor array of one capacitor unit between a DAC output terminal DACOUT and a ground reference VSS. A second pair of serially-connected inverters 705 applies complementary binary control signals to a second switch which connects a second capacitor array of two capacitor units, between the DAC output terminal DACOUT and ground reference VSS. Similarly, a third pair of inverters 705 connects a third array of four capacitor units, a fourth pair of inverters connects a fourth array of eight capacitor units, and a fifth pair of inverters connects a fifth array of sixteen capacitor units. In addition an additional capacitor CMIN is connected between VSS and DACOUT to furnish a minimum capacitance when no switches are closed. Capacitor CMIN sets the maximum frequency of the digitally-tuned oscillator 702 and additional capacitors 708 are switched into the capacitor DAC circuit 704 by switches 706 to increase the capacitance and decrease the operating frequency of the digitally-tuned oscillator 702. Each switch includes a P-channel transistor and an N-channel transistor connected on a transfer gate.

Figures 1, 8C:
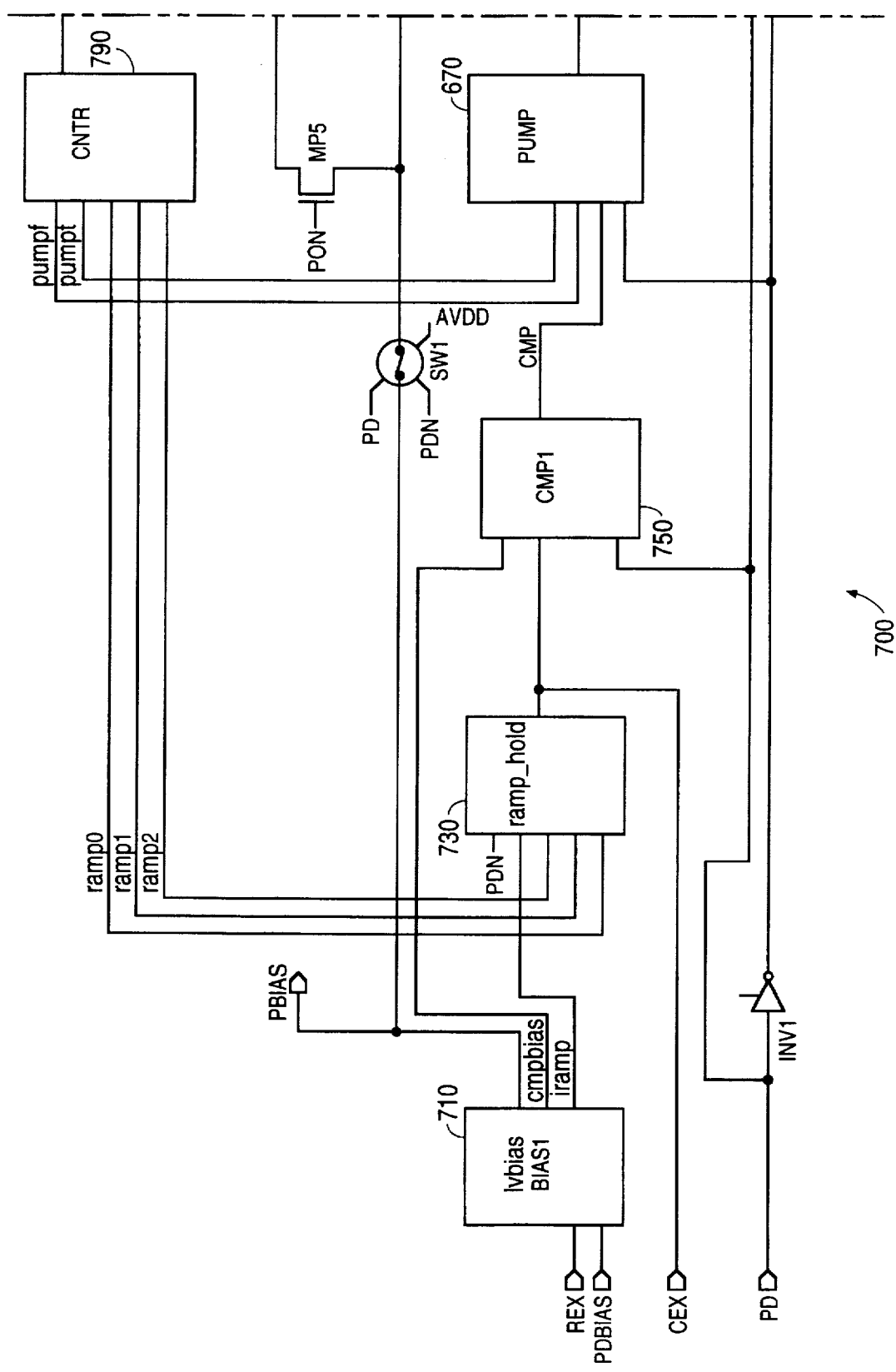

RC oscillator circuit 700, shown in FIG. 8(c) includes a low voltage bias circuit 710, a ramp and hold circuit 730, a comparator 750, a charge pump 670, an oscillator 680 and a frequency counter 790. The low voltage bias circuit 710 is a special low voltage bias circuit which generates a bias current in a substantially similar manner to that of the bias circuit 610 shown in FIG. 7(b) and makes this bias current sensitive to an external resistor Rext. The bias circuit 710 provides two bias voltages, a CMP bias for the comparative and a P-bias for all other functions. The transfer-gate based ramp and hold circuit 730 differs from the current-steering ramp and hold circuit 630 shown in FIG. 7(e) and utilizes full transfer gates, which operate with less power supply voltage than a ramp and hold using a differential current switch. This transfer gate implementation reduces some of the error introduced by charge injection in the circuit. The charge pump 670, oscillator 680 and P-channel MOS transistors (MP4) 602 and (MP3) 604 of the RC oscillator circuit 600 of FIGS. 7(a) through 7(f) are sufficiently low-voltage circuits without modification and, thus are duplicated in the digitally-tuned oscillator 702.

Figure 8D:
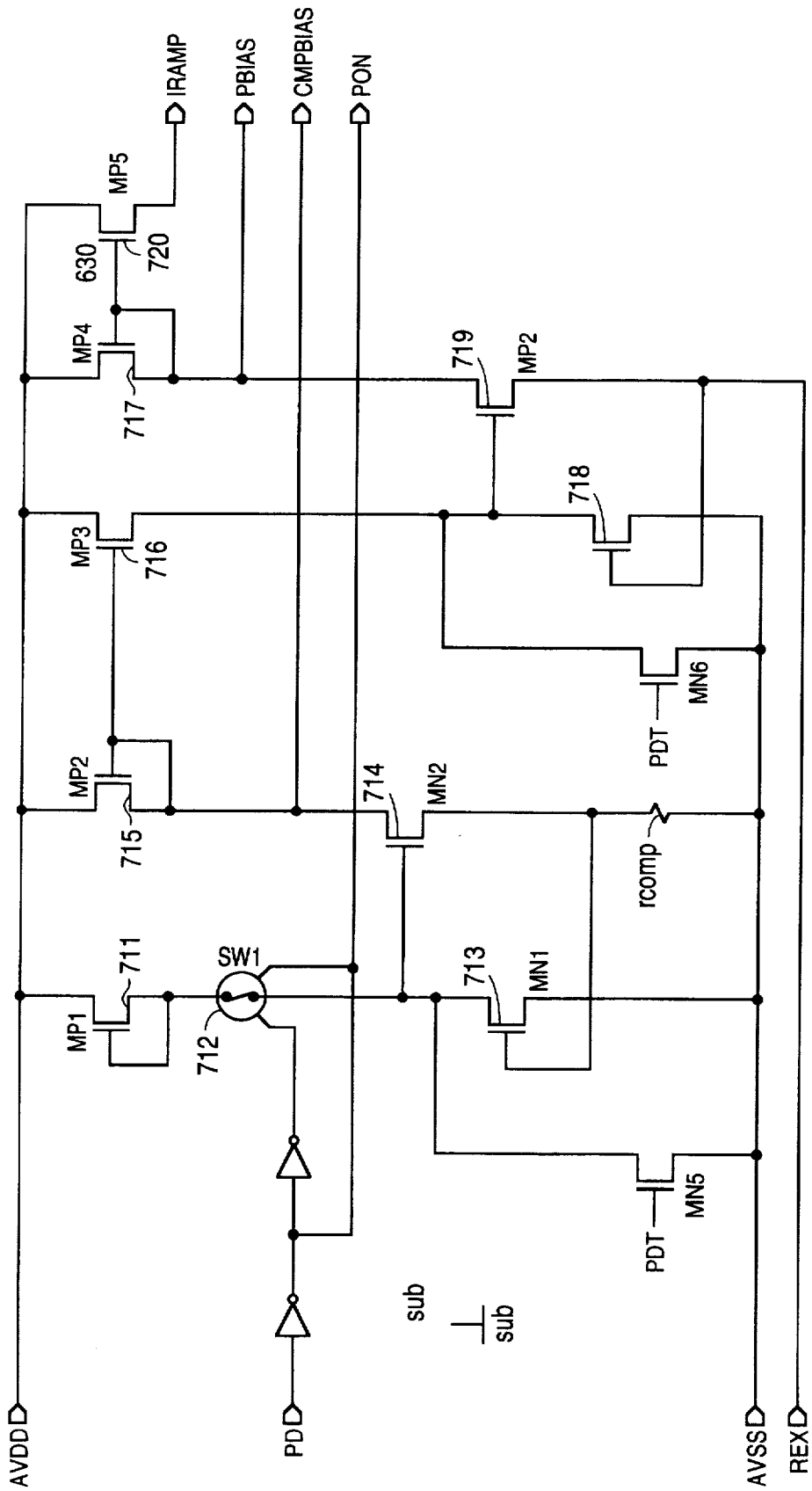

Referring to FIG. 8(d), the low voltage bias circuit 710 is similar to the bias circuit 610 in function and structure but includes modifications to improve performance in low voltage operations. A P-channel MOS transistor (MP1) 711 is a diode-connected field effect transistor (FET) and thus typically produces a non-linear current/voltage characteristic. Transistor (MP1) 711 has long gate length and a narrow gate width, causing a reduction in the amount of current produced so that a small current is generated for a voltage applied to the gate. Thus, transistor (MP1) 711 functions as a resistor but advantageously does not require the large area of a resistor. The small current generated by the P-channel MOS transistor (MP1) 711 passes through a transfer gate 712 to charge the drain capacitance of an N-channel MOS transistor (MN1) 713 and the gate to source capacitance of an N-channel MOS transistor (MN2) 714.

N-channel MOS transistor (MN1) 713 has a gate terminal that is connected to ground reference VSS through a resistor RCMP and therefore is initially turned off. As the drain capacitance of N-channel MOS transistor (MN1) 713 is charged, the transistor remains off but the drain voltage increases. Similarly, as the gate to source capacitance of N-channel MOS transistor (MN2) 714 is charged, the transistor turns on and the gate to source voltage increases so that transistor (MN2) 714 forms a source follower which raises the voltage on resistor RCMP. The voltage across resistor RCMP increases until an equilibrium condition arises in which the drain current on transistor (MN1) 713 is equal to the drain current of P-channel MOS transistor (MP1) 711. An equilibrium condition is achieved since any current imbalance continues to charge or discharge the gate of MOS device (MN2) 714 until equilibrium occurs.

Thus, a steady state DC voltage is formed across resistor RCMP having a magnitude substantially equal to the gate to source voltage of N-channel MOS transistor (MN1) 713 that arises when the drain current from P-channel MOS transistor (MP1) 711 passes through the source to drain pathway of N-channel MOS transistor (MN1) 713. The magnitude of this DC voltage is typically above threshold of the transistor (MN1) 713.

When the steady-state voltage across resistor RCMP becomes greater than the threshold voltage of transistor (MN1) 713, then a current passes through resistor RCMP. That current necessarily arises from a P-channel MOS transistor (MP2) 715 which provides the only DC current path to resistor RCMP. The magnitude of the current passing through resistor RCMP is determined by the threshold voltage of transistor (MN1) 713 and the amount of gate drive sufficient to sink the current from P-channel MOS transistor (MP1) 711. Thus the voltage across resistor RCMP is equal to the gate to source voltage of transistor (MN1) 713 and the current through resistor RCMP is passed to transistor (MP2) 715. A current mirror is formed by a P-channel MOS transistor (MP3) 716 and transistor (MP2) 715.

An arrangement of transistors including P-channel MOS transistors (MP3) 716 and (MP4) 717 and N-channel MOS transistors (MN3) 718 and (MN4) 719 is substantially the same in structure and function as the transistor structure of P-channel MOS transistors (MP1) 711 and (MP2) 715 and N-channel MOS transistors (MN1) 713 and (MN2) 714 except that the source of N-channel MOS transistor (MN2) 714 is connected to on-chip resistor RCMP while the source of N-channel MOS transistor (MN4) 719 is connected to external resistor Rext which sets the frequency of the RC oscillator 700.

N-channel MOS transistor (MN3) 718 operates in a steady-state in substantially the same manner as transistor (MN1) 713 so that the gate to source voltage of N-channel MOS transistor (MN3) 718 reaches a magnitude, typically slightly above threshold, which is sufficient to activate N-channel MOS transistor (MN3) 718 and to sink the current coming from P-channel MOS transistor (MP3) 716. A steady-state current flows through P-channel MOS transistor (MP3) 716 and N-channel MOS transistor (MN3) 718 also in a self-biasing arrangement. The gate voltage of N-channel MOS transistor (MN4) 719 continues to charge until the drain current of N-channel MOS transistor (MN3) 718 is substantially equal to the drain current of P-channel MOS transistor (MP3) 716. The voltage across external resistor Rext is slightly greater than the threshold of N-channel MOS transistor (MN3) 718. The voltage across external resistor Rext is equal to the gate to source voltage of transistor (MN3) 718 and the current through external resistor Rext is passed to transistor (MP4) 717. A current mirror is formed by a P-channel MOS transistor (MP5) 720 and transistor (MP4) 717.

P-channel MOS transistor (MP5) 720 generates a ramp current IRAMP which is proportional to the current passing through P-channel MOS transistor (MP4) 717. The proportionality ratio of the current depends on the sizes of the transistors (MP4) 717 and (MP5) 720. In one embodiment, the gate width of transistor (MP4) 717 is 160 microns and the gate width of transistor (MP5) 720 is 20, so that the current mirror is an 8:1 attenuating current mirror and the ramp current IRAMP is divided by 8. Ramp current IRAMP is connected to the ramp and hold circuit 730, which is modified for low voltage operation as compared to ramp and hold circuits described hereinbefore. Low voltage bias circuit 710 also generates a comparator bias signal on a CMPBIAS line, which is connected to the comparator 750. The comparator bias signal is supplied at a node connecting the common drain terminals of P-channel MOS transistor (MP2) 715 and N-channel MOS transistor (MN2) 714.

Low voltage bias circuit 710 is inherently lower in operating voltage than the bias circuit 610 shown in FIG. 7(b). However, this improvement is achieved at the cost of duplicating some circuitry. The low operating voltage is useful in battery-powered laptop computer applications where a very low current draw is advantageous. The low operating voltage is also useful in systems using submicron CMOS integrated circuits which must use supply voltage of 3 V or less to avoid hot carrier degradation.

Figure 8E:
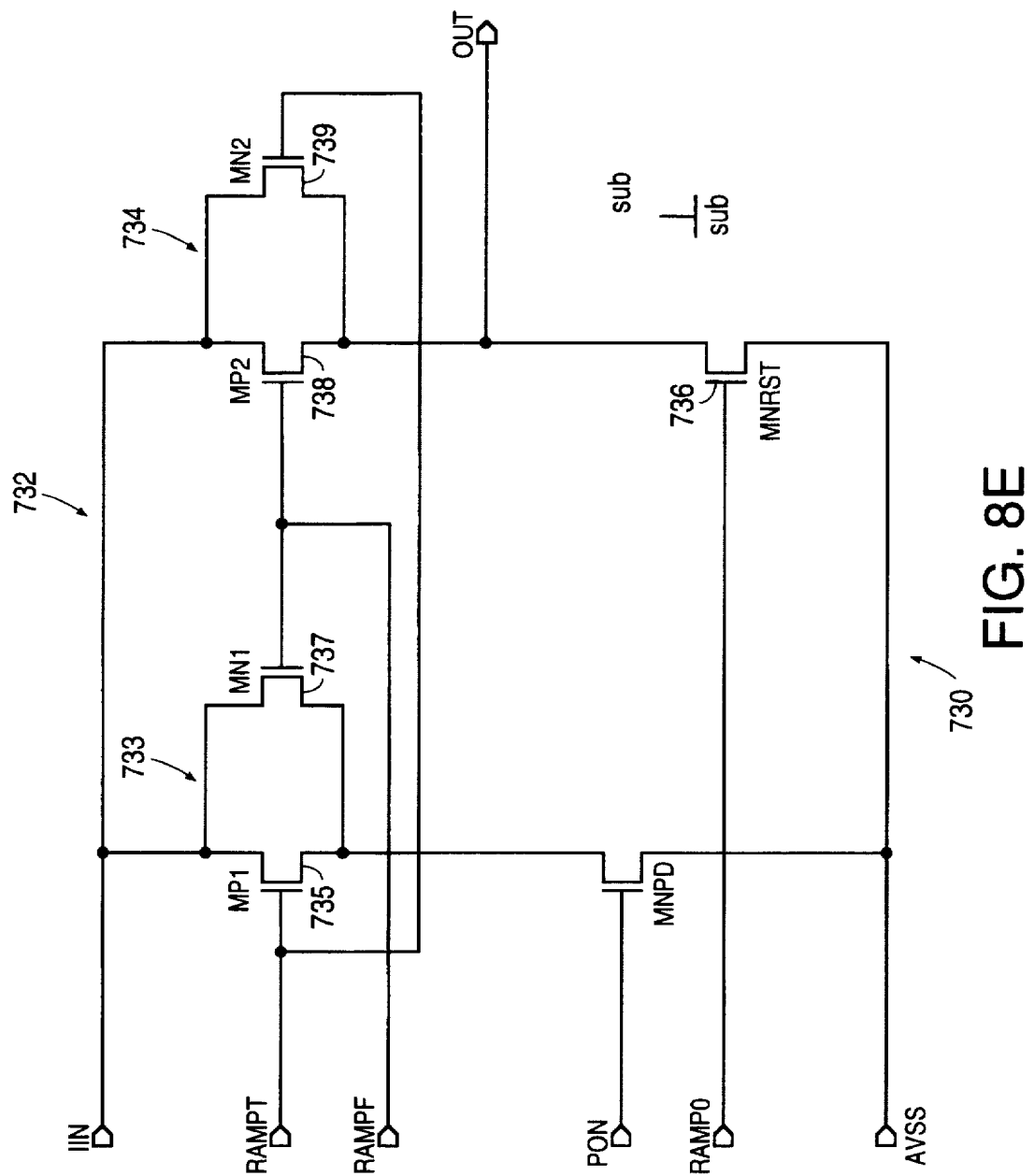

Referring to FIG. 8(e), there is shown a ramp and hold circuit 730 which is similar to the ramp and hold circuit shown in FIG. 7(e) except that ramp and hold circuit 730 includes additional transistors for improved performance in low-voltage applications. Ramp and hold circuit 730 includes a ramp and hold differential switch 732 and a ramp and hold N-channel transistor (MNRST) 736. The ramp and hold differential switch 732 includes a first transfer gate structure 733 having a first transfer gate P-channel MOS transistor (MP1) 735 and a first transfer gate N-channel MOS transistor (MN1) 737, and a second transfer gate structure 734 having a second transfer gate P-channel MOS transistor (MP2) 738 and a second transfer gate N-channel MOS transistor (MN2) 739. First and second transfer gate N-channel MOS transistors (MN1) 737 and (MN2) 739 are respectively connected across P-channel MOS transistors (MP1) 735 and (MP2) 738. The gates of first transfer gate P-channel MOS transistor (MP1) 735 and second transfer gate N-channel MOS transistor (MN2) 739 are connected to a ramp true signal line RAMPT. The gates of first transfer gate N-channel MOS transistor (MN1) 737 and second transfer gate P-channel MOS transistor (MP2) 738 are connected to a ramp false signal line RAMPF.

The two P-channel transistors (MP1) 735 and (MP2) 738 operate as switches for controlling conduction of a ramp current IIN from the bias circuit 710, which acts as a constant current source. Ramp true signal line RAMP and ramp false signal line RAMPF are applied to the gate terminals of the transistors 735, 737, 738 and 739 to steer the current from the bias circuit 710 through the first and second transfer gates 733 and 734.

The first and second transfer gates 733 and 734 improve RC oscillator 700 performance in low voltage applications, in which the voltage across the source to drain pathway of P-channel transistors (MP1) 735 and (MP2) 738 is small, and for further reduced voltages, a nonzero source-to-drain voltage drop across the transistors 735 and 738 forms. Without the transfer gates, at very low voltages the drain voltage of current source transistor (MP5) 720 supplying ramp current IRAMP is no longer less than the gate voltage of that transistor. As such, the current source transistor (MP5) 720 in the bias circuit 710 no longer operates in saturation and begins ohmic region operation, substantially impairing performance of the RC oscillator 700. To avoid this condition, the voltage drop across the P-channel transistors (MP1) 735 and (MP2) 738 is reduced to a minimum value through the operation of the transfer gate structures 732 and 734 to steer the current from the bias circuit 710 rather than driving the current through the operation of P-channel transistors alone.

Figure 8F:
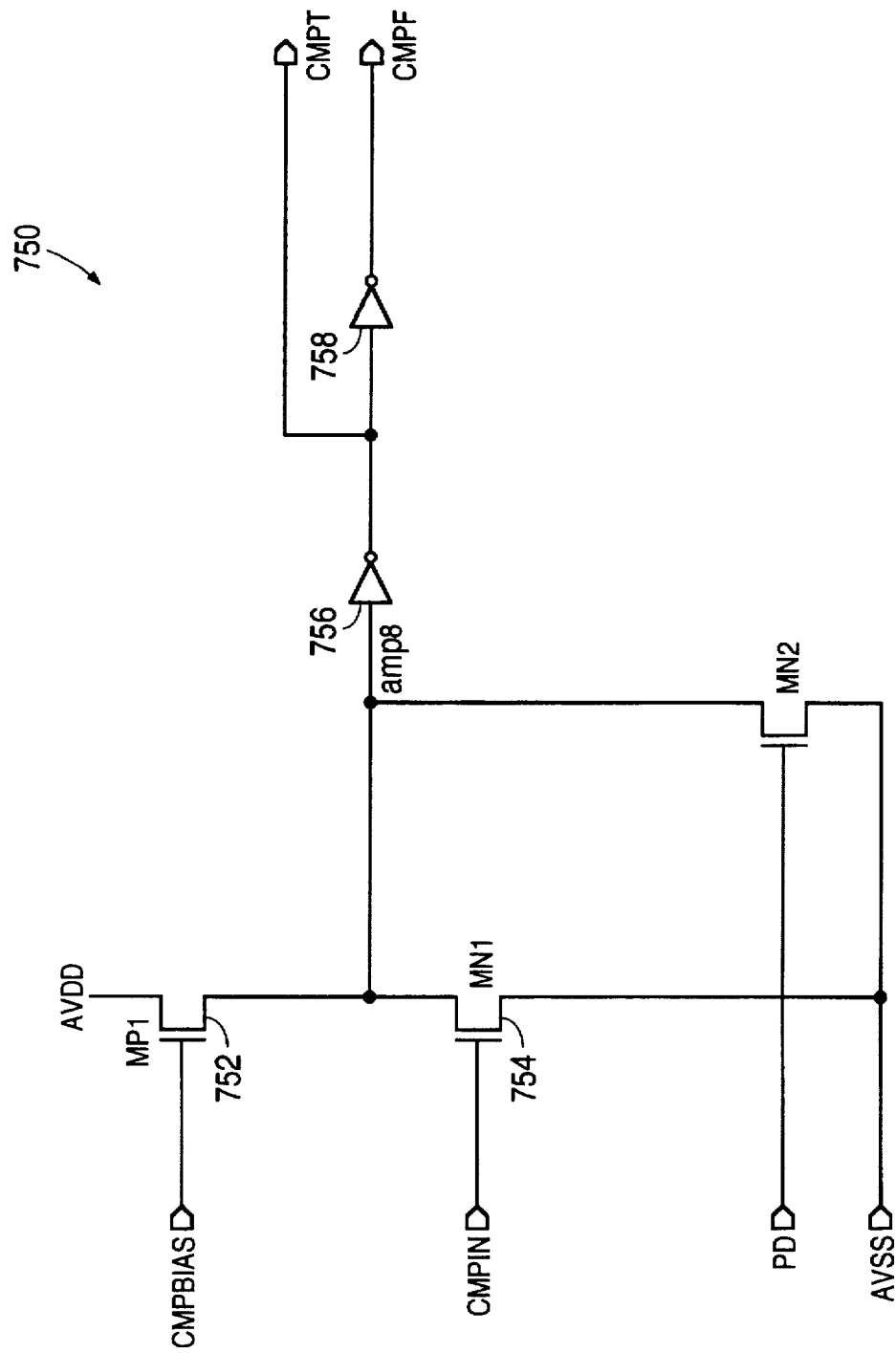

Referring to FIG. 8(f), a comparator 750 includes a P-channel MOS transistor (MP1) 752 and an N-channel MOS transistor (MN1) 754, which are connected at their drain terminals between the power supply source VDD and a ground reference VSS. The gate of the P-channel MOS transistor (MP1) 752 is controlled by a comparator bias signal on CMPBIAS line from the low voltage bias circuit 710. The drain terminals of the transistors (MP1) 752 and (MN1) 754 are connected to a first inverter 756 which is further connected to a second inverter 758 to generate a comparator true signal on a CMPT line and a complementary comparator false signal on a CMPF line.

The switching threshold voltage of transistors (MN1) 754 and (MP1) 752 is set by the comparator bias current on the CMPBIAS line from the low voltage bias circuit 710. In low voltage bias circuit 710, the switching threshold of N-channel MOS transistor (MN3) 718 and P-channel MOS transistor (MP3) 716 is a voltage which is sufficient to sink the current coming from P-channel MOS transistor (MP3) 716. The drain of transistor (MN3) 718 is connected to the drain of transistor (MP3) 716 and the gate terminal of transistor (MP3) 716 connected to the CMPBIAS line. As such, N-channel MOS transistor (MN3) 718 has a gate to source voltage that is established by the current across resistor RCMP that is driving the current mirror of P-channel transistors (MP2) 715 and (MP3) 716. That same bias current also forms the current mirror reference, P-channel MOS transistor (MP1) 752, in the comparator 750. As such the switching threshold of the comparator 750 is nearly equal to the gate to source voltage of transistor (MN3) 718 in the bias circuit 710.

By ratioing, using multiple devices in the bias circuit 710, the current drawn by the comparator 750 is significantly less than the current of low voltage bias circuit 710 due to the ratioing of the current mirrors discussed with reference to the operation of the low voltage bias circuit 710.

The external resistor Rext is implemented in various resistances to specify an operating frequency between a minimum and maximum operating frequency for various applications of the RC oscillator 700. The magnitude of the current passing through the external resistor Rext depends on the implemented resistance of external resistor Rext. The low voltage bias circuit 710 provides flexibility in the current flowing through the external resistor Rext for determining the frequency of oscillation. However, low voltage bias circuit 710 also utilizes the resistor RCMP to set up a small bias current to drive all of the other circuits in digitally-tuned oscillator 702, allowing operation at a very low current and a very low voltage.

Figures 1, 8G:
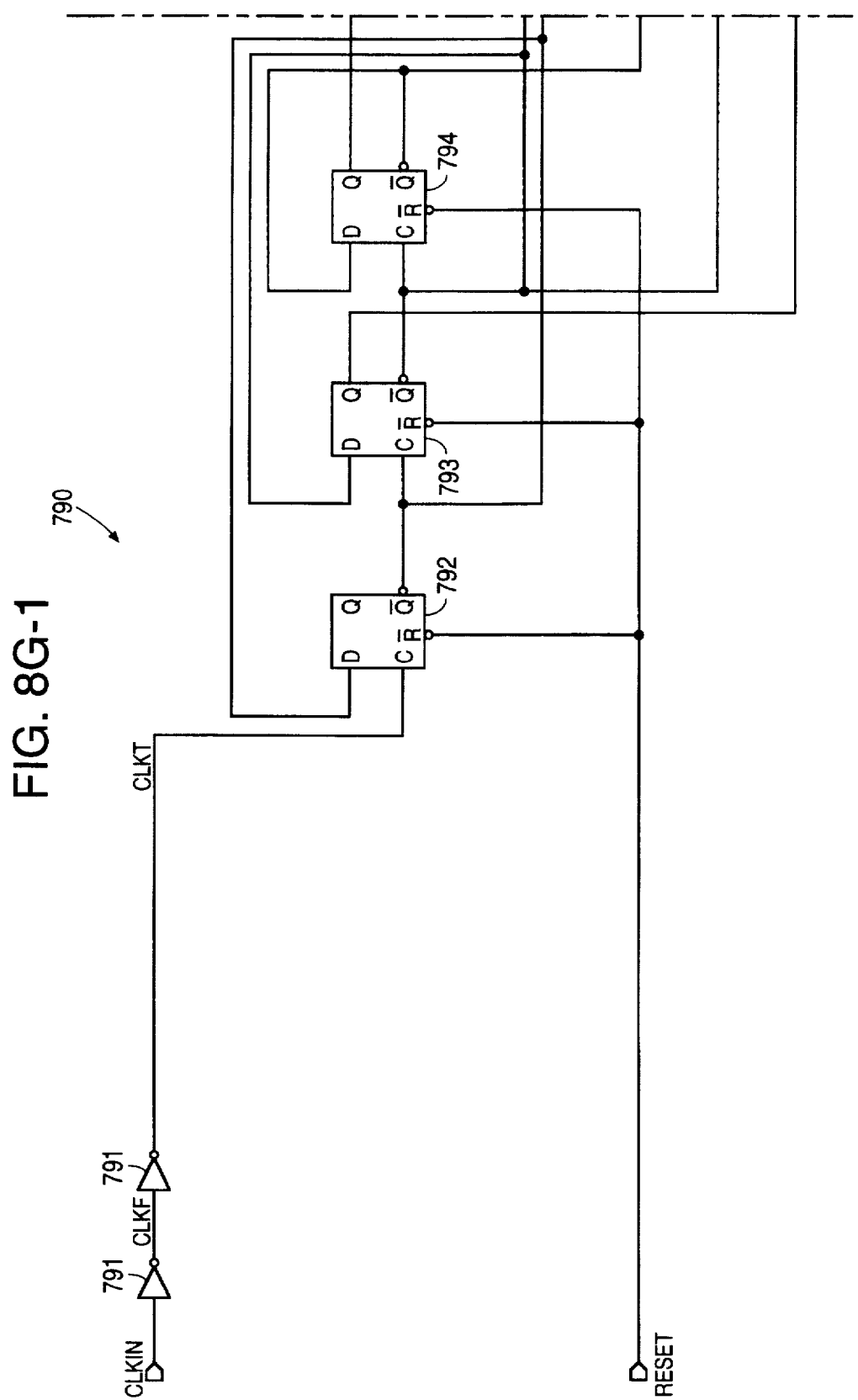

In FIG. 8(g), frequency counter 790 is an 8-count non-synchronous (ripple) counter which includes two input inverters 791, three D-type flip-flops 792, 793 and 794, two two-input NOR gates 796, and six output inverters 697. Although the frequency counter 790 is shown as an 8-count counter, other embodiments may utilize other numbers of counts such as 4, 12, 16 and other multiples of four to improve oscillator performance at different oscillator frequencies.

The two two-input NOR gates each have only two input terminals for low voltage operation. The number of input terminals on any one logic gate is set to a minimum so that the circuit operates at a lower voltage. Thus, in any position at which a multiple-input NOR gate may be implemented, multiple two-input NOR gates are substituted to reduce the operating voltage specification of the frequency counter 790.

Frequency counter 790 is otherwise similar to the frequency counter 690 shown in FIG. 7(f), generating the same output signals. For example, a capacitor discharge signal on RAMP0 line is the inverse of the false output of the last stage D flip-flop 794 and the ramp false signal on RAMPF line and the ramp true signal on RAMPT line are buffered complementary outputs of the penultimate stage D flip-flop 793.

Figures 1, 9A:
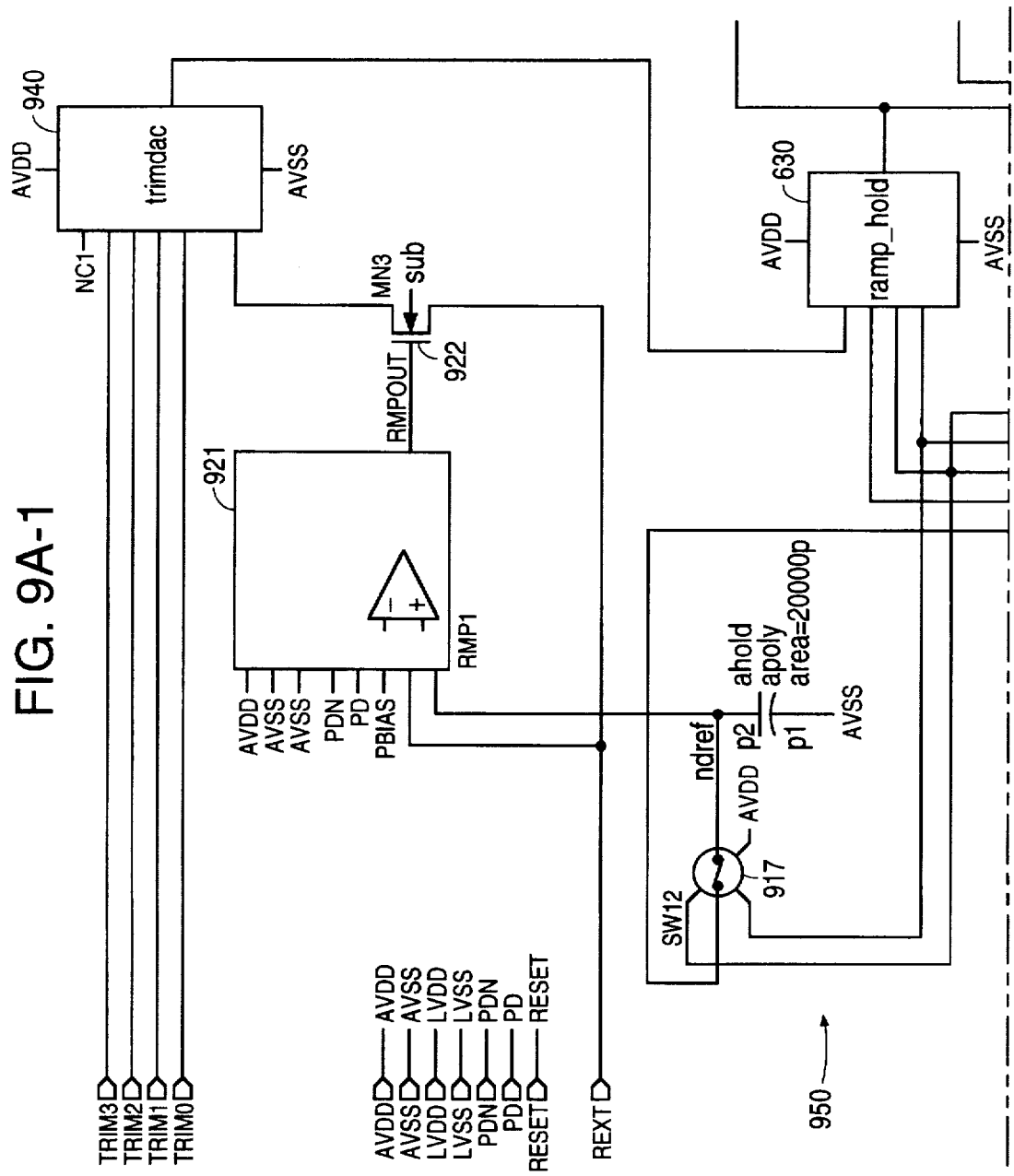
FIGS. 9(a) through 9(c) show a schematic block diagram of an RC oscillator circuit which is optimized for low temperature drift operation.
Figures 1, 9B:
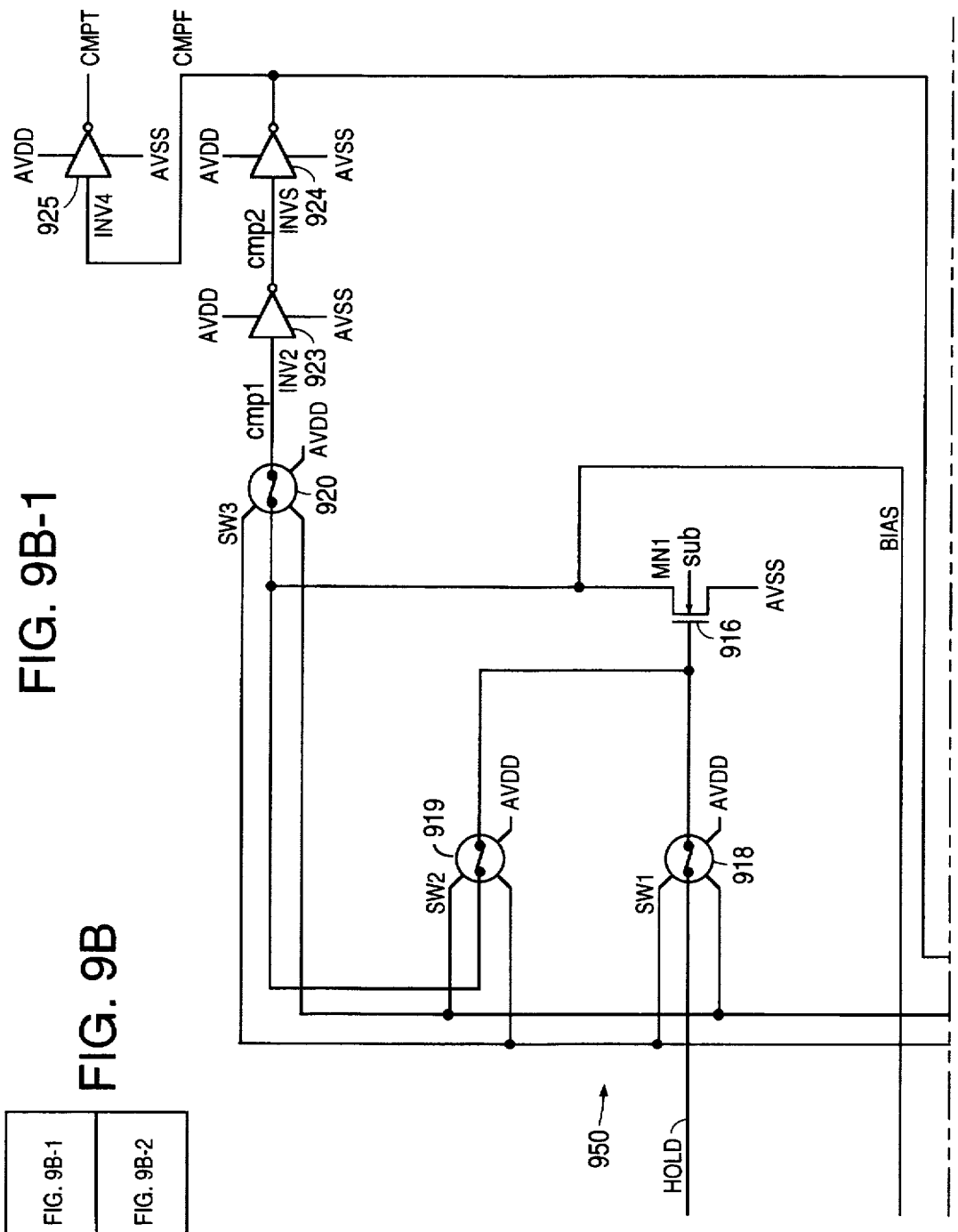
Figures 2, 9B:
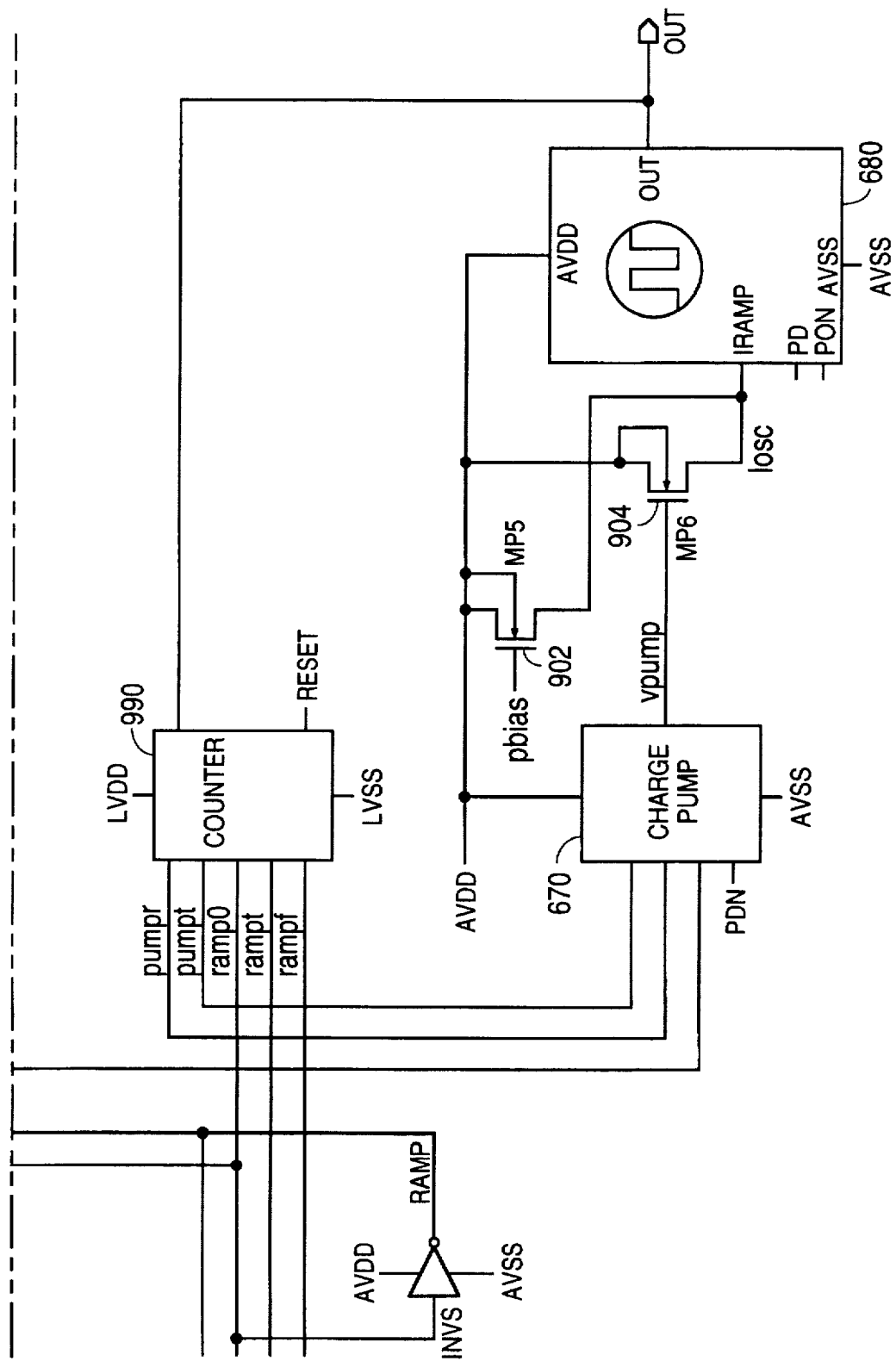

FIGS. 9(a) and 9(b) respectively depict a left half and a right half of a schematic block diagram of an RC oscillator circuit 900, which is optimized for low temperature drift operation. Low drift RC oscillator 900 includes a bias circuit 910, a ramp and hold circuit 630, a trim DAC circuit 940, a comparator 950, a charge pump 670, an oscillator 680, a frequency counter 990 and P-channel MOS transistors (MP5) 902 and (MP6) 904. A fundamental difference between the RC oscillator circuit 900 and previously described RC oscillator circuits is that the bias arrangement of the circuit is different, thus bias circuit 910 is dissimilar from bias circuits 610 and 710. Ramp and hold circuit 630, charge pump 670 and oscillator 680 are substantially the same as corresponding elements in the RC oscillator 600 illustrated in FIGS. 7(a) through 7(f). Current-steering ramp and hold circuit 630 may be optionally replaced by transfer-gate ramp and hold circuit 730 which is illustrated in FIGS. 8(a) through 8(g). P-channel MOS transistors (MP5) 902 and (MP6) 904 are substantially the same as respective P-channel MOS transistors (MP4) 602 and (MP3) 604 in the RC oscillator 600. Comparator 950 and frequency counter 990 are structurally and functionally similar to the respective comparator 650 and frequency counter 690 elements of RC oscillator 600, but incorporate various modifications. For example, frequency counter 990 is a 64 state counter in the illustrative embodiment. The trim DAC circuit 940 has no corresponding comparable element in the RC oscillator 600 or the digitally-tuned oscillator 702 shown in FIGS. 8(a) through 8(g).

The bias circuit 910 is shown in FIGS. 9(a) and 9(b) and includes an N-channel MOS transistor (MN0) 911 having a source connected to ground reference VSS and a drain which is connected to the drain of a diode-connected P-channel MOS transistor (MP0) 912. The diode-connected P-channel MOS transistor (MP0) 912, which has a source connected to a power supply source VDD, forms a current mirror with a P-channel MOS transistor (MP1A) 913. The drain of the transistor (MP1A) 913 is connected to the drain of an N-channel MOS transistor (MN1A) 914. The source of transistor (MN1A) 914 is connected to ground reference VSS. The input signal applied to the gate of N-channel MOS transistor (MN0) 911 is an input voltage on VIN line. Transistors (MN0) 911, (MP0) 912, (MP1A) 913 and (MN1A) 914 form a simple four-transistor comparator. Transistors (MN0) 911 and (MN1A) 914 convert the respective gate voltages on lines VIN and CEX to respective drain currents. The current mirror formed by transistors (MP0) 912 and (MP1A) 913 mirrors the drain current of transistor (MN0) 911. The larger current between the current conducted by transistors (MP1A) 912 and (MN1A) 914 determines whether a high or low level occurs at the voltage output of the simple four-transistor comparator.

Bias circuit 910 also includes a P-channel MOS transistor (MP1) 915 which has a source connected to power supply source VDD and a gate connected to the gates of P-channel MOS transistors (MP1) 912 and (MP1A) 913. Transistor (MP1) 915 is adjacent to and the same size as transistor (MP1A) 913 so that transistors (MP1) 913 and (MP1A) 915 are matched devices forming an additional current mirror. Therefore, application of an input voltage on line VIN to the gate of N-channel MOS transistor (MN0) 911 generates a current flow of a particular magnitude at the drain of transistor (MN0) 911, this current passes through P-channel MOS transistor (MP0) 912 and is mirrored to P-channel MOS transistors (MP1A) 913 and (MP1) 915. P-channel MOS transistor (MP1) 915 passes this current, with no change in amplitude, at its drain. The drain current of transistor (MP1) 915 is nearly the same as the current generated at the drain of transistor (MN0) 911, however the current has changed directions. The drain of P-channel MOS transistor (MP1) 915 is connected to two paths. A first path connects transistor (MP1) 915 to a transfer gate (SW12) 917.

A second path connects transistor (MP1) 915 to the drain of an N-channel MOS transistor (MN1) 916.

Figure 9C:
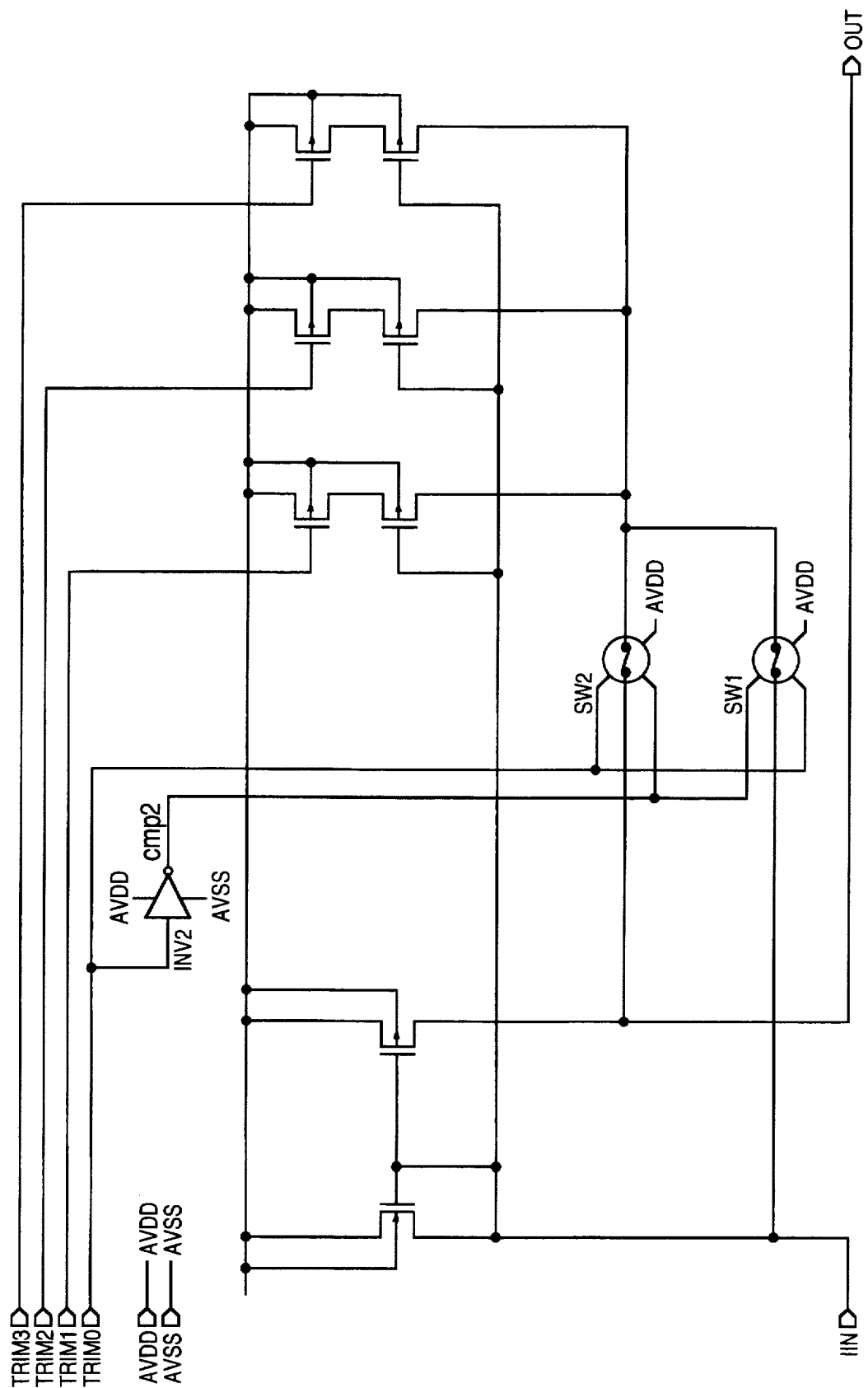

In the first path, transfer gate (SW12) 917 is a switch which connects the drain of transistor (MP1) 915 to a hold capacitor Chold and to an amplifier 921. Transfer gate (SW12) 917 is controlled by timing signals from the frequency counter 990. The timing signals control charging of the hold capacitor Chold from the drain current of P-channel MOS transistor (MP1) 915 and transfer of charge from the hold capacitor Chold to the operational amplifier 921. An output line of operational amplifier 921 drives a source follower transistor (MN3) 922 which is connected to the external resistor Rext and to a trim DAC circuit 940. Trim DAC circuit 940, which is illustrated in FIG. 9(c), serves as a highly accurate current mirror which drives the ramp and hold circuit 630. Trim DAC circuit 940 utilizes trim control signals TRIM0, TRIM1, TRIM2 and TRIM3 to precisely tune the oscillator when capacitor COSC does not have the precise value of capacitance for the required frequency.

In the second path, N-channel MOS transistor (MN1) 916 is the same size as transistor (MN0) 911 having substantially the same gate width and gate length. Furthermore, N-channel MOS transistors (MN0) 911 and (MN1) 916 are oriented in the same direction in silicon and positioned in close proximity so that device parameters are substantially the same. N-channel MOS transistor (MN1) 916 has a source connected to ground reference VSS and a gate connected to three transfer gates (SW1) 918, (SW2) 919 and (SW3) 920. Transfer gate (SW3) 920 connects the drain of N-channel MOS transistor (MN1) 916 to a series of three inverters 923,924 and 925. Inverter 924 furnishes a comparator false signal on CMPF line and inverter 925 furnishes a comparator true signal on CMPT line. CMPF and CMPT lines are connected to the charge pump 670 to determine whether the pump capacitor Cpump charges high or low.

Bias circuit 910 utilizes two current paths because N-channel MOS transistor (MN1) 916 is used for two purposes. First, transistor (MN1) 916 forms a reference voltage during a first part of a timing cycle. Second, transistor (MN1) 916 is utilized as a comparator during a second part of the timing cycle. It is advantageous for the single transistor (MN1) 916 to perform both of these functions, rather than having separate circuits to perform each function, because usage of separate transistors introduces a voltage offset between the signals compared by the comparator. In some instances, such a voltage offset greatly degrades performance of an RC oscillator. Therefore, in the illustrative embodiment shown in FIGS. 9(a) and 9(b), the bias circuit 910 utilizes transistors (MN0) 911 and (MP0) 912 as a voltage-to-current converter acting on the input voltage signal on VIN line to charge and set up a current in N-channel transistor (MN1) 916. Transistor (MN1) 916 then generates its own reference voltage and its own comparator switching voltage.

Frequency counter 990 generates timing signals which are applied to close the transfer gate (SW2) 919. When transfer gate (SW2) 919 becomes conductive, it connects the gate and drain of transistor (MN1) 916, forming a diode-connected transistor which produces an output voltage as a function of the applied drain current from transistor (MP1) 915, a current that is mirrored from transistor (MN0) 911. The drain current of transistor (MN0) 911 is determined by the input voltage on VIN line. As a result, the output voltage generated by transistor (MN1) 916 is substantially the same as the original input voltage on VIN line.

After transfer gate (SW2) 919 is closed and while transfer gate (SW2) 919 remains closed, frequency counter 990 also generates timing signals which are applied to close the transfer gate (SW12) 917. When transfer gate (SW12) 917 is closed, hold capacitor Chold is connected to the drain of N-channel MOS transistor (MN1) 916, thereby charging the hold capacitor Chold. Thus, the switches (SW2) 919 and (SW12) 917 are controlled to hold a gate-to-source voltage substantially equivalent to the input voltage on transistor (MN1) 916 for a selected time and then to transfer that voltage and charge the hold capacitor Chold. Subsequently, frequency counter 990 opens the transfer gate (SW12) 917 and the voltage on the hold capacitor Chold is applied to operate a voltage-to-current converter formed by the operational amplifier 921, source follower transistor (MN3) 922 and the external resistor Rext. In this manner a current is set for application to the ramp and hold circuit 630.

Transfer gate switch (SW12) 917 is opened by signals from frequency counter 990 and ramp and hold circuit 630 begins ramping and terminates ramping under control of frequency counter 990 timing signals. At the end of ramping, frequency counter 990 switches transfer gate switch (SW1) 918 on and transfer gate switch (SW2) 919 off, so that the gate and drain of transistor (MN1) 916 are no longer connected. At this time, transfer gate switch (SW1) 918 connects the external capacitor Cext to the gate of transistor (MN1) 916. The external capacitor Cext was previously charged to the hold voltage from trim DAC circuit 940.

When the external capacitor Cext has completed the ramp interval, frequency counter 990 applies timing signals that convert the function of transistor (MN1) 916 from a diode-connected transistor operation to a comparator operation.

N-channel MOS transistor (MN1) 916 functions as a comparator because its gate terminal is connected to the external capacitor Cext after capacitor Cext is charged. Transistor (MN1) 916 is a very precise comparator because it is comparing the voltage on the external capacitor Cext to its own switching threshold voltage, which is also being used to set the current.

Accordingly, using only a single field effect transistor—N-channel MOS transistor (MN1) 916—reduces errors resulting from device mismatch. By utilizing a single transistor in this manner, no voltage offset can occur to reduce oscillator accuracy and performance since voltage offsets arise due to parametric variations between transistors. Thus the bias circuit 910 advantageously furnishes a highly accurate comparator having no offset. If the threshold voltage drifts with temperature, or the K' drifts with temperature, the switching threshold voltage resulting from the temperature drifting is stored on the hold capacitor Chold which sets up the reference current. The bias circuit 910 advantageously avoids the problem of device matching in a comparator. Only one device is utilized so that it is always matched to itself. Furthermore, the bias circuit 910 advantageously utilizes the same voltage applied across the external resistor Rext to set up the bias current so that the circuit is self-calibrating. Still further, the RC oscillator 900 advantageously has an extremely low temperature drift.

Figure 10A:
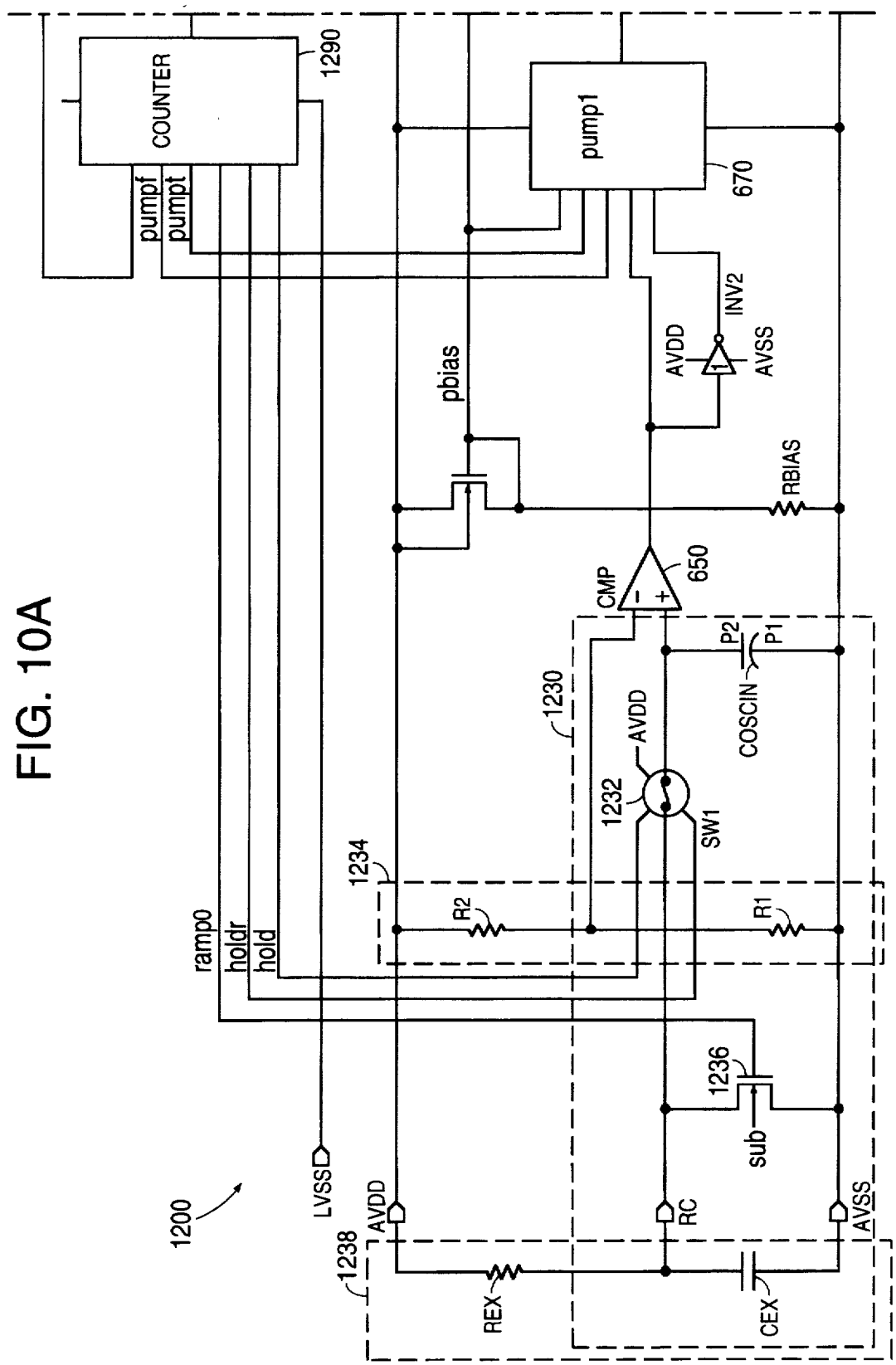
FIG. 10 illustrates a schematic block diagram of RC oscillator circuit which uses an external resistor to charge an external capacitor directly. This circuit uses only one package pin for both resistor R and capacitor C.

Referring now to FIG. 10, there is shown a schematic block diagram of RC oscillator circuit 1200 which uses an external resistor to charge an external capacitor directly, rather than using a current mirror to charge the capacitor.

Like the low power RC oscillator circuit 600 shown in FIG. 7(a), RC oscillator circuit 1200 includes a comparator 650, a charge pump 670, an oscillator 680 and a frequency counter 1290. In the illustrative embodiment of RC oscillator circuit 1200, these circuits are substantially the same as corresponding circuits in the low power RC oscillator circuit 600. However, the low power RC oscillator 600 includes the bias circuit 610 and the ramp and hold circuit 630 to charge an external capacitor Cex by comparing a voltage across the external resistor to a voltage reference and applying the difference voltage to a voltage to current converter in a current mirror. In contrast to the low power RC oscillator 600 and other oscillator embodiments hereinbefore described, RC oscillator circuit 1200 includes greatly simplified circuits which perform the functions of the bias circuit 610 and the ramp and hold circuit 630 and uses an external resistor Rex to charge the external capacitor Cex directly. A resistor Rex charges the external capacitor Cex with a suitable exponential charge characteristic, instead of a more ideal linear charge characteristic.

The RC oscillator circuit 1200 includes the external resistor Rex and the external capacitor Cex connected in series between the VDD terminal supplying the power supply voltage and the VSS terminal supplying a ground reference potential. A ramp and hold circuit 1230 is formed by a transfer gate switch 1232, a capacitor Coscin and the external capacitor Cex. The resistor Rex is used for charging the external capacitor Cex and functions as a current source of a ramp and hold circuit 1230. The ramp and hold circuit 1230 operates as a simple sampling network. A node between the external capacitor Cex and the external resistor Rex is connected to the transfer gate switch 1232 of the ramp and hold circuit 1230 for switchable connection to the noninverting terminal of the comparator 650. The transfer gate switch 1232 is controlled by lines connected to the hold and $\overline{\text{hold}}$ terminals of the frequency counter 1290.

In all embodiments of an RC oscillator described herein, there is included a comparator having a first input terminal for receiving a voltage characterizing the operation of the RC network and a second input terminal receiving a reference voltage. In RC oscillator 1200, the comparator 650 has a noninverting input terminal connected to the RC network 1238 of resistor Rex and capacitor Cex through the transfer gate switch 1232. The comparator 650 has an inverting input terminal connected to receive a reference voltage formed by a resistive voltage divider 1234 at the junction of resistor R1 and resistor R2. The reference voltage is set by selection of the resistances of resistors R1 and R2.

The mode of operation of RC oscillator 1200 is substantially similar to the mode of operation of other oscillator circuit embodiments described hereinbefore. Accordingly, the comparator 650 changes the polarity on the charge pump 670 so that the oscillator 680 varies the frequency of oscillation until the reference voltage on the inverting input terminal of the comparator 650 matches the hold voltage across external capacitor Cex. When this condition is achieved, oscillator 680 is operating at a stable frequency point. To operate in this manner, resistors R1 and R2 of resistive voltage divider 1234 are selected to supply a reference voltage that matches the voltage across capacitor Cex that results from the operation of the RC network 1238 as capacitor Cex charges over a predetermined time. The resistances of resistors R1 and R2 are not necessarily selected to generate a reference voltage which corresponds to a full time constant of the RC network 1238, resistances furnishing a fraction of a full time constant may be selected. One full time constant corresponds to a reference voltage of $(1-1/e)$ (63%) of the power supply voltage so that, if resistors R1 and R2 are selected to generate 63% of the power supply voltage at the inverting input terminal of comparator 650, then the operating frequency of the overall loop of the RC oscillator 1200 conforms to the RC network 1238 time constant. However, in some embodiments the resistors are chosen to supply 50% of the power supply voltage, for example, rather than 63% so that the operating frequency of the RC oscillator 1200 changes in a corresponding manner.

The relationship between reference voltage and operating frequency in RC oscillator 1200 is nonlinear so that at a low reference voltage below 63% of the power supply voltage, operating frequency changes little for a change in reference voltage. At a high reference voltage near the power supply voltage, operating frequency changes greatly for slight changes in reference voltage. If a high voltage, near the power supply voltage, is applied to the inverting input terminal of the comparator 650, the voltage applied to the comparator 650 is not well defined so that the frequency of oscillation is generally not stable and the circuit becomes highly sensitive to noise.

An N-channel MOS transistor (MNRST) 1236 has a source to drain pathway connected between the VSS ground reference terminal and the node between the external capacitor Cex and the external resistor Rex. Transistor (MNRST) 1236 has a gate terminal connected to a line from the ramp terminal of the frequency counter 1290. Transistor (MNRST) 1236 is controlled by the frequency counter 1290 to discharge the external capacitor Cex at a predetermined phase of the counter cycle of the RC oscillator 1200 when the signal from the ramp terminal of the frequency counter 1290 activates the N-channel MOS transistor (MNRST) 1236. Internal capacitor Coscin is discharged in a phase of the frequency counter 1290 cycle in which a signal from the ramp terminal activates transistor (MNRST) 1236 and the transfer gate switch 1232 is closed by operation of the hold and $\overline{\text{hold}}$ signals from the frequency counter 1290. Thus, N-channel MOS transistor (MNRST) 1236 discharges both capacitors, external capacitor Cex and internal capacitor Coscin.

RC oscillator 1200 functions in a manner similar to that of the previously described oscillator embodiments with the frequency counter 1290 generating timed control signals for controlling a ramp and hold circuit. In particular, the oscillator 680 generates a timing signal that dithers about the operating frequency set by the RC network 1238. Frequency counter 1290 generates control signals on a ramp terminal, a hold terminal and a $\overline{\text{hold}}$ terminal. In contrast to previously disclosed RC oscillator embodiments, RC oscillator 1200 utilizes a single ramp signal rather than two ramp signals (ramp true and ramp false) because the two ramp signals are used in the other embodiments to control a current mirror. RC oscillator 1200 does not utilize a current mirror.

A first phase of a timing cycle begins when the ramp function generated by the frequency counter 1290 goes from a logic 1 to a logic 0 value, turning off N-channel MOS transistor (MNRST) 1236 and charging external capacitor Cex with an exponential charge characteristic. In a second phase of the timing cycle, frequency counter 1290 changes the hold signal from a logic 0 to a logic 1, opening the transfer gate switch 1232, while maintaining the RAMP0 signal at a logic 0.

When the frequency of the timing signal generated by the oscillator 680 is lower than the frequency set by the RC network 1238, external capacitor Cex is charged to a voltage greater than the reference voltage so that the comparator 650 generates a logic 1 signal. Internal capacitor Coscin is charged to the same voltage as the external capacitor Cex. The logic 1 signal from the comparator 650 is connected to the charge pump circuit 670, causing the charge pump 670 to change the direction of the pump signal, forcing more current at the drain terminal of P-channel MOS transistor (MP1) 1240 and increasing the oscillation frequency of oscillator 680.

When the frequency of the timing signal generated by the oscillator 680 is greater than the frequency set by the RC network 1238, external capacitor Cex is charged to a voltage smaller than the reference voltage so that the comparator 650 applies a logic 0 signal to the charge pump circuit 670, causing the charge pump 670 to change the direction of the pump signal, forcing less current at the drain terminal of P-channel MOS transistor (MP1) 1240 and reducing the oscillation frequency of oscillator 680. Self-calibrating RC oscillator 1200 is very important for applications where only one package pin is available for an external resistor R and an external capacitor C to set frequency.

Figure 11A:
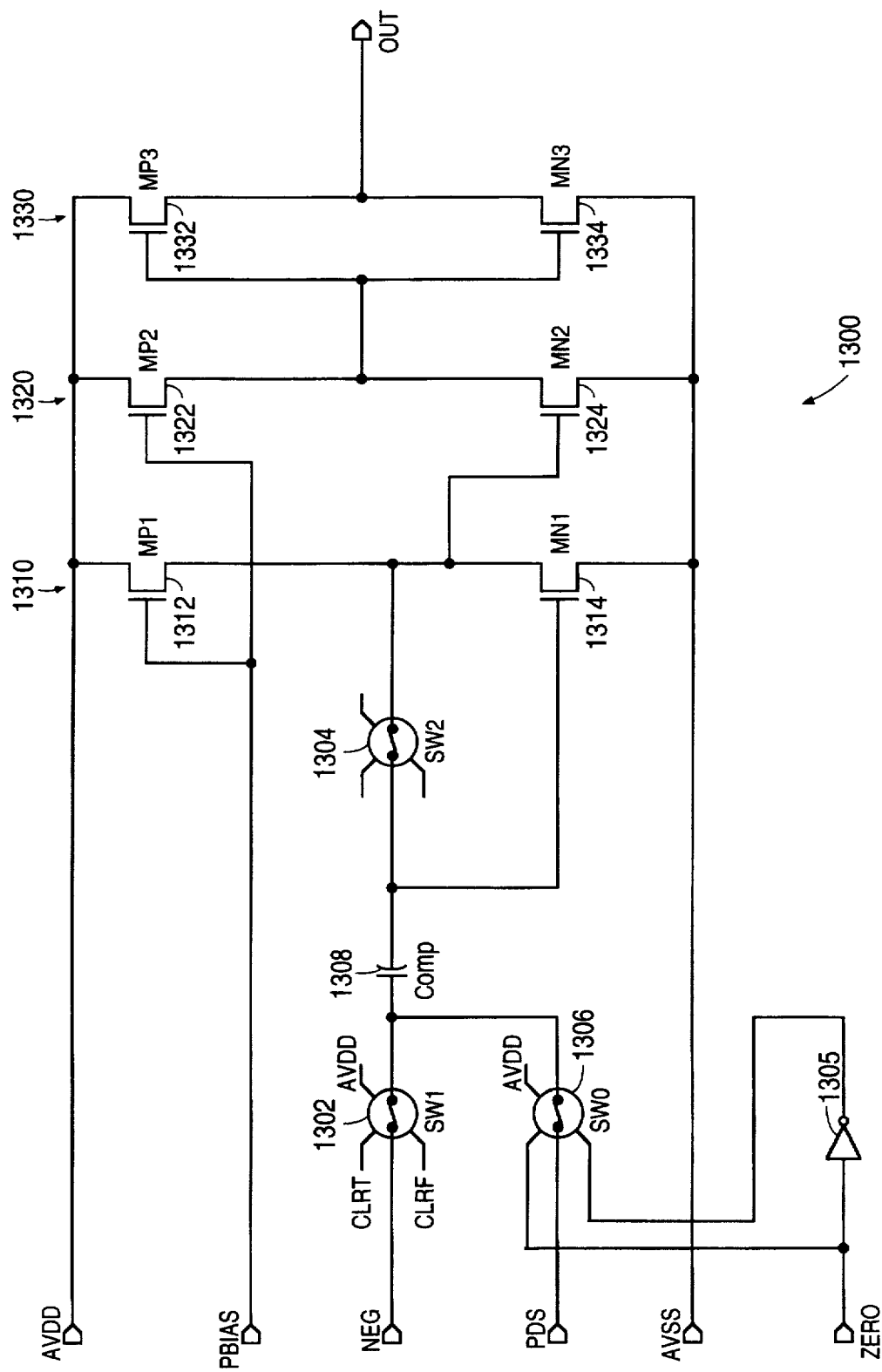
FIGS. 11(a) and 11(b) respectively illustrate a transistor-level schematic diagram of a clocked comparator circuit and a timing diagram showing the operation of the clocked comparator circuit.
Figure 11B:
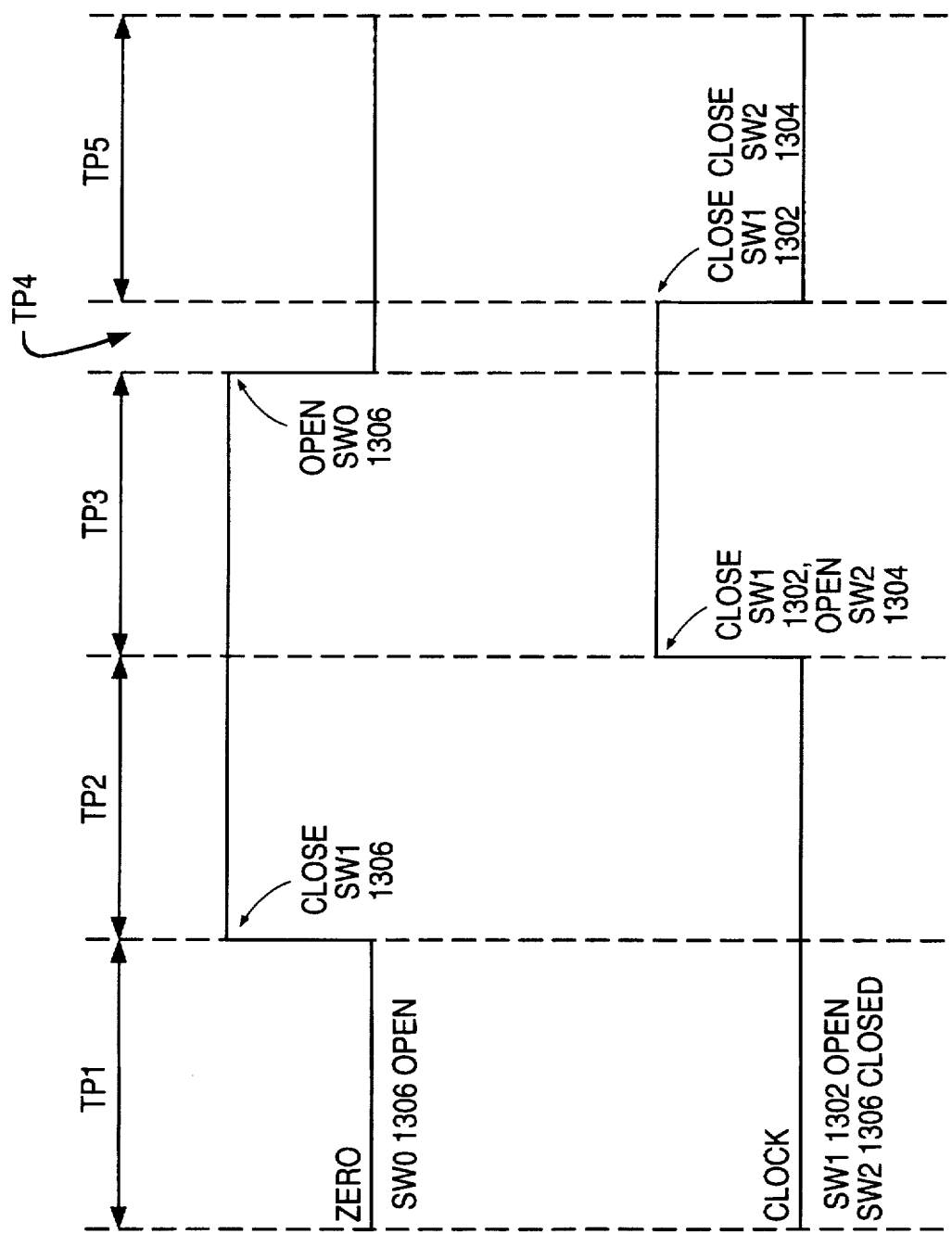

Referring to FIG. 11(*a*), there is shown a transistor-level schematic diagram of a clocked comparator circuit 1300 which has a quick response following a clock signal edge. In various embodiments of an RC oscillator, the clocked comparator circuit 1300 may be substituted for comparators such as comparator 650 shown in FIG. 7(*a*), comparator 750 shown in FIGS. 8(*c*) and 8(*f*), and comparator 950 shown in FIGS. 9(*a*) and 9(*b*).

Clocked comparator 1300 is a fully differential comparator having both a positive input terminal and a negative input terminal. However, in various embodiments clocked comparator 1300 is suitable for implementation in any application. For example, checked comparator 1300 is used as a single-input comparator simply by tying either the positive input terminal or the negative input terminal to a reference voltage terminal. The reference terminal to which the input terminal is tied and the polarity of the input terminal tied to the reference terminal are determined by the desired polarity of the output signal of the comparator 1300.

The clocked comparator 1300 is controlled using two control signals from an external frequency counter. One control signal is a clock signal which activates the comparator 1300. A second control signal is a zero signal which generates a timing phase that precedes the clock signal.

Clocked comparator 1300 includes a first inverter stage 1310, a second inverter stage 1320 and a third inverter stage 1330. The first inverter stage 1310 includes a P-channel MOS transistor (MP1) 1312 and an N-channel MOS transistor (MN1) 1314, each having a source to drain pathway connected in series between the power supply terminal VDD and the ground reference terminal VSS. P-channel MOS transistor (MP1) 1312 has a gate connected to the pbias line. The second inverter stage 1320 includes a P-channel MOS transistor (MP2) 1322 and an N-channel MOS transistor (MN2) 1324 each having a source to drain pathway connected in series between the power supply terminal VDD and the ground reference terminal VSS. P-channel MOS transistor (MP2) 1322 has a gate connected to the pbias line. N-channel MOS transistor (MN2) 1324 has a gate connected to a node connecting the drain terminals of transistors (MP1) 1312 and (MN1) 1314. The third inverter stage 1330 includes a P-channel MOS transistor (MP3) 1332 and an N-channel MOS transistor (MN3) 1334 each having a source to drain pathway connected in series between the power supply terminal VDD and the ground reference terminal VSS. Both P-channel MOS transistor (MP3) 1332 and N-channel MOS transistor (MN3) 1334 have gates connected to the node connecting the drain terminals of transistors (MP2) 1322 and (MN2) 1324. An output terminal OUT is connected to a node between the drain terminals of transistors (MP3) 1332 and (MN3) 1334.

A negative differential input terminal NEG is connected to the input capacitor Ccmp 1308 by a first transfer gate switch (SW1) 1302. A positive differential input terminal POS is connected to capacitor Ccmp 1308 by a second transfer gate switch (SW0) 1306. The positive POS and negative NEG differential input terminals of clocked comparator 1300 are switchable by switching the polarity of the clock and $\overline{\text{clock}}$ signals of the transfer gate switches (SW1) 1302 and (SW0) 1306. A zero phase control terminal ZERO is connected to a first control terminal of second transfer gate switch (SW0) 1306 and is connected to an inverter 1305 to furnish an inverted zero signal to a second control terminal of second transfer gate switch (SW0) 1306. The output terminal of capacitor Ccmp 1308 is connected to the gate of N-channel transistor (MN1) 1314. A third switch (SW2) 1304, when activated, provides a conductive path between the gate and drain of N-channel transistor (MN1) 1314.

Referring to the timing diagram shown in FIG. 11(*b*), operation of the clocked comparator 1300 is described. In timing phase TP1, the signal on the zero phase control terminal ZERO is a logic 0, second transfer gate switch (SW0) 1306 is open so that the positive differential input terminal POS is isolated from the rest of the clocked comparator 1300. The clock and $\overline{\text{clock}}$ signals to the transfer gate switches (SW1) 1302 and (SW2) 1304 are configured so that transfer gate switch (SW1) 1302 is open and transfer gate switch (SW2) 1304, which is always complementary to transfer gate switch (SW1) 1302, is closed. In this configuration N-channel MOS transistor (MN1) 1314 is diode-connected so that any current that is mirrored from transistor (MP1) 1312 operates to self-bias transistor (MN1) 1314 to a level very close to the switching threshold voltage of the first invertor stage 1310 transistors (MP1) 1312 and (MN1) 1314. This switching threshold voltage is the same as the gate to source voltage of N-channel MOS transistor (MN1) 1314. Furthermore, the gate to source voltage $V_{GSN1}$ of N-channel MOS transistor (MN1) 1314 is essentially the same as the switching threshold voltage of second inverter stage 1320 transistors (MP2) 1322 and (MN2) 1324. Thus in timing phase TP1, the first and second inverter stages 1310 and 1320 have essentially equivalent operating conditions, having essentially the same switching threshold voltage. However, the second inverter stage 1320 has a relatively high gain while the first inverter stage 1310 has a small gain.

In timing phase TP2, the signal on the zero phase control terminal ZERO goes to a logic 1, causing inverter 1305 to have a logic 0 inverted zero phase signal. The logic 1 zero phase control signal ZERO and logic 0 inverted zero phase control applied to second transfer gate switch (SW0) 1306 close the second transfer gate switch (SW0) 1306, connecting the positive differential input at terminal POS to the gate of N-channel MOS transistor (MN1) 1314 and precharging the capacitor Ccmp.

In timing phase TP3, the clock and $\overline{\text{clock}}$ signals to the transfer gate switches (SW1) 1302 and (SW2) 1304 are switched so that transfer gate switch (SW1) 1302 is closed and transfer gate switch (SW2) 1304 is opened. The precharged capacitor Ccmp applies a voltage to the gate of N-channel MOS transistor (MN1) 1314 so that the gate to source voltage $V_{GSN1}$ of N-channel MOS transistor (MN1) 1314 substantially matches the switching threshold of the first and second inverter stages 1310 and 1320.

In timing phase TP4, the zero signal is changed to open the second transfer gate switch (SW0) 1306. With the first transfer gate switch (SW1) 1302 closed and the third transfer gate switch (SW2) 1304 open, the first inverter stage 1310 is in a condition to switch unless the signal applied to the negative differential input terminal NEG precisely matches the voltage on the capacitor Ccmp. A nearly instantaneous movement, either high or low, of the drain voltage of N-channel MOS transistor (MN1) 1314 results from this condition. The direction of the drain voltage movement depends on the balance of voltages applied to the gate of N-channel MOS transistor (MN1).

Accordingly, any potential difference between the signals on the positive and negative differential input terminals POS and NEG causes the bias point of N-channel MOS transistor (MN1) 1314 to change from its natural bias point, causing the first inverter stage 1310, then the second inverter stage 1320 and then the third inverter stage 1330 to switch.

Three inverter stages 1310, 1320 and 1330 are included in the clocked comparator circuit 1300. Each of the three stages has a gain in the range of approximately ten to fifty. Incorporation of three gain stages advantageously furnishes an exponential increase in gain for the circuit 1300. For example, for a gain of ten for each stage, the overall gain is 10 to the third power or 1000. For a gain of fifty for each stage, the overall gain is 50 to the third power or 125,000.

The clocked comparator circuit 1300 advantageously responds extremely quickly after invoking a clock edge. This quick response results because the drain voltage of N-channel MOS transistor (MN1) 1314 is extremely close to the switching threshold of the first and second inverter stages 1310 and 1320. As a result, a very small change in the input signal to the comparator circuit 1300, for example a fraction of a millivolt, causes the entire circuit to switch.

Advantageously, the clocked comparator 1300 is self-calibrating and does not have an input offset voltage. Accordingly, the clocked comparator 1300 is used in some embodiments for extremely low bias voltages.

The clocked comparator 1300 has no offset voltage because only a single transistor, N-channel MOS transistor (MN1) 1314 is used for comparison of input voltages. In contrast, other comparators compare the threshold voltage of one transistor to the threshold voltage of a second transistor.

The description of certain embodiments of this invention is intended to be illustrative and not limiting. Numerous other embodiments will be apparent to those skilled in the art, all of which are included within the broad scope of this invention. Specific illustrative embodiments of an RC oscillator in accordance with the invention include various CMOS implementations. Other technology embodiments including BiCMOS, bipolar, gallium arsenide (GaAs) and hybrid embodiments are also within the scope of the invention. In some of these embodiments, the frequency operation of the RC oscillator is extended to 10 GHz or higher. Furthermore, in other embodiments, low voltage operation of an RC oscillator is obtained using a 2.5 V to 3.5 V submicron CMOS technology configuration.

APPENDIX

Figure 12A:
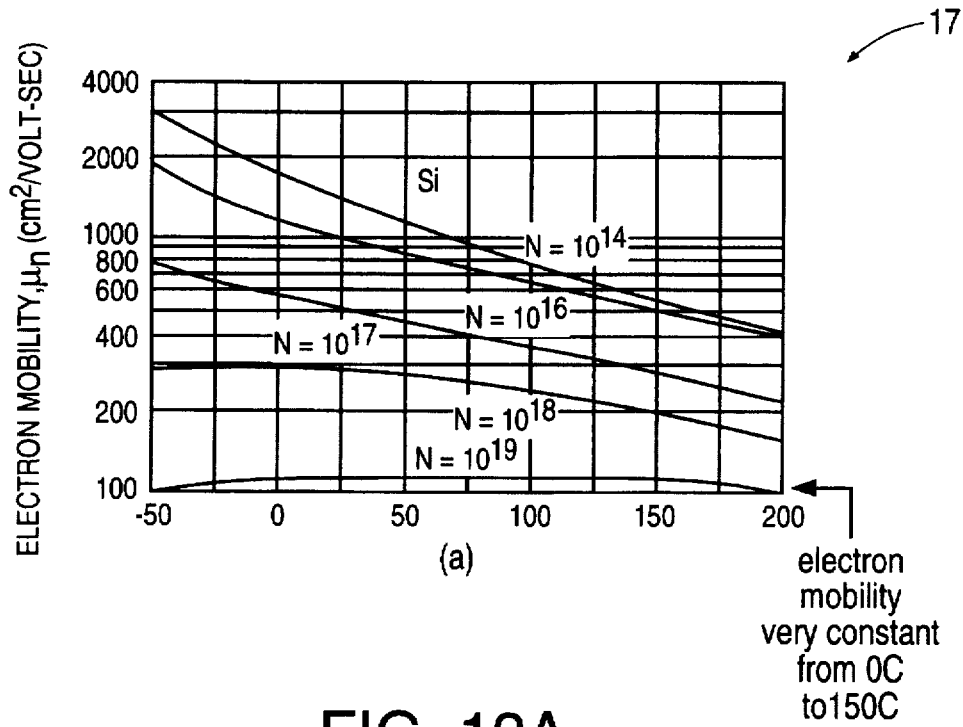
FIGS. 12(a) and 12(b) respectively are graphs that illustrate electron (N-type carrier) mobility and hole (P-type carder) mobility.
Figure 12B:
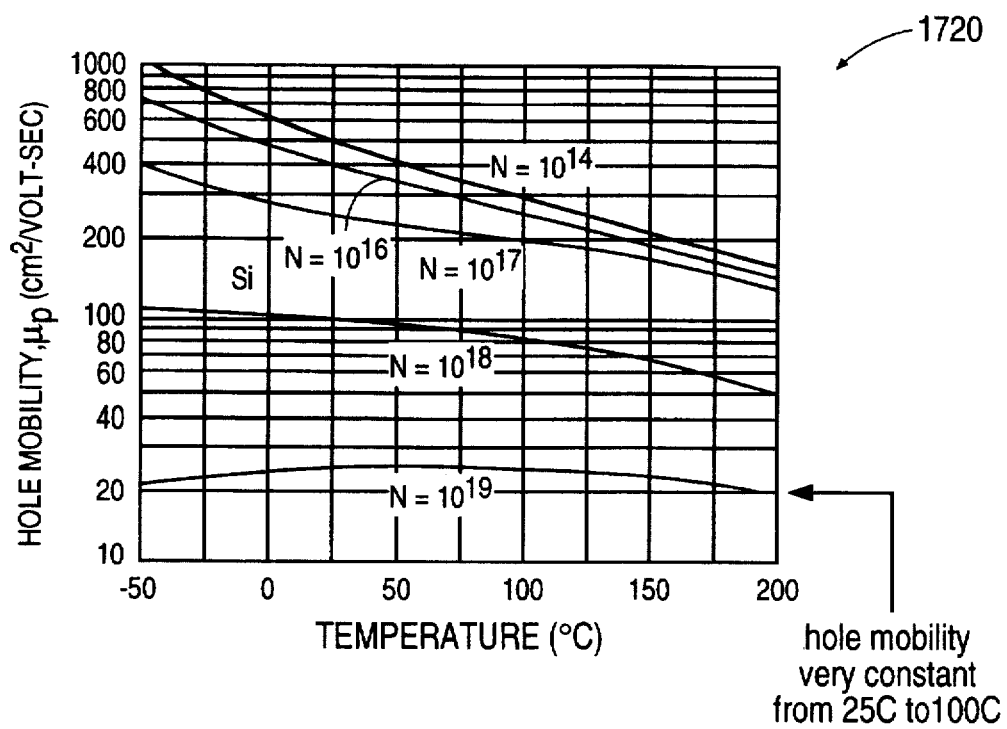

"Physics of Semiconductor Devices", First Edition, Sze, 1969, which is known in the electronics industry and semiconductor industry as a standard workbook describing the mathematical and physical models of semiconductor devices. FIGS. 12(a) and 12(b), which are reprinted from page 41 of Sze, respectively show a first graph 1710 of electron mobility or mobility of N type carriers in N type silicon and a second graph 1720 of hole mobility or mobility of P type carders in P type silicon. In both graphs 1710 and 1720, the vertical axis shows mobility in $cm^2/V\text{-}s$ and the horizontal axis shows temperature. Individual lines are shown for various carder concentrations.

At a carder concentration of approximately $10^{14}$ carriers/$cm^3$, mobility depends highly on temperature. As carrier concentration is increased, carrier mobility decreases. As carrier mobility decreases, temperature dependence decreases and substantially disappears at a concentration of approximately $10^{19}$ carriers/$cm^3$ for both electron and hole mobility. However, electron mobility is more uniform with a varying temperature, showing a substantially flat characteristic from 0° C. to 150° C. Hole mobility, in contrast, shows a very flat characteristic from about 25° C. to about 100° C.

In an integrated circuit, it is advantageous to utilize a diffused resistor having operating characteristics that do not vary with changes in temperature. Therefore, for an RC oscillator circuit that includes an on-chip resistor for the RC network, it is advantageous to use a resistor having a carrier concentration of approximately $10^{19}$ carriers/$cm^3$, whether the resistor is a diffusion, a diffused resistor or an on-chip polysilicon resistor.

What is claimed is:

1. An RC oscillator comprising:
   a core oscillator having an input terminal supplying a signal for adjusting a core oscillator frequency and having an output terminal generating the core oscillator frequency;
   a frequency counter coupled to the core oscillator to receive the core oscillator frequency;
   a ramp and hold circuit coupled to the frequency counter by a control signal line;
   an RC network coupled to the ramp and hold circuit, the RC network including a capacitor and a resistor, the resistor conducting a controlled current;
   a comparator having a first input terminal coupled to the ramp and hold circuit, a second input terminal coupled to a reference voltage source and an output terminal;
   a charge pump having an input terminal coupled to the output terminal of the comparator, a control terminal coupled to the frequency counter by a control signal line and an output terminal coupled to the core oscillator.

2. An RC oscillator according to claim 1, further comprising:
   a MOS transistor having a source-drain pathway coupled between the ramp and hold circuit and the resistor and having a gate terminal;
   a differential amplifier having a first input terminal coupled to the reference voltage source, a second input terminal coupled to a node between the MOS transistor and the resistor and an output terminal coupled to the gate of the MOS transistor.

3. An RC oscillator according to claim 1, wherein the core oscillator is a voltage-controlled oscillator (VCO).

4. An RC oscillator according to claim 1, wherein the core oscillator is a current-controlled oscillator (CCO).

5. An RC oscillator according to claim 1, further comprising a polysilicon resistor array that is trimmed to set the operating frequency so that the RC oscillator is fully monolithic.

6. An RC oscillator according to claim 1 wherein the charge pump is an integrating charge pump.

7. An RC oscillator comprising:
   a bias circuit having an input terminal coupled to an RC network resistor, a first output terminal coupled to a ramp line and a second output terminal coupled to a bias line, the bias circuit including:
   a first P-channel transistor having a source terminal coupled to a voltage source, a drain terminal, and a gate terminal coupled to the drain terminal;
   a second P-channel transistor coupled to the first P-channel transistor in a current mirror configuration having a source terminal coupled to the voltage source, a drain terminal, and a gate terminal coupled to the gate terminal of the first P-channel transistor;

a third P-channel transistor having a source terminal coupled to the voltage source, a drain terminal coupled to the bias line, and a gate terminal coupled to the gate terminals of the first and second P-channel transistors;

a first N-channel transistor having a drain terminal coupled to the drain terminal of the first P-channel transistor, a source terminal coupled to a ground reference, and a gate terminal coupled to an input voltage line;

a second N-channel transistor having a drain terminal coupled to the drain terminal of the second P-channel transistor, a source terminal coupled to the ground reference, and a gate terminal coupled to an RC network capacitor;

a hold capacitor having a first terminal coupled to the ground reference and a second terminal;

a first switch coupled to the second terminal of the hold capacitor and selectively coupling the hold capacitor to the bias line or the ramp line;

a ramp and hold circuit having an input terminal coupled to the ramp line, a control terminal and an output terminal coupled to the RC network capacitor and a hold line;

a switched transistor circuit including:

a third N-channel transistor having a source terminal coupled to the ground reference, a drain terminal coupled to the bias line and a gate terminal;

a second switch coupled to the gate terminal of the third N-channel transistor and selectively coupling the gate terminal of the third N-channel transistor to the hold line or the ramp line; and a third switch coupled to the gate terminal of the third N-channel transistor and selectively coupling the gate terminal of the third N-channel transistor to the drain terminal of the third N-channel transistor or the ramp line;

a charge pump having an input terminal coupled to the drain terminal of the third N-channel transistor, a control terminal and an output terminal coupled to a pump line;

a core oscillator having an input terminal coupled to the pump line and an output terminal; and a frequency counter having an input terminal coupled to the core oscillator output terminal, a first control terminal coupled to the ramp and hold circuit control terminal, and a second control terminal coupled to the charge pump control terminal.

8. An RC oscillator according to claim 7, wherein the bias circuit further includes:

an operational amplifier having a first input terminal coupled to the second terminal of the hold capacitor, a second input terminal coupled to the RC network resistor and an output terminal;

a fourth N-channel transistor having a gate terminal coupled to the output terminal of the operational amplifier and a source-drain pathway coupled to the RC network resistor.

9. An RC oscillator according to claim 8, wherein the bias circuit further includes:

a trim circuit having an input terminal coupled to the source-drain pathway of the fourth N-channel transistor, a control terminal for receiving a plurality of trim control input signals, and an output terminal coupled to the ramp line to the ramp and hold circuit.

10. An RC oscillator comprising:

an RC network for setting an RC time constant;

a core oscillator for generating a timing signal at a controlled frequency;

a comparator coupled to the RC network and the core oscillator for comparing an indicator of the controlled frequency to an indicator of the RC time constant; and means responsive to the comparator for adjusting the frequency of the core oscillator.

11. An RC oscillator according to claim 10, wherein the adjusting means comprises:

a frequency counter having an input terminal coupled to the core oscillator and an output terminal; and a charge pump circuit having an input terminal coupled to the comparator, an output terminal coupled to an input terminal of the core oscillator and a control terminal coupled to the output terminal of the frequency counter.

12. An RC oscillator according to claim 10 further comprising:

a reference signal generator for generating a current charging a capacitor in the RC network and for generating a voltage applied to the comparator.

13. An RC oscillator according to claim 10 further comprising:

a charge pump circuit for generating an error signal which is applied to the core oscillator to self-correct the timing signal so that the average frequency of timing signals generated by the core oscillator is precisely equal to the frequency in accordance with the RC time constant.

14. An RC oscillator comprising:

a first input terminal coupled to an input resistance R;

a second input terminal coupled to an input capacitance C;

a ramp and hold circuit coupled to the first and second input terminals for establishing a time constant proportional to a multiplication product of the input resistance R and the input capacitance C;

an oscillator generating an output timing signal having a period of oscillation established by a control input signal;

a comparator coupled to the ramp and hold circuit and to the oscillator to compare an integer multiple of periods of the output timing signal to the time constant; and a control signal generator coupled to the oscillator and responsive to the comparator means by generating an incremental signal to the control input signal to adjust the period of oscillation.

15. An RC oscillator according to claim 14 wherein the ramp and hold circuit comprises:

a voltage divider coupled between a power supply terminal and a ground reference terminal and having a voltage divider node coupled to a first differential input terminal of the comparator;

an internal capacitor coupled to the second differential input terminal of the comparator; and a switch coupled between the second input terminal and a second differential input terminal of the comparator and having a control terminal coupled to the control signal generator.

16. An RC oscillator according to claim 15 wherein the switch is a transfer gate switch.

17. An RC oscillator according to claim 14 wherein the control signal generator comprises:

a frequency counter having an input terminal coupled to the oscillator to receive the output timing signal, the frequency counter for counting integer multiple of periods of the output timing signal and for generating a timing control signal; and a charge pump circuit having a control terminal coupled to the frequency counter to receive the timing control signal, an input terminal coupled to the comparator to receive a comparison result and an output terminal coupled to the oscillator to drive the output timing signal.

18. An RC oscillator comprising:

a first input terminal coupled to an input resistance R;

a second input terminal coupled to an input capacitance C;

a time constant means coupled to the first and second input terminals for establishing a time constant proportional to a multiplication product of the input resistance R and the input capacitance C;

an oscillator means for generating an output timing signal having a period of oscillation established by a control input signal;

a comparator means coupled to the time constant means and the oscillator means for comparing an integer multiple of periods of the output timing signal to the time constant; and control signal means coupled to the oscillator means and responsive to the comparator means for generating an incremental signal to the control input signal to adjust the period of oscillation.

19. An RC oscillator according to claim 18 wherein the oscillator means further comprises a voltage controlled oscillator (VCO).

20. An RC oscillator according to claim 18 wherein the oscillator means further comprises:

a current controlled oscillator (CCO); and means coupled between the control signal means and the oscillator means for converting a control voltage to a control current.

21. An RC oscillator according to claim 20 wherein the converting means comprises a MOS transistor.

22. An RC oscillator comprising:

a resistance R;

a capacitance C;

time constant means coupled to the resistance R and the capacitance C for establishing a time constant proportional to the multiplication product of the resistance R and the capacitance C;

an oscillator means for generating a timing signal having a period of oscillation established by a control signal;

a comparator means coupled to the time constant means and coupled to the oscillator means for comparing an integer multiple of periods of the timing signal to the time constant; and means coupled to the oscillator means and responsive to the comparator means for generating a control signal to adjust the period of oscillation of the timing signal, the control signal begin generated by incrementing a previous version of the control signal.

23. An RC oscillator according to claim 22 wherein the oscillator means further comprises a voltage controlled oscillator (VCO).

24. An RC oscillator according to claim 22 wherein the oscillator means further comprises:

a current controlled oscillator (CCO); and means coupled between the control signal means and the oscillator means for converting a control voltage to a control current.

25. An RC oscillator according to claim 22 wherein the converting means comprises a MOS transistor.

26. An RC oscillator according to claim 22 wherein the resistance R is provided by a resistor selected from a group including:

an integrated circuit diffusion;

a diffused resistor; and a polysilicon resistor formed integral with the RC oscillator on an integrated circuit chip.

27. An RC oscillator according to claim 26 wherein the resistor is formed using a diffusion of $10^{19}$ carriers/cm$^3$.

28. A method for generating a periodic electrical signal comprising the process steps of:

using a controlled oscillator to convert a d.c. power supply voltage to a time dependent waveform having a variable period of oscillation;

using integer multiple transitions of the controlled oscillator to establish successive states in a control sequence;

sensing an input resistance R;

sensing an input capacitance C;

sensing a reference voltage;

using the input capacitance C, the input resistance R and the reference voltage to generate a time dependent voltage waveform having a slope (dV/dt) inversely proportional to a time constant having a value of the product R times C, the time dependent control sequence being initialized by the control sequence;

sampling a sample voltage of the time dependant voltage waveform during a selected interval of the control sequence;

comparing the sample voltage to the reference voltage;

adjusting the period of oscillation in incremental steps in response to the comparing step.

29. A method of generating a timing signal comprising the steps of:

sensing an input resistance R;

sensing an input capacitance C;

establishing a time constant proportional to the product of the input resistance R and the input capacitance C;

generating the timing signal having a period of oscillation set by a control signal;

comparing an integer multiple of periods of the timing signal to the time constant; and updating the control signal to adjust the period of oscillation in response to the comparison step.

30. An RC oscillator comprising:

an RC network including a network resistor and a network capacitor;

a bias circuit coupled to the network resistor, the bias circuit including a current mirror for mirroring the current through the network resistor;

a ramp and hold circuit coupled to the bias circuit to receive a mirrored current and coupled to the network capacitor, the ramp and hold circuit having a control signal input line;

a comparator having a first input terminal coupled to the bias circuit to receive a signal indicative of the current through the network resistor, a second input terminal coupled to the ramp and hold circuit to receive a signal indicative of the voltage across the network capacitor, and an output terminal;

a charge pump having an input terminal coupled to the bias circuit to receive a signal indicative of the current through the network resistor, a first control terminal, a second control terminal coupled to the comparator output terminal, the charge pump including a pump capacitor;

an oscillator having an input terminal coupled to the pump capacitor and an output terminal;

a frequency counter having an input terminal coupled to the oscillator output terminal and a plurality of output lines; and a state decoder to decode the count of the frequency counter having a plurality of input lines coupled to the output lines of the frequency counter and having a first output control line coupled to the ramp and hold circuit control signal input line and a second output control line coupled to the charge pump first control terminal.

31. An RC oscillator according to claim 30, wherein the comparator further comprises an inverter.

32. An RC oscillator according to claim 30, wherein the oscillator is a voltage-controlled oscillator (VCO).

33. An RC oscillator according to claim 30, wherein the oscillator is a current-controlled oscillator (CCO).

* * * * *

UNITED STATES PATENT AND TRADEMARK OFFICE
CERTIFICATE OF CORRECTION

PATENT NO.    : 5,594,388
DATED         : 1/14/97
INVENTOR(S)   : O'Shaughnessy et al It is certified that error appears in the above-identified patent and that said Letters Patent is hereby corrected as shown below:

```
Col. 2, line 19
    Delete "carder" and insert --carrier--

Col. 10, line 27
    Delete "(PS)" and insert --(P5)--

Col. 11, line 59
    Delete "(PS)" and insert --(P5)--

Col. 16, line 50
    Delete "lout" and insert --fout--

Col. 33, line 59,
    Delete "carders" and insert --carriers--

Col. 33, line 64, "carder" and insert --carrier--.
```

Signed and Sealed this

Twenty-second Day of July, 1997

Attest:

BRUCE LEHMAN

Attesting Officer

Commissioner of Patents and Trademarks